United States Patent
Hara et al.

(10) Patent No.: US 12,448,401 B2
(45) Date of Patent: Oct. 21, 2025

(54) ORGANIC COMPOUND, LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Tomoka Hara, Kanagawa (JP); Hideko Yoshizumi, Kanagawa (JP); Takeyoshi Watabe, Kanagawa (JP); Airi Ueda, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 854 days.

(21) Appl. No.: 17/415,182

(22) PCT Filed: Dec. 16, 2019

(86) PCT No.: PCT/IB2019/060827
§ 371 (c)(1),
(2) Date: Jun. 17, 2021

(87) PCT Pub. No.: WO2020/136496
PCT Pub. Date: Jul. 2, 2020

(65) Prior Publication Data
US 2022/0041635 A1 Feb. 10, 2022

(30) Foreign Application Priority Data
Dec. 28, 2018 (JP) .................... 2018-248104

(51) Int. Cl.
*C07F 15/00* (2006.01)
*H10K 50/11* (2023.01)
(Continued)

(52) U.S. Cl.
CPC ....... *C07F 15/0033* (2013.01); *H10K 85/342* (2023.02); *H10K 50/11* (2023.02);
(Continued)

(58) Field of Classification Search
CPC ... C07F 15/0033; H10K 85/342; H10K 50/11; H10K 2101/10; H10K 2101/30;
(Continued)

(56) References Cited

U.S. PATENT DOCUMENTS 8,920,940 B2  12/2014  Ohsawa et al.
11,072,623 B2  7/2021  Seo et al.
(Continued)

FOREIGN PATENT DOCUMENTS

CN  103694277 A  4/2014
CN  103665048 B  5/2016
(Continued)

OTHER PUBLICATIONS

Hwang, F. M. et al. (2005). Iridium (III) complexes with orthometalated quinoxaline ligands: subtle tuning of emission to the saturated red color. Inorganic chemistry, 44(5), 1344-1353. (Year: 2005).*

(Continued)

*Primary Examiner* — Dawn L Garrett
(74) *Attorney, Agent, or Firm* — Husch Blackwell LLP

(57) ABSTRACT

An organometallic complex having an emission peak in a long wavelength region (a visible region having a wavelength of 700 nm or greater or a near-infrared region) is provided. The organometallic complex has a structure represented by General Formula (G1), in which a ligand having a quinoxaline skeleton is coordinated to a central metal, and an electron-withdrawing group (e.g., fluorine, a cyano group, a trifluoromethyl group, a trifluoromethylsulfonyl group, or a pentafluorosulfanyl group) is included as a
(Continued)

substituent at at least one substitutable position of the benzene ring of the quinoxaline skeleton of the ligand.

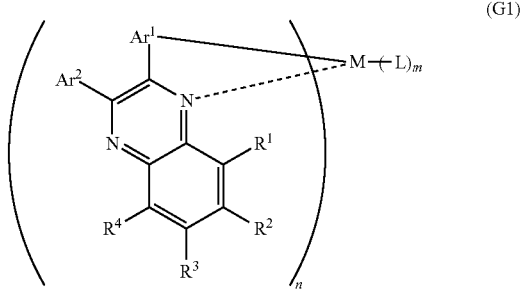

23 Claims, 18 Drawing Sheets

(51) Int. Cl.
    *H10K 85/30*     (2023.01)
    *H10K 101/10*     (2023.01)
    *H10K 101/30*     (2023.01)
    *H10K 101/40*     (2023.01)

(52) U.S. Cl.
    CPC ..... *H10K 2101/10* (2023.02); *H10K 2101/30* (2023.02); *H10K 2101/40* (2023.02)

(58) Field of Classification Search
    CPC .... H10K 2101/40; H10K 59/00; C09K 11/06; F21S 2/00
    See application file for complete search history.

(56) References Cited

U.S. PATENT DOCUMENTS

| | | | |
|---|---|---|---|
| 2005/0242715 A1 | 11/2005 | Inoue et al. | |
| 2007/0241667 A1* | 10/2007 | Ohsawa | C09K 11/06 313/504 |
| 2012/0208999 A1* | 8/2012 | Konno | H10K 85/342 544/225 |
| 2015/0243918 A1* | 8/2015 | Sasaki | H10K 50/19 257/40 |
| 2020/0013967 A1 | 1/2020 | Yamada et al. | |
| 2021/0355149 A1 | 11/2021 | Seo et al. | |

FOREIGN PATENT DOCUMENTS

| | | |
|---|---|---|
| CN | 106397340 A | 2/2017 |
| CN | 106397489 A | 2/2017 |
| CN | 106397490 A | 2/2017 |
| CN | 106397494 A | 2/2017 |
| CN | 106432343 A | 2/2017 |
| CN | 106432350 A | 2/2017 |
| CN | 106588993 A | 4/2017 |
| CN | 108409792 A | 8/2018 |
| CN | 108409793 A | 8/2018 |
| JP | 2006-352106 A | 12/2006 |
| JP | 2009-023938 A | 2/2009 |
| JP | 2017-028283 A | 2/2017 |
| WO | WO-2017/013526 | 1/2017 |
| WO | WO-2018/186356 | 10/2018 |

OTHER PUBLICATIONS

Bevernaegie, R. et al. (2018). Trifluoromethyl-substituted iridium (III) complexes: from photophysics to photooxidation of a biological target. Inorganic chemistry, 57(3), 1356-1367. (Year: 2018).*
Machine translation of CN 108409793A (publication date: Aug. 2018) (Year: 2018).*
Furue, R., Matsuo, K., Ashikari, Y., Ooka, H., Amanokura, N., & Yasuda, T. (2018). Highly efficient red-orange delayed fluorescence emitters based on strong TT-accepting dibenzophenazine and dibenzoquinoxaline cores: toward a rational pure-red OLED design. Advanced Optical Materials, 6(5), 1701147. (Year: 2018).*
Ahn, S. et al., "Color Tuning of Red Phosphorescence: New Iridium Complexes Containing Fluorinated 2,3-diphenylquinoxaline Ligands," Thin Solid Films, May 1, 2009, vol. 517, No. 14, pp. 4111-4114.
Ahn, S. et al., "Synthesis and Photophysical Studies of Iridium Complexes of New 2,3-Diphenylquinoxaline Derivatives for Organic Light-Emitting Diodes," Journal of Nanoscience and Nanotechnology, Dec. 1, 2009, vol. 9, No. 12, pp. 7039-7043.
Jing, Y. et al., "Photoluminescence and Electroluminescence of Deep Red Iridium(III) Complexes with 2,3-diphenylquinoxaline Derivatives and 1,3,4-oxadiazole Derivatives Ligands," RSC Advances, Jul. 26, 2017, vol. 7, No. 59, pp. 37021-37031.
Jing, Y. et al., "Efficient Deep Red Electroluminescence of Iridium(III) Complexes with 2,3-diphenylquinoxaline Derivatives and Tetraphenylimidodiphosphinate," Journal of Materials Chemistry C, Mar. 16, 2017, vol. 5, No. 15, pp. 3714-3724.
International Search Report (Application No. PCT/IB2019/060827) Dated Mar. 31, 2020.
Written Opinion (Application No. PCT/IB2019/060827) Dated Mar. 31, 2020.

* cited by examiner

ORGANIC COMPOUND, LIGHT-EMITTING DEVICE, LIGHT-EMITTING APPARATUS, ELECTRONIC DEVICE, AND LIGHTING DEVICE

This application is a 371 of international application PCT/IB2019/060827 filed on Dec. 16, 2019 which is incorporated herein by reference.

TECHNICAL FIELD

One embodiment of the present invention relates to an organic compound, a light-emitting device, a light-emitting apparatus, an electronic device, and a lighting device. However, embodiments of the present invention are not limited thereto. That is, one embodiment of the present invention relates to an object, a method, a manufacturing method, or a driving method. Alternatively, one embodiment of the present invention relates to a process, a machine, manufacture, or a composition of matter. Specific examples include a semiconductor device, a display device, and a liquid crystal display device.

BACKGROUND ART

A light-emitting device including an EL layer between a pair of electrodes (also referred to as a light-emitting element or an organic EL element) has characteristics such as thinness, light weight, high-speed response to input signals, and low power consumption; thus, a display including such a light-emitting device has attracted attention as a next-generation flat panel display.

In a light-emitting device, voltage application between a pair of electrodes causes, in an EL layer, recombination of electrons and holes injected from the electrodes, which brings a light-emitting substance (an organic compound) contained in the EL layer into an excited state. Light is emitted when the light-emitting substance returns to the ground state from the excited state. The excited state can be a singlet excited state (S*) and a triplet excited state (T*). Light emission from a singlet excited state is referred to as fluorescence, and light emission from a triplet excited state is referred to as phosphorescence. The statistical generation ratio thereof in the light-emitting device is considered to be S*:T*=1:3.

Among the above light-emitting substances, a compound capable of converting singlet excitation energy into light is called a fluorescent compound (a fluorescent material), and a compound capable of converting triplet excitation energy into light is called a phosphorescent compound (a phosphorescent material).

Accordingly, on the basis of the above generation ratio, the theoretical limit of the internal quantum efficiency (the ratio of generated photons to injected carriers) of a light-emitting device using each of the above light-emitting substances is 25% in the case of using a fluorescent material and 75% in the case of using a phosphorescent material.

In other words, a light-emitting device using a phosphorescent material can obtain higher efficiency than a light-emitting device using a fluorescent material. Thus, various kinds of phosphorescent materials have been actively developed in recent years. An organometallic complex that contains iridium or the like as a central metal is particularly attracting attention because of its high phosphorescence quantum yield (e.g., Patent Document 1).

REFERENCE

Patent Document

[Patent Document 1] Japanese Published Patent Application No. 2009-23938

SUMMARY OF THE INVENTION

Problems to be Solved by the Invention

The development of phosphorescent materials exhibiting excellent characteristics has progressed as reported in Patent Document 1 mentioned above. Since the application range of phosphorescent materials will expand in accordance with their light-emitting regions, the development of a novel material that emits light not only in a visible light region but also in a long wavelength region, which is thought to be effective for personal authentication and medical diagnosis, has been desired.

In view of this, one embodiment of the present invention is to provide a novel organic compound (including a novel organometallic complex). One embodiment of the present invention is to provide an organometallic complex having an emission peak in a long wavelength region (a visible region having a wavelength of 700 nm or greater or a near-infrared region). One embodiment of the present invention is to provide a novel organometallic complex in which the LUMO level is less than or equal to 3.5 eV. One embodiment of the present invention is to provide a novel organometallic complex that can be used in a light-emitting device. One embodiment of the present invention is to provide a novel organometallic complex that can be used in an EL layer of a light-emitting device. One embodiment of the present invention is to provide a novel light-emitting device that uses a novel organometallic complex and is highly efficient and reliable. In addition, a novel light-emitting apparatus, a novel electronic device, or a novel lighting device is provided.

In this specification, light in a visible region (also referred to as visible light) represents light having a wavelength of greater than or equal to 400 nm and less than 750 nm, and light in a near-infrared region (also referred to as near-infrared light) represents light having a wavelength of greater than or equal to 750 nm and less than or equal to 1000 nm.

Note that the description of these objects does not preclude the existence of other objects. One embodiment of the present invention does not necessarily achieve all these objects. Other objects will be apparent from and can be derived from the description of the specification, the drawings, the claims, and the like.

Means for Solving the Problems

One embodiment of the present invention is an organometallic complex represented by General Formula (G1) below, in which a ligand having a quinoxaline skeleton is coordinated to a central metal, and an electron-withdrawing group (e.g., fluorine, a cyano group, a trifluoromethyl group, a trifluoromethylsulfonyl group, or a pentafluorosulfanyl group) is included as a substituent at at least one substitutable position of the benzene ring of the quinoxaline skeleton of the ligand. Note that the LUMO level can be lowered with a change in the electron state due to the ligand including the electron-withdrawing group as a substituent.

[Chemical Formula 1]

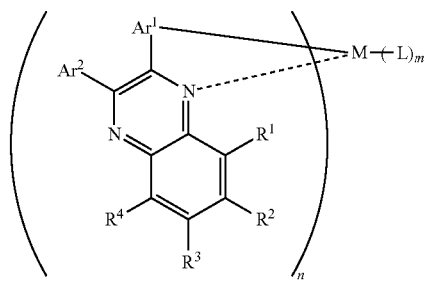

(G1)

In General Formula (G1), M represents a Group 9 element or a Group 10 element; and each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

Another embodiment of the present invention is an organometallic complex represented by General Formula (G2) below.

[Chemical Formula 2]

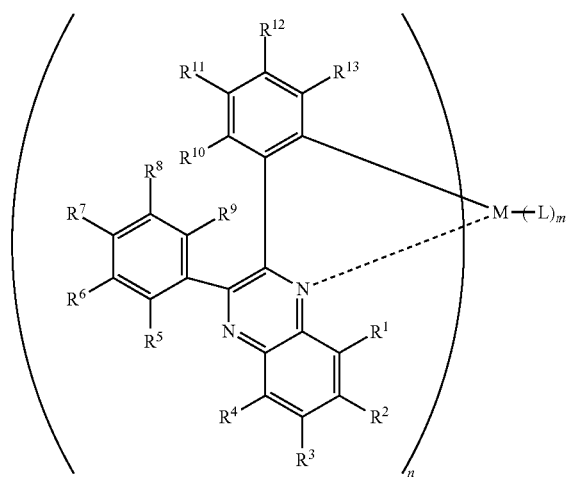

(G2)

In General Formula (G2), M represents a Group 9 element or a Group 10 element. Each of $R^1$ to $R^{13}$ independently represents any of hydrogen, an alkyl group having 1 to 6 carbon atoms, a substituted orunsubstituted aryl group having 6 to 12 carbon atoms, a substituted orunsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

Another embodiment of the present invention is an organometallic complex represented by General Formula (G3) below.

[Chemical Formula 3]

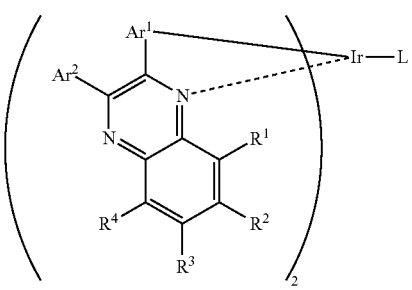

(G3)

In General Formula (G3), each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand.

Another embodiment of the present invention is an organometallic complex represented by General Formula (G4) below.

[Chemical Formula 4]

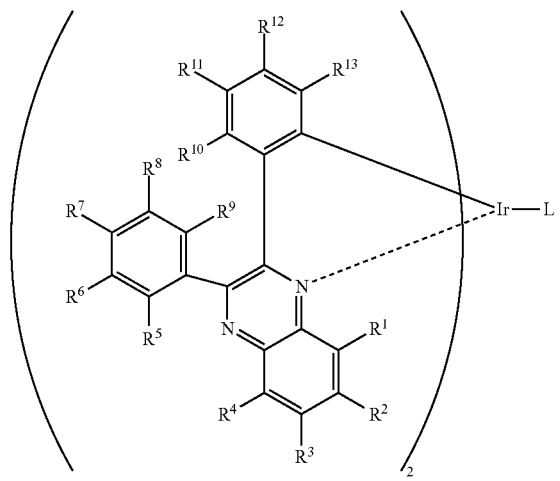

(G4)

In General Formula (G4), each of $R^1$ to $R^{13}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand.

Another embodiment of the present invention is an organometallic complex represented by General Formula (G5) below.

[Chemical Formula 5]

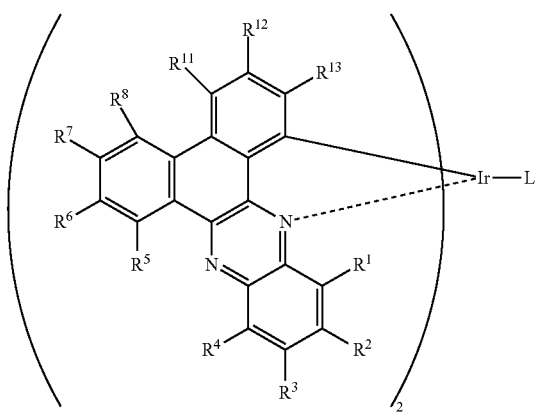

(G5)

In General Formula (G5), each of $R^1$ to $R^{18}$ and $R^{11}$ to $R^{13}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. Any one or a plurality of sets of $R^5$ and $R^6$, $R^6$ and $R^7$, $R^7$ and $R^8$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand.

In each of the above structures, the monoanionic ligand is preferably any one of a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, and a bidentate ligand forming a metal-carbon bond with iridium by cyclometalation.

In each of the above structures, the monoanionic ligand is preferably any one of General Formulae (L1) to (L7) below.

[Chemical Formula 6]

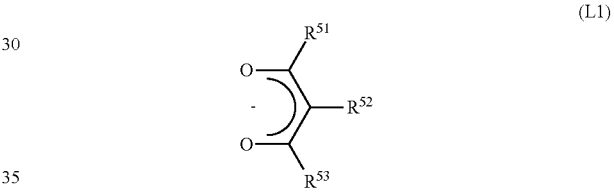

(L1)

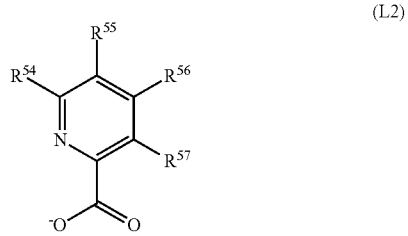

(L2)

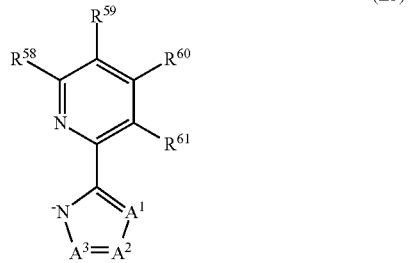

(L3)

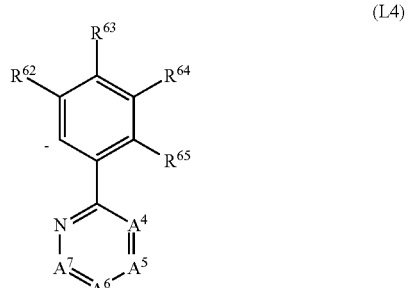

(L4)

-continued (L5)

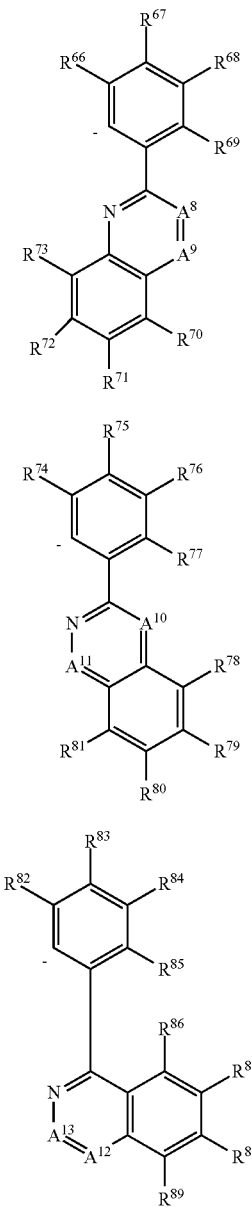

(L6)

(L7)

Note that in General Formulae (L1) to (L7) above, each of $R^{51}$ to $R^{89}$ independently represents any of hydrogen, a substituted or unsubstituted alkyl group having 1 to 6 carbon atoms, a halogeno group, a vinyl group, a substituted or unsubstituted haloalkyl group having 1 to 6 carbon atoms, a substituted or unsubstituted alkoxy group having 1 to 6 carbon atoms, a substituted or unsubstituted alkylsulfanyl group having 1 to 6 carbon atoms, and a substituted or unsubstituted aryl group having 6 to 13 carbon atoms. Each of $A^1$ to $A^{13}$ independently represents any of nitrogen, $sp^2$ hybridized carbon bonded to hydrogen, and $sp^2$ hybridized carbon having a substituent, and the substituent is any of an alkyl group having 1 to 6 carbon atoms, a halogeno group, a haloalkyl group having 1 to 6 carbon atoms, and a phenyl group.

Another embodiment of the present invention is an organometallic complex represented by General Formula (G6).

[Chemical Formula 7]

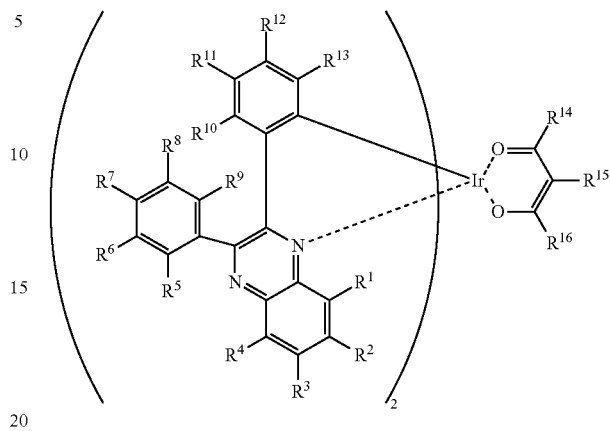

(G6)

In General Formula (G6), each of $R^1$ to $R^{16}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms.

Another embodiment of the present invention is an organometallic complex represented by General Formula (G7) below.

[Chemical Formula 8]

(G7)

In General Formula (G7), each of $R^1$ to $R^8$ and $R^{11}$ to $R^{16}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. Any one or a plurality of sets of $R^5$ and $R^6$, $R^6$ and $R^7$, $R^7$ and $R^8$, $R^{11}$ and $R^{12}$, and $R^{12}$ and $R^{13}$ may be bonded to each other to form a substituted or unsubstituted saturated ring or unsaturated ring having 3 to 24 carbon atoms.

Another embodiment of the present invention is an organometallic complex represented by Structural Formula (100), Structural Formula (101), or Structural Formula (116).

[Chemical Formula 9]

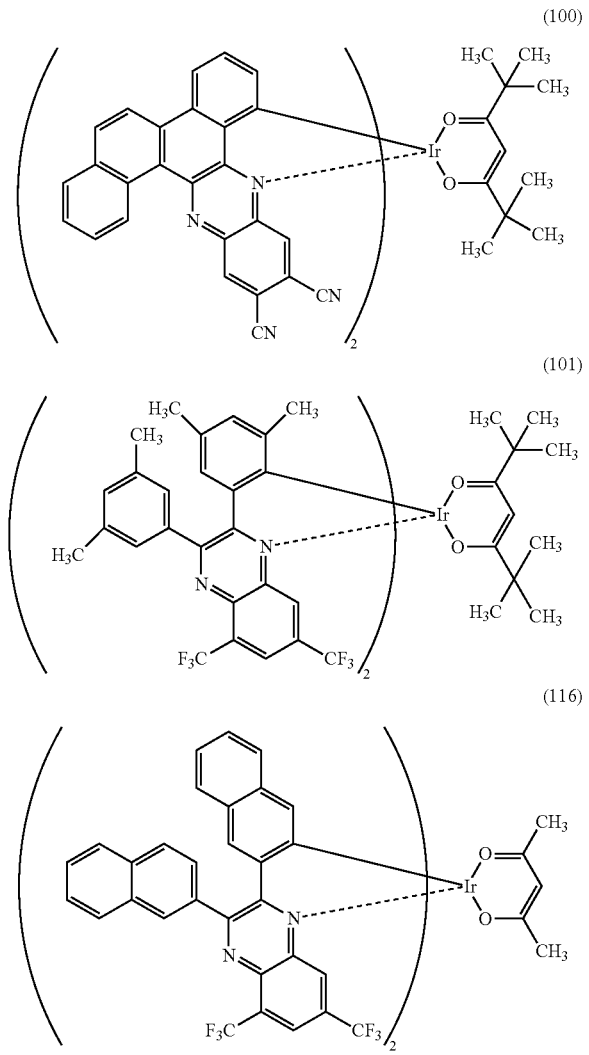

Another embodiment of the present invention is a light-emitting device using an organometallic complex in which a ligand having a quinoxaline skeleton is coordinated to a central metal, and an electron-withdrawing group (e.g., fluorine, a cyano group, a trifluoromethyl group, a trifluoromethylsulfonyl group, or a pentafluorosulfanyl group) is included as a substituent at at least one substitutable position of the benzene ring of the quinoxaline skeleton of the ligand. Note that a light-emitting device including another organic compound in addition to the above organometallic complex is also included in one embodiment of the present invention.

Another embodiment of the present invention is a light-emitting device using the above-described organometallic complex of one embodiment of the present invention. Note that one embodiment of the present invention also includes a light-emitting device that is formed using the organometallic complex of one embodiment of the present invention for an EL layer between a pair of electrodes or a light-emitting layer included in the EL layer. In addition to the light-emitting devices, a light-emitting apparatus including a transistor, a substrate, and the like is also included in the scope of the invention. Furthermore, in addition to the light-emitting apparatus, an electronic device and a lighting device that include a microphone, a camera, an operation button, an external connection portion, a housing, a cover, a support, a speaker, or the like are also included in the scope of the invention.

A combination of the organometallic complex of one embodiment of the present invention and another organic compound can be used in a light-emitting layer of a light-emitting device. That is, light emission from a triplet excited state can be obtained from the light-emitting layer; hence, the efficiency of the light-emitting device can be improved, which is very effective. Thus, one embodiment of the present invention includes a light-emitting device in which the organometallic complex of one embodiment of the present invention and another organic compound are used in combination in a light-emitting layer. Furthermore, a structure in which the light-emitting layer contains a third substance in addition to the above may be employed.

In addition, the scope of one embodiment of the present invention includes a light-emitting apparatus including a light-emitting device, and a lighting device including the light-emitting apparatus. Accordingly, the light-emitting apparatus in this specification refers to an image display device or a light source (including a lighting device). Moreover, a light-emitting apparatus includes a module in which a light-emitting apparatus is connected to a connector such as an FPC (Flexible Printed Circuit) or a TCP (Tape Carrier Package), a module in which a printed wiring board is provided on the tip of a TCP, and a module in which an IC (integrated circuit) is directly mounted on a light-emitting device by a COG (Chip On Glass) method.

Effect of the Invention

One embodiment of the present invention can provide a novel organometallic complex. One embodiment of the present invention can provide an organometallic complex having an emission peak in a long wavelength (700 nm or greater) range. One embodiment of the present invention can provide a novel organometallic complex whose LUMO level is less than or equal to 3.5 eV. One embodiment of the present invention can provide a novel organometallic complex that can be used in a light-emitting device. One embodiment of the present invention can provide a novel organometallic complex that can be used in an EL layer of a light-emitting device. A novel light-emitting device that uses a novel organometallic complex of one embodiment of the present invention and has high efficiency and reliability can be provided. In addition, a novel light-emitting apparatus, a novel electronic device, or a novel lighting device can be provided.

Note that the description of these effects does not preclude the existence of other effects. Note that one embodiment of the present invention does not need to have all these effects. Note that effects other than these will be apparent from and can be derived from the description of the specification, the drawings, the claims, and the like. In addition, a novel light-emitting device with improved efficiency and reliability can be provided.

MODE FOR CARRYING OUT THE INVENTION

Figure 1A:
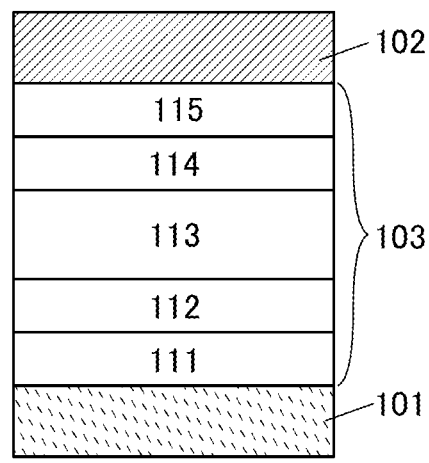
FIG. 1A and FIG. 1B are diagrams illustrating structures of light-emitting devices.

A composition for a light-emitting device that is one embodiment of the present invention will be described in detail below. Note that the present invention is not limited to the following description, and the modes and details of the present invention can be modified in various ways without departing from the spirit and scope of the present invention. Thus, the present invention should not be construed as being limited to the description in the following embodiments.

Note that the position, size, range, or the like of each component shown in drawings and the like is not accurately represented in some cases for easy understanding. Therefore, the disclosed invention is not necessarily limited to the position, size, range, or the like disclosed in drawings and the like.

In describing structures of the invention in this specification and the like with reference to drawings, common numerals are used for the same components in different drawings in some cases.

Embodiment 1

In this embodiment, an organometallic complex of one embodiment of the present invention will be described.

The organometallic complex of one embodiment of the present invention has a structure represented by General Formula (G1) below, in which a ligand having a quinoxaline skeleton is coordinated to a central metal, and an electron-withdrawing group (e.g., fluorine, a cyano group, a trifluoromethyl group, a trifluoromethylsulfonyl group, or a pentafluorosulfanyl group) is included as a substituent at at least one substitutable position of the benzene ring of the quinoxaline skeleton of the ligand.

[Chemical Formula 10]

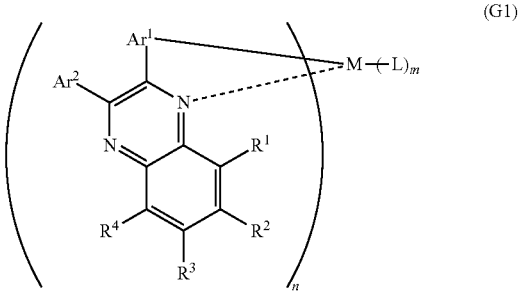

(G1)

In General Formula (G1), M represents a Group 9 element or a Group 10 element; and each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

An organometallic complex of another embodiment of the present invention is an organometallic complex represented by General Formula (G2) below.

[Chemical Formula 11]

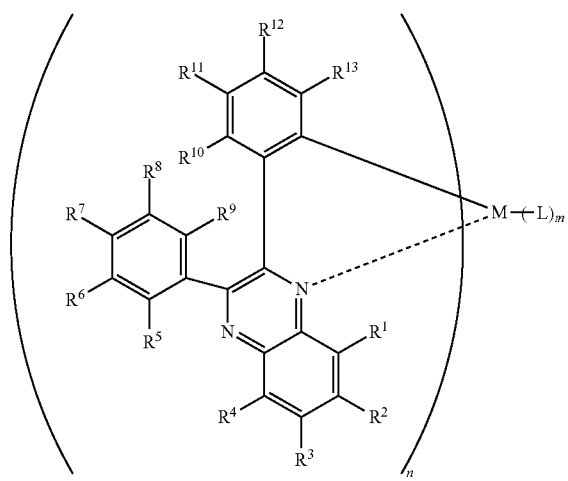

(G2)

In General Formula (G2), M represents a Group 9 element or a Group 10 element. Each of $R^1$ to $R^{13}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

An organometallic complex of another embodiment of the present invention is an organometallic complex represented by General Formula (G3) below.

[Chemical Formula 12]

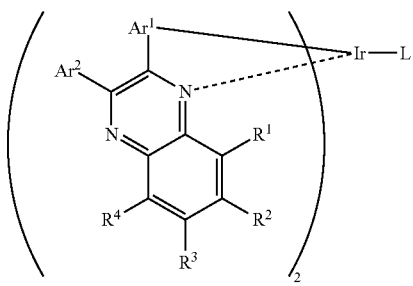

(G3)

In General Formula (G3), each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand.

An organometallic complex of another embodiment of the present invention is an organometallic complex represented by General Formula (G4) below.

[Chemical Formula 13]

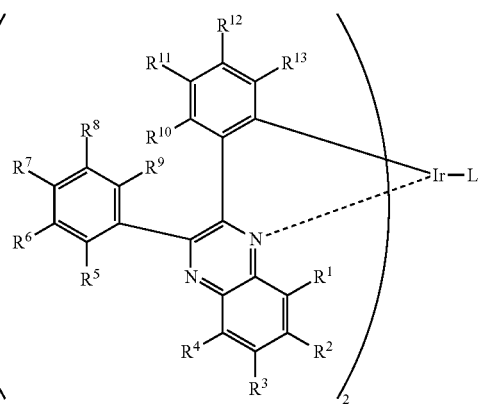

(G4)

In General Formula (G4), each of $R^1$ to $R^{13}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand.

An organometallic complex of another embodiment of the present invention is an organometallic complex represented by General Formula (G5) below.

[Chemical Formula 14]

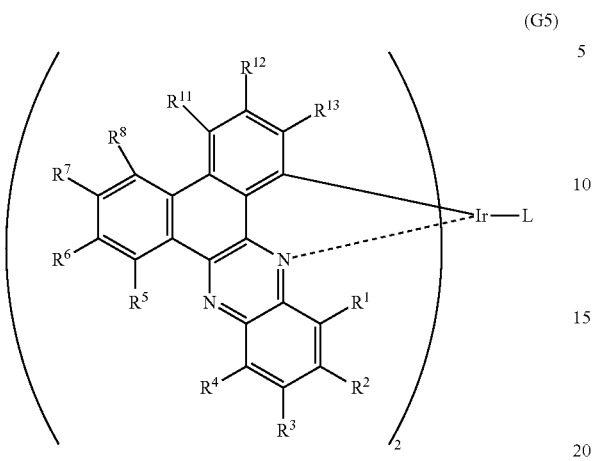

(G5)

In General Formula (G5), each of $R^1$ to $R^8$ and $R^{11}$ to $R^{13}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. Any one or a plurality of sets of $R^5$ and $R^6$, $R^6$ and $R^7$, $R^7$ and $R^8$, $R^{11}$ and $R^{12}$, and $R^{12}$ and $R^{13}$ may be bonded to each other to form a substituted or unsubstituted saturated ring or unsaturated ring having 3 to 24 carbon atoms. L represents a monoanionic ligand.

Note that the monoanionic ligand in General Formulae (G1) to (G5) shown above is any one of a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, and a bidentate ligand that forms a metal-carbon bond with iridium by cyclometalation.

Note that the monoanionic ligand in General Formulae (G1) to (G5) shown above is specifically any one of General Formulae (L1) to (L7) below.

[Chemical Formula 15]

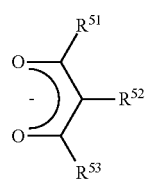

(L1)

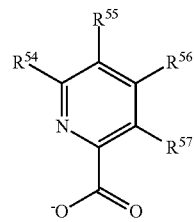

(L2)

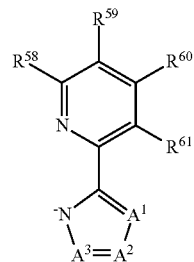

(L3)

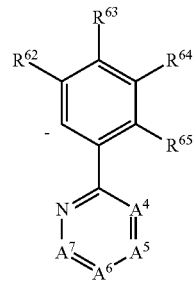

(L4)

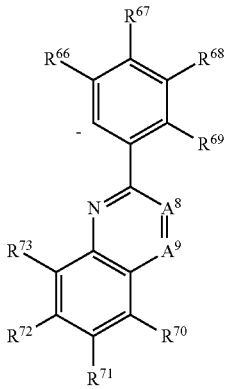

(L5)

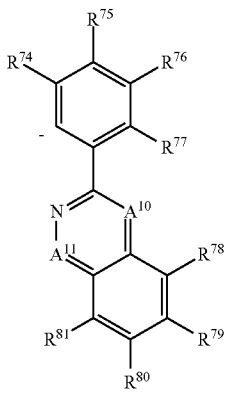

(L6)

17

-continued

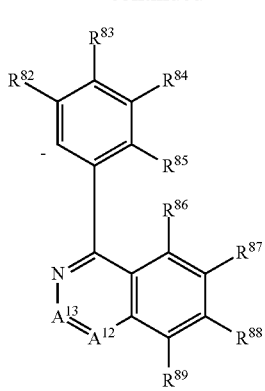

(L7)

In General Formulae (L1) to (L7) above, each of $R^{51}$ to $R^{89}$ independently represents any of hydrogen, a substituted or unsubstituted alkyl group having 1 to 6 carbon atoms, a halogeno group, a vinyl group, a substituted or unsubstituted haloalkyl group having 1 to 6 carbon atoms, a substituted or unsubstituted alkoxy group having 1 to 6 carbon atoms, a substituted or unsubstituted alkylsulfanyl group having 1 to 6 carbon atoms, and a substituted or unsubstituted aryl group having 6 to 13 carbon atoms. Each of $A^1$ to $A^{13}$ independently represents any of nitrogen, $sp^2$ hybridized carbon bonded to hydrogen, and $sp^2$ hybridized carbon having a substituent, and the substituent is any of an alkyl group having 1 to 6 carbon atoms, a halogeno group, a haloalkyl group having 1 to 6 carbon atoms, and a phenyl group.

An organometallic complex of another embodiment of the present invention is an organometallic complex represented by General Formula (G6) below.

[Chemical Formula 16]

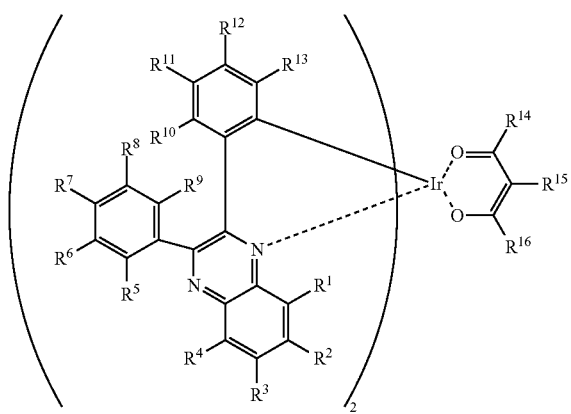

(G6)

In General Formula (G6), each of $R^1$ to $R^{16}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. $R^9$ and $R^{10}$ may be bonded to each other to form a ring. Any one or a plurality of sets of $R^5$ and $R^6$, $R^6$ and $R^7$, $R^7$ and $R^8$, $R^8$ and $R^9$, $R^{10}$ and $R^{11}$, $R^{11}$ and $R^{12}$, and $R^{12}$ and $R^{13}$ may be bonded to each other to form a substituted or unsubstituted saturated ring or unsaturated ring having 3 to 24 carbon atoms.

An organometallic complex of another embodiment of the present invention is an organometallic complex represented by General Formula (G7) below.

[Chemical Formula 17]

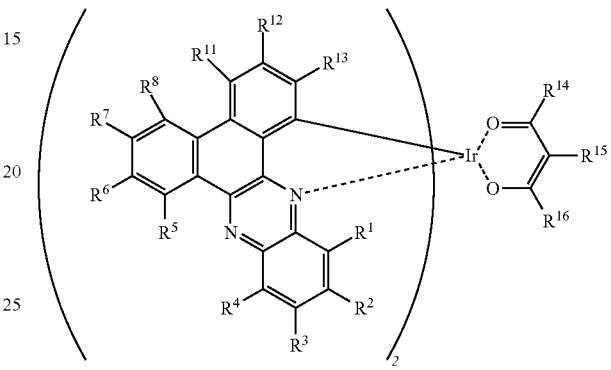

(G7)

In General Formula (G7), each of $R^1$ to $R^8$ and $R^{11}$ to $R^{16}$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a substituted or unsubstituted alkoxy group having 1 to 6 carbon atoms, and a substituted or unsubstituted alkylsulfanyl group having 1 to 6 carbon atoms; and at least one of $R^1$ to $R^4$ represents any of fluorine, a cyano group, a trifluoromethyl group, a trifluoromethylsulfonyl group, and a pentafluorosulfanyl group. Any one or a plurality of sets of $R^5$ and $R^6$, $R^6$ and $R^7$, $R^7$ and $R^8$, $R^{11}$ and $R^{12}$, and $R^{12}$ and $R^{13}$ may be bonded to each other to form a substituted or unsubstituted saturated ring or unsaturated ring having 3 to 24 carbon atoms.

Note that substitution in the organometallic complexes represented by General Formula (G1) to General Formula (G7) shown above is preferably substitution by a substituent such as an alkyl group having 1 to 6 carbon atoms, like a methyl group, an ethyl group, an n-propyl group, an isopropyl group, a sec-butyl group, a tert-butyl group, an n-pentyl group, or an n-hexyl group, or an aryl group having 6 to 12 carbon atoms, like a phenyl group, an o-tolyl group, an m-tolyl group, ap-tolyl group, a 1-naphthyl group, a 2-naphthyl group, a 2-biphenyl group, a 3-biphenyl group, or a 4-biphenyl group. These substituents may be bonded to each other to form a ring. For example, in the case where the aryl group is a 2-fluorenyl group having two phenyl groups as substituents at the 9-position, the phenyl groups may be bonded to each other to form a spiro-9,9'-bifluoren-2-yl group. More specific examples include a phenyl group, a tolyl group, a xylyl group, a biphenyl group, an indenyl group, a naphthyl group, and a fluorenyl group.

In the organometallic complexes represented by General Formula (G1) to General Formula (G7) shown above, specific examples of the alkyl group having 1 to 6 carbon atoms as $R^1$ to $R^{16}$ in the formulae include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a 3-methylpentyl group, a 2-methylpentyl group, a 2-ethylbutyl group, a 1,2-dimethylbutyl group, and a 2,3-dimethylbutyl group.

In the organometallic complexes represented by General Formula (G1) to General Formula (G7) shown above, specific examples of the substituted or unsubstituted aryl group having 6 to 12 carbon atoms (i.e., having 6 to 12 carbon atoms that form a ring) as $R^1$ to $R^{16}$ in the formulae include a phenyl group, a biphenyl group, a naphthyl group, and an indenyl group.

In the organometallic complexes represented by General Formula (G1) to General Formula (G7) shown above, specific examples of the substituted or unsubstituted heteroaryl group having 3 to 12 carbon atoms (i.e., having 3 to 12 carbon atoms that form a ring) as $R^1$ to $R^{16}$ in the formulae include a triadinyl group, a pyrazinyl group, a pyrimidinyl group, a pyridyl group, a quinolyl group, an isoquinolyl group, a benzothienyl group, a benzofuranyl group, an indolyl group, a dibenzothienyl group, a dibenzofuranyl group, and a carbazolyl group.

In the organometallic complexes represented by General Formula (G1) to General Formula (G7) shown above, specific examples of the substituted or unsubstituted alkoxy group having 1 to 6 as $R^1$ to $R^{16}$ in the formulae include a methoxy group, an ethoxy group, a propoxy group, an isopropoxy group, an n-butoxy group, an isobutoxy group, and a tert-butoxy group.

In the organometallic complexes represented by General Formula (G1) to General Formula (G7) shown above, specific examples of the substituted or unsubstituted alkylsulfanyl group having 1 to 6 as $R^1$ to $R^{16}$ in the formulae include a methylsulfanyl group, an ethylsulfanyl group, a n-propylsulfanyl group, an isopropylsulfanyl group, a n-butylsulfanyl group, an isobutylsulfanyl group, and a tert-butylsulfanyl group.

Next, specific structural formulae of the above organometallic complexes of the embodiments of the present invention are shown below.

[Chemical Formula 18]

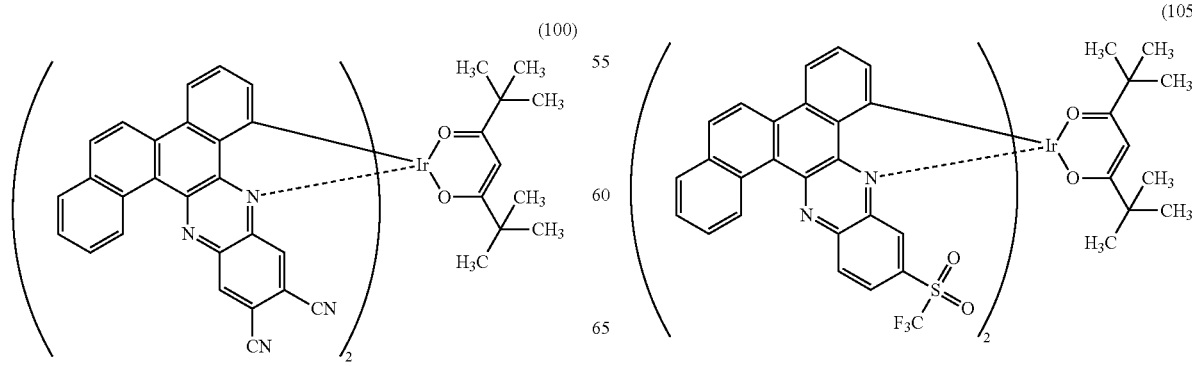

-continued
(106)
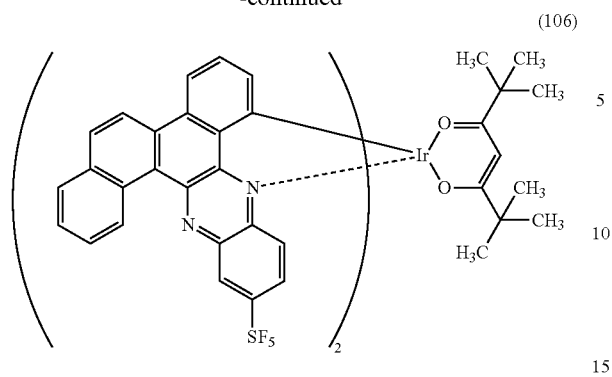
(110)
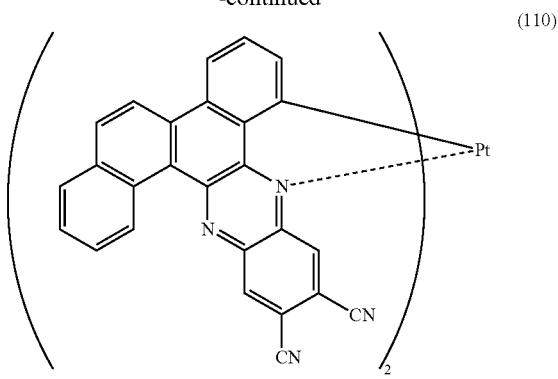
(107)
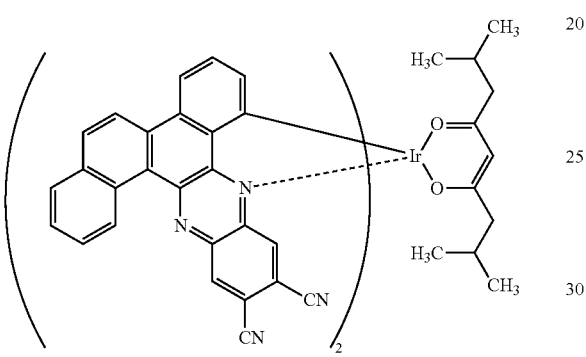
[Chemical Formula 19]
(111)
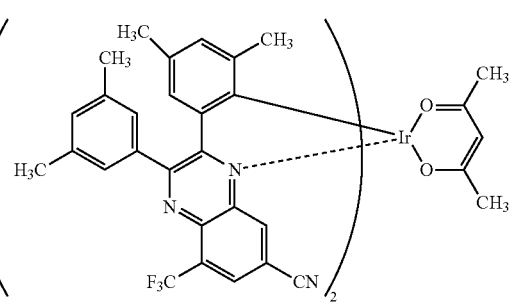
(108)
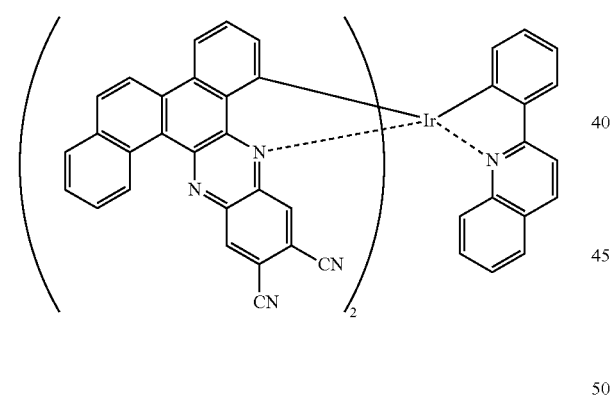
(112)
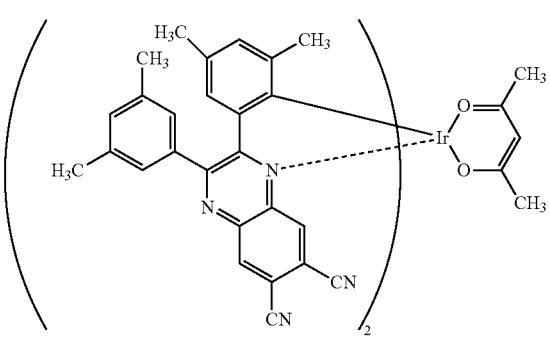
(109)
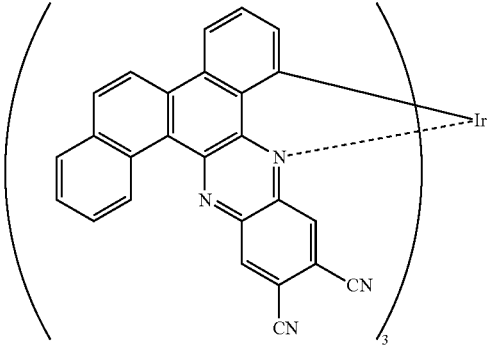
(113)
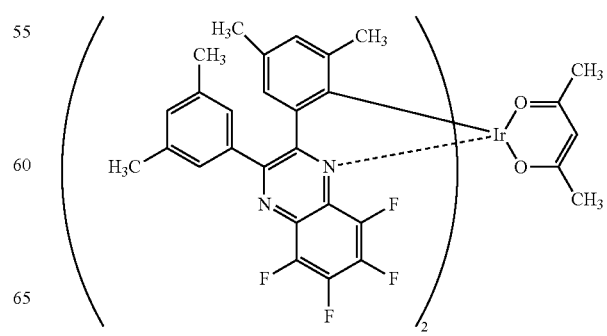

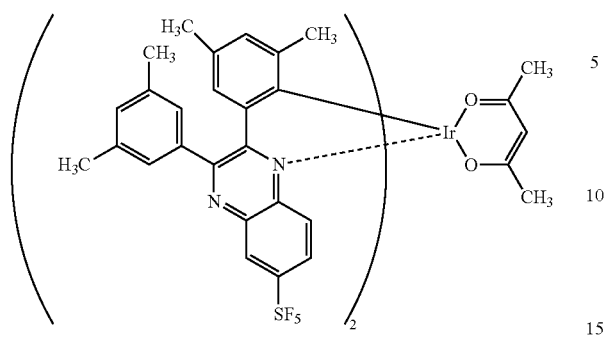
(114)

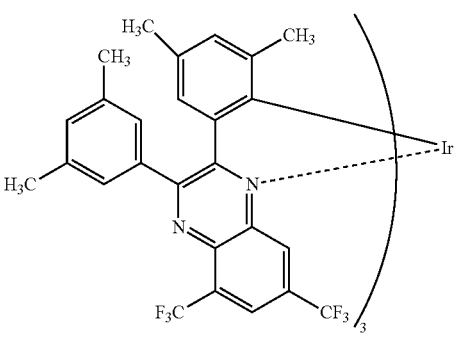
(118)

Note that the organometallic complexes represented by Structural Formulae (100) to (118) shown above are examples of the organometallic complex of one embodiment of the present invention represented by any of General Formula (G1) to General Formula (G7) above. Note that the organometallic complex of one embodiment of the present invention is not limited thereto.

Next, the description is made on an example of a method for synthesizing the organometallic complex of one embodiment of the present invention represented by General Formula (G1) shown below.

[Chemical Formula 20]

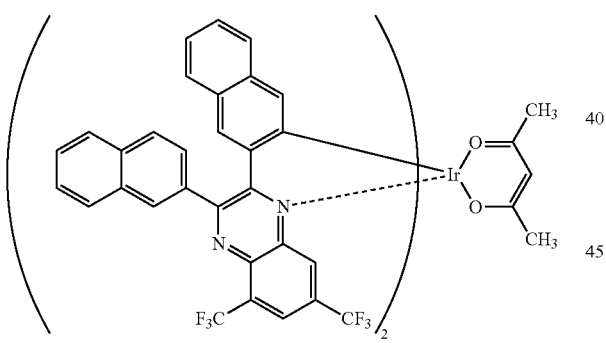
(115)

[Chemical Formula 21]

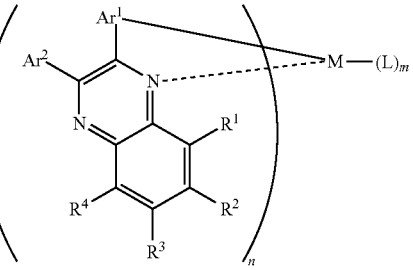
(G1)

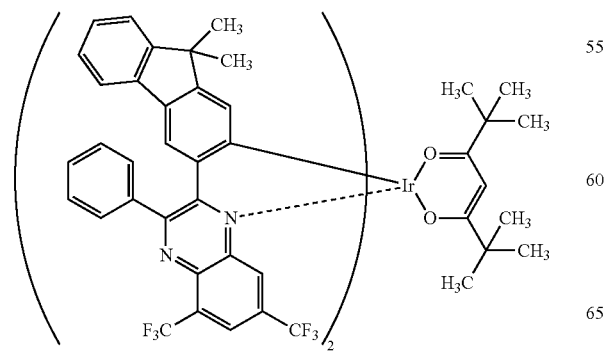
(116)

In General Formula (G1), M represents a Group 9 element or a Group 10 element; and each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

<<Method for Synthesizing Quinoxaline Derivative Represented by General Formula (G0)>>

A quinoxaline derivative represented by General Formula (G0) shown below can be synthesized by the following synthesis method.

[Chemical Formula 22]

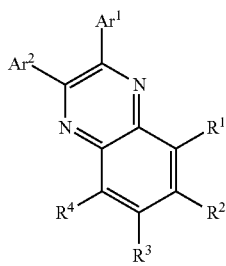

(G0)

In General Formula (G0), each of Ar$^1$ and Ar$^2$ independently represents any one of a substituted or unsubstituted phenyl group, naphthyl group, phenanthryl group, and fluorenyl group. Each of R$^1$ to R$^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of R$^1$ to R$^4$ represents any of fluorine, a cyano group, a trifluoromethyl group, a trifluoromethylsulfonyl group, and a pentafluorosulfanyl group. Any of the substituents included in Ar$^1$ and Ar$^2$ may be bonded to each other to form a ring. Ar$^1$ and Ar$^2$ may be directly bonded to each other.

The quinoxaline derivative represented by General Formula (G0) can be obtained by a reaction between a diketone compound (a1) and a diamine compound (a2), as shown in Synthesis Scheme (A) below.

[Chemical Formula 23]

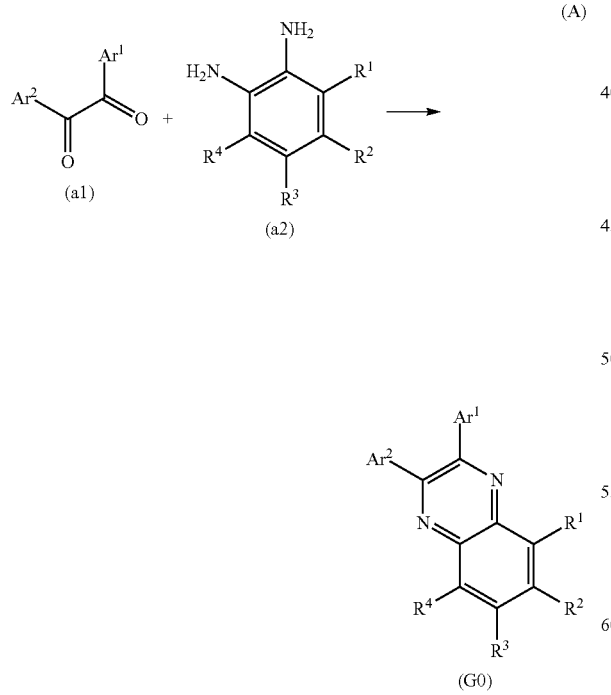

Alternatively, a diketone compound (b1) and a diamine compound (b2) may be reacted, as shown in Synthesis Scheme (B) below.

[Chemical Formula 24]

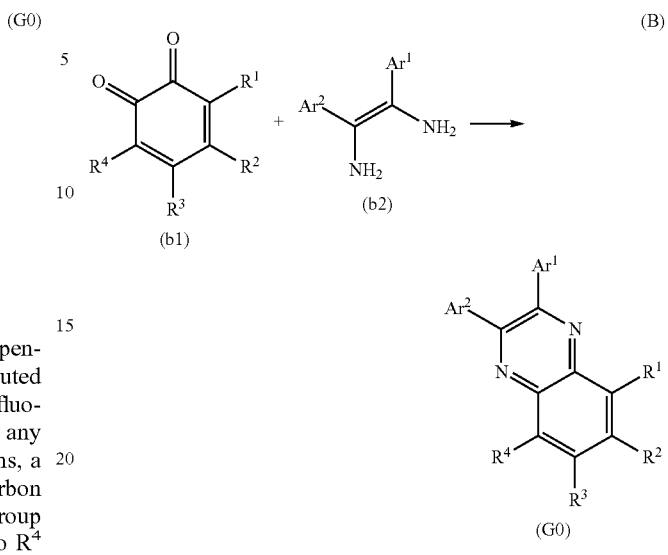

Alternatively, the quinoxaline derivative represented by General Formula (G0) can be obtained by reacting a diamine compound (c1) and an oxalyl halide (c2) to obtain a dihalogenated quinoxaline derivative (c3), and then reacting the dihalogenated quinoxaline derivative (c3) and an arylboronic acid compound (c4) or (c5), as shown in Synthesis Scheme (C) below.

[Chemical Formula 25]

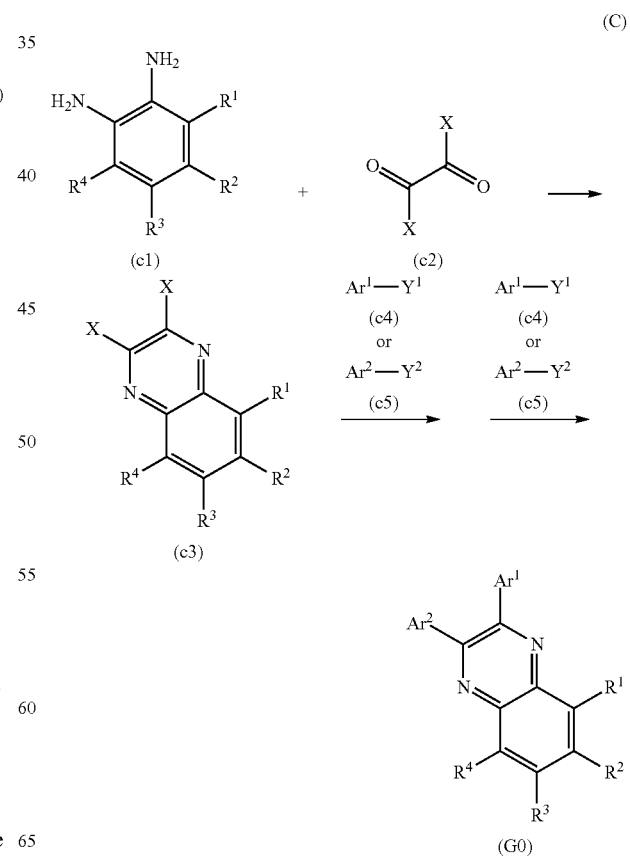

In Synthesis Schemes (A), (B), and (C) above, each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. In the formula, X represents halogen and is preferably chlorine or bromine. $Y^1$ and $Y^2$ each represent a boronic acid, a boronic ester, a cyclic-triolborate salt, or the like. As the cyclic-triolborate salt, a potassium salt or a sodium salt as well as a lithium salt may be used.

<<Method for Synthesizing Organometallic Complex Represented by General Formula (G1)>>

Next, a method for synthesizing the organometallic complex represented by General Formula (G1) is described. First, as shown in Synthesis Scheme (D) below, the quinoxaline derivative represented by General Formula (G0) or the monoanionic ligand L and a Group 9 or Group 10 metal compound containing halogen are heated in an inert gas atmosphere using no solvent, an alcohol-based solvent (e.g., glycerol, ethylene glycol, 2-methoxyethanol, or 2-ethoxyethanol) alone, or a mixed solvent of water and one or more of the alcohol-based solvents, thereby obtaining a dinuclear complex (d1) or a dinuclear complex (d2) including a monoanionic ligand, each of which is a type of organometallic complex having a halogen-bridged structure. There is no particular limitation on a heating means, and an oil bath, a sand bath, an aluminum block, or the like can be used. Alternatively, microwaves can be used as the heating means.

[Chemical Formula 26]

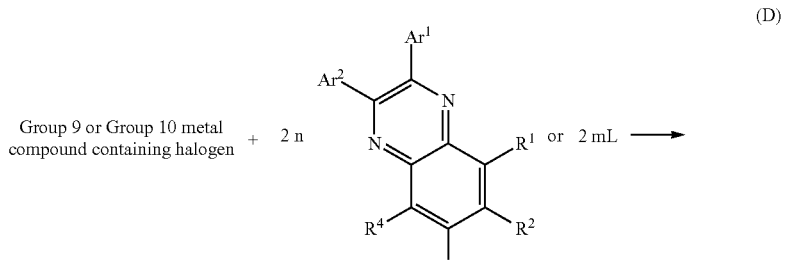

(D)

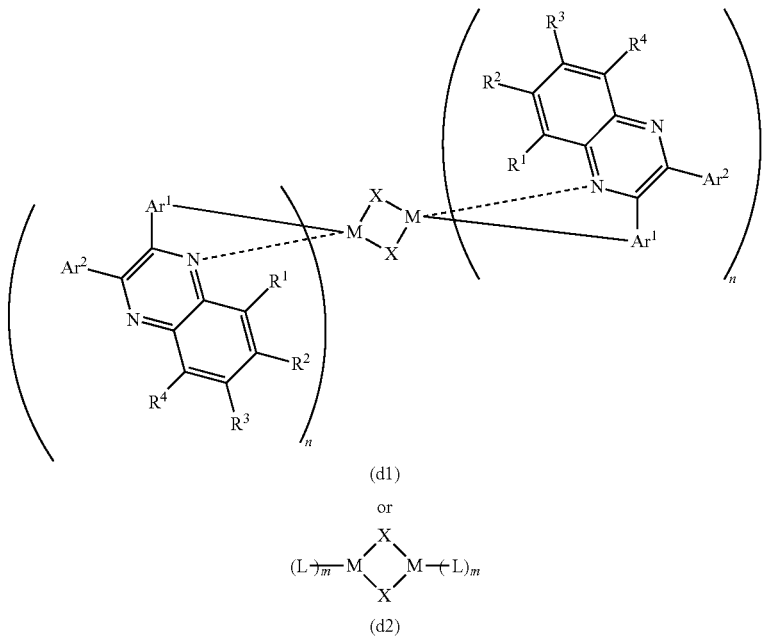

(d1)

or (d2)

Then, as shown in Synthesis Scheme (E), the dinuclear complex (d1) or (d2) obtained from Synthesis Scheme (D) above and the quinoxaline derivative represented by General Formula (G0) or the monoanionic ligand L are reacted in an inert gas atmosphere, thereby obtaining the organometallic complex of one embodiment of the present invention represented by General Formula (G1).

[Chemical Formula 27]

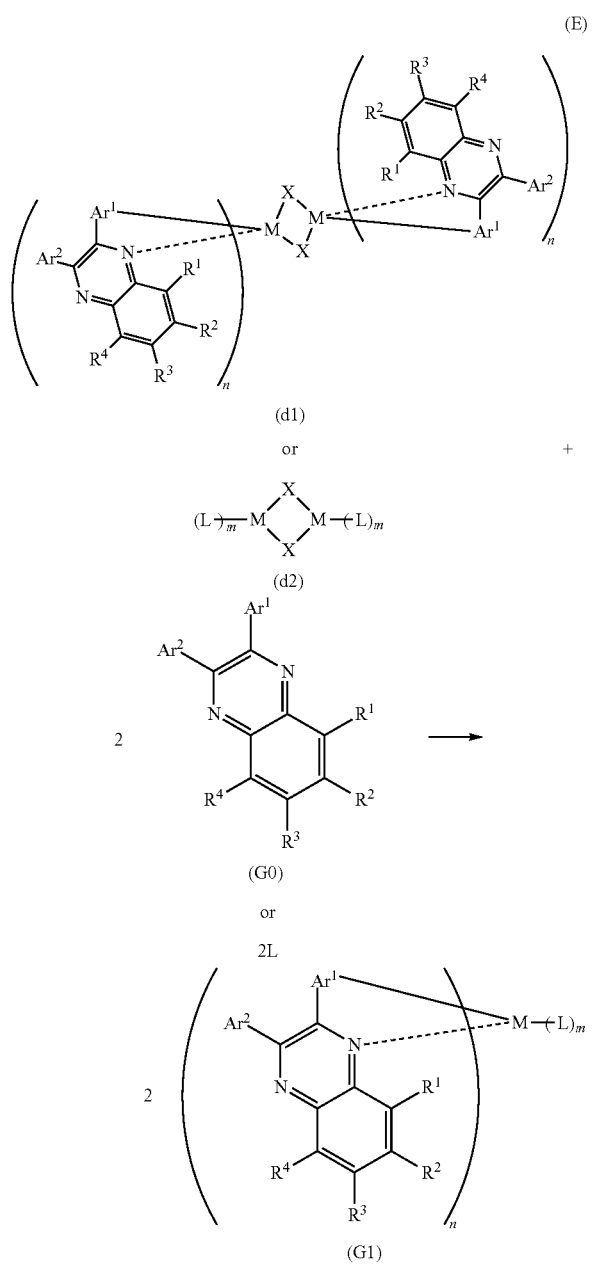

[Chemical Formula 28]

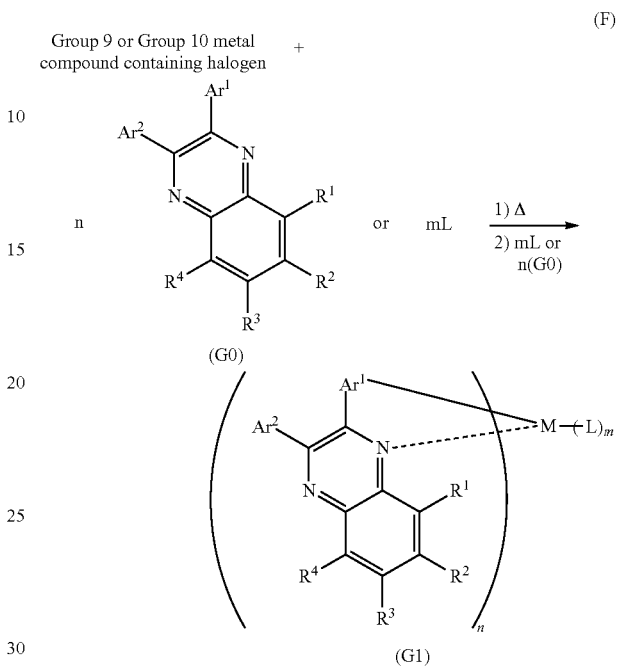

As another method, as shown in Scheme (G) below, an organometallic compound (g1) including the monoanionic ligand L and the quinoxaline derivative represented by General Formula (G0) may be heated in an inert gas atmosphere.

[Chemical Formula 29]

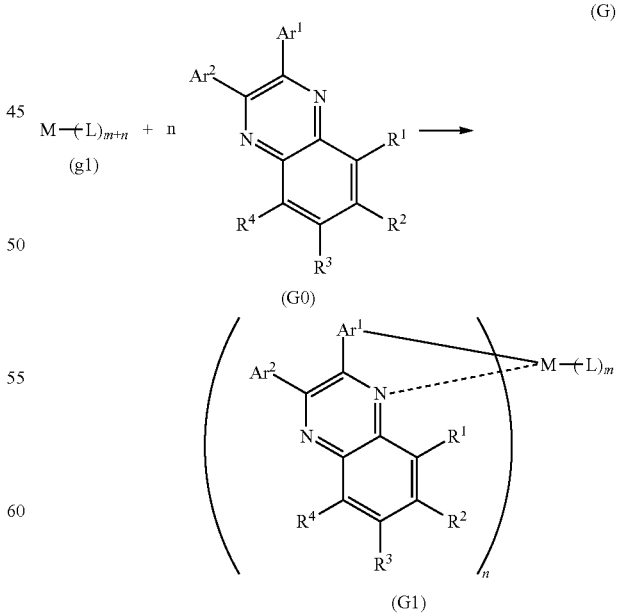

As another method, as shown in Synthesis Scheme (F) below, the organometallic compound represented by General Formula (G1) can be obtained by heating a Group 9 or Group 10 metal compound containing halogen and the quinoxaline derivative represented by General Formula (G0) above or the monoanionic ligand L in an inert gas atmosphere, and then adding the monoanionic ligand L or the quinoxaline derivative represented by General Formula (G0) thereto and performing heating.

In Synthesis Schemes (D), (E), (F), and (G) above, M represents a Group 9 element or a Group 10 element; and each of $Ar^1$ and $Ar^2$ independently represents any one of a substituted or unsubstituted phenyl group, naphthyl group, phenanthryl group, and fluorenyl group. Each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and at least one of $R^1$ to $R^4$ represents any of fluorine, a cyano group, a trifluoromethyl group, a trifluoromethylsulfonyl group, and a pentafluorosulfanyl group. Any of the substituents included in $Ar^1$ and $Ar^2$ may be bonded to each other to form a ring. $Ar^1$ and $Ar^2$ may be directly bonded to each other. L represents a monoanionic ligand. When M is a Group 9 element, m+n=3 (where m=0, 1, or 2 and n=1, 2, or 3); when M is a Group 10 element, m+n=2 (where m=0 or 1 and n=1 or 2).

Although the methods for synthesizing the organometallic complex represented by General Formula (G1) as the organometallic complex of one embodiment of the present invention have been described above, the present invention is not limited thereto and the organometallic complex may be synthesized by another synthesis method.

Note that the organometallic complex of one embodiment of the present invention includes a ligand having a quinoxaline skeleton coordinated to the central metal, and an electron-withdrawing group (e.g., fluorine, a cyano group, a trifluoromethyl group, a trifluoromethylsulfonyl group, or a pentafluorosulfanyl group) as a substituent at at least one substitutable position of the benzene ring of the quinoxaline skeleton of the ligand. Introducing the electron-withdrawing group into the ligand can lower the LUMO (Lowest Unoccupied Molecular Orbital) level of the ligand and the bandgap, which is represented by the difference between the LUMO level and the HOMO (Highest Occupied Molecular Orbital) level, is reduced accordingly; hence, it is possible to provide an organometallic complex having an emission peak in a longer wavelength region (a visible region of 700 nm or greater or a near-infrared region) compared to one which does not include such a substitute. In addition, the use of the organometallic complex having such a low LUMO level in a light-emitting layer of a light-emitting device enables the behavior of carriers in the light-emitting layer to be controlled, whereby the efficiency and reliability of the light-emitting device can be improved.

Note that in this specification, "the HOMO level or the LUMO level is high" means that the energy level is high, and "the HOMO level or the LUMO level is low" means that the energy level is low.

With the use of the organometallic complex of one embodiment of the present invention, a highly efficient and reliable light-emitting device, light-emitting apparatus, electronic device, or lighting device can be achieved.

Although the organometallic complexes of the embodiments of the present invention have been described in this embodiment, one embodiment of the present invention is not limited thereto. In other words, one embodiment of the present invention can be combined with various embodiments of the invention that are described in the other embodiments.

Embodiment 2

In this embodiment, an example of a light-emitting device of one embodiment of the present invention will be described. Note that in the light-emitting device described in this embodiment, the organometallic complex of one embodiment of the present invention can be used.

<<Structure Example of Light-Emitting Device>>

Figure 1B:
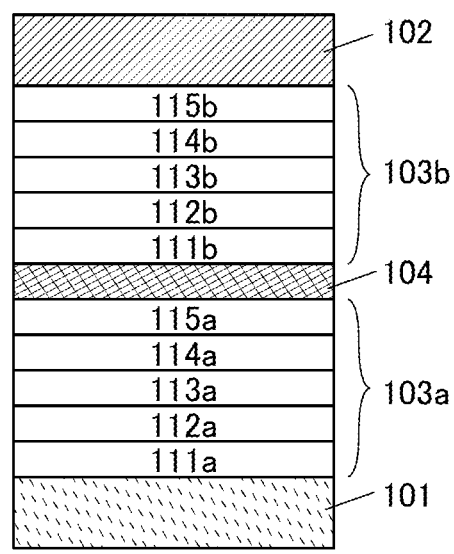

FIG. 1A illustrates an example of a light-emitting device including, between a pair of electrodes, an EL layer including a light-emitting layer. Specifically, the light-emitting device has a structure in which an EL layer 103 is sandwiched between a first electrode 101 and a second electrode 102. For example, in the case where the first electrode 101 serves as an anode, the EL layer 103 has a structure in which a hole-injection layer 111, a hole-transport layer 112, a light-emitting layer 113, an electron-transport layer 114, and an electron-injection layer 115 are sequentially stacked as functional layers. Embodiments of the present invention also include light-emitting devices having other structures, for example, a light-emitting device that can be driven at a low voltage by having a structure where a plurality of EL layers (103a and 103b), between which a charge-generation layer 104 is sandwiched, are provided between a pair of electrodes as illustrated in FIG. 1B (a tandem structure), and a light-emitting device that has improved optical characteristics by having a micro-optical resonator (microcavity) structure between a pair of electrodes. Note that the charge-generation layer 104 has a function of injecting electrons into one of the adjacent EL layers and injecting holes into the other of the EL layers when a voltage is applied to the first electrode 101 and the second electrode 102.

At least one of the first electrode 101 and the second electrode 102 of the above light-emitting device is an electrode having a light-transmitting property (e.g., a transparent electrode or a transflective electrode). Thus, in terms of the direction of light emitted by the light-emitting device, the light-emitting device can have a top-emission structure where light is emitted from the second electrode 102 side in FIG. 1A or a bottom-emission structure where light is emitted from the first electrode 101 side. In the case where the electrode having a light-transmitting property is a transparent electrode, the transparent electrode has a transmittance of visible light (light with a wavelength greater than or equal to 400 nm and less than 750 nm) or near-infrared light (light with a wavelength greater than or equal to 750 nm and less than or equal to 1000 nm) of higher than or equal to 40%. In the case where the electrode having a light-transmitting property is a transflective electrode, the transflective electrode has a reflectance of visible light or near-infrared light of higher than or equal to 10% and lower than 100%, preferably higher than or equal to 30% and lower than 100%. The resistivity of these electrodes is preferably $1 \times 10^{-2}$ Ωcm or lower.

In the case where one of the first electrode 101 and the second electrode 102 is an electrode having reflectivity (a reflective electrode) in the above light-emitting device of one embodiment of the present invention, the visible light reflectance of the electrode having reflectivity is higher than or equal to 40% and lower than or equal to 100%, preferably higher than or equal to 70% and lower than or equal to 100%. The resistivity of this electrode is preferably $1 \times 10^{-2}$ Ωcm or lower.

In the case where the light-emitting device of one embodiment of the present invention has the above micro-optical resonator (microcavity) structure, the first electrode 101 is formed as a reflective electrode and the second electrode 102 is formed as a transflective electrode in FIG. 1A, for example; thus, light emitted from the EL layer 103 can be resonated between the electrodes and the intensity of the obtained light can be increased. Note that when the first electrode 101 is a reflective electrode having a stacked-layer structure of a reflective conductive material and a light-transmitting conductive material (a transparent conductive film), optical adjustment can be performed by adjusting the thickness of the transparent conductive film. Specifically, when the wavelength of light obtained from the light-emitting layer 113 is λ, the distance between the first electrode 101 and the second electrode 102 is preferably adjusted to around mλ/2 (m is a natural number).

To amplify desired light (wavelength: λ) obtained from the light-emitting layer 113, the optical path length from the first electrode 101 to a region where the desired light is obtained in the light-emitting layer 113 (a light-emitting region) and the optical path length from the second electrode 102 to the region where the desired light is obtained in the light-emitting layer 113 (the light-emitting region) are preferably adjusted to around (2m'+1)λ/4 (m' is a natural number). Here, the light-emitting region refers to a region where holes and electrons are recombined in the light-emitting layer 113.

By performing such optical adjustment, the spectrum of specific monochromatic light obtained from the light-emitting layer 113 can be narrowed, and light emission with high color purity can be obtained.

Note that in the above case, the optical path length between the first electrode 101 and the second electrode 102 is, to be exact, represented by a value obtained by adding a phase shift caused by reflection to the product of a refractive index and the distance from a reflective surface in the first electrode 101 to a reflective surface in the second electrode 102. However, it is difficult to precisely determine a phase shift and the reflective surfaces in the first electrode 101 and the second electrode 102; thus, it is assumed that the above effect can be sufficiently obtained when given positions in the first electrode 101 and the second electrode 102 are presumed to be reflective surfaces and a given phase shift is presumed. Furthermore, it can be said that the optical path length between the first electrode 101 and the light-emitting layer from which the desired light is obtained is, to be exact, a value obtained by adding a phase shift caused by reflection to the produce of a refractive index and the distance between the reflective surface in the first electrode 101 and the light-emitting region in the light-emitting layer from which the desired light is obtained. However, it is difficult to precisely determine a phase shift and the reflective surface in the first electrode 101 and the light-emitting region in the light-emitting layer from which the desired light is obtained; thus, it is assumed that the above effect can be sufficiently obtained when a given position in the first electrode 101 is presumed to be the reflective surface, a given phase shift is presumed, and a given position in the light-emitting layer from which the desired light is obtained is presumed to be the light-emitting region.

In the case where the light-emitting device has a microcavity structure, light (monochromatic light) with different wavelengths can be extracted even when the same EL layer is used. Thus, separate coloring for obtaining different emission colors (e.g., R, G, and B) is not necessary, and high definition can be achieved. A combination with coloring layers (color filters) is also possible. Furthermore, the emission intensity of light with a specific wavelength in the front direction can be increased, so that power consumption can be reduced.

Next, the structure of the light-emitting device and the electrodes and the functional layers included in the light-emitting device are specifically described on the basis of the structure illustrated in FIG. 1A. Note that also in the tandem structure illustrated in FIG. 1B, the first electrode 101, the second electrode 102, and the EL layers (103a and 103b), which form the light-emitting device as in FIG. 1A, and hole-injection layers (111a and 111b), hole-transport layers (112a and 112b), light-emitting layers (113a and 113b), electron-transport layers (114a and 114b), and electron-injection layers (115a and 115b) that are functional layers included in the EL layers (103a and 103b) are formed using similar materials and have similar functions.

<First Electrode and Second Electrode>

As materials for forming the first electrode 101 and the second electrode 102, any of the following materials can be used in an appropriate combination as long as the functions of the electrodes described above can be fulfilled. For example, a metal, an alloy, an electrically conductive compound, and a mixture of these can be used as appropriate. Specific examples include In—Sn oxide (also referred to as ITO), In—Si—Sn oxide (also referred to as ITSO), In—Zn oxide, and In—W—Zn oxide. In addition, it is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

For fabrication of these electrodes, a sputtering method or a vacuum evaporation method can be used.

<Hole-Injection Layer>

The hole-injection layer 111 is a layer injecting holes from the first electrode 101 that is an anode to the EL layer 103, and is a layer containing an organic acceptor material or a material with a high hole-injection property.

The organic acceptor material is a material that allows holes to be generated in another organic compound whose HOMO level value is close to the LUMO level value of the organic acceptor material when charge separation is caused between the organic acceptor material and the organic compound. Thus, as the organic acceptor material, a compound having an electron-withdrawing group (a halogen group or a cyano group), such as a quinodimethane derivative, a chloranil derivative, and a hexaazatriphenylene derivative, can be used. For example, 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), or 1,3,4,5,7,8-hexafluorotetracyano-naphthoquinodimethane (abbreviation: F6-TCNNQ) can be used. Among organic acceptor materials, HAT-CN, which has a high acceptor property and stable film quality against heat, is particularly favorable. Besides, a [3]radialene derivative has a very high electron-accepting property and thus is preferable; specifically, α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], α,α',α''-1,2,3-cyclopropanetriylidenetris[2,3,4,5,6-pentafluorobenzeneacetonitrile], or the like can be used.

Examples of the material with a high hole-injection property include transition metal oxides such as molybdenum oxide, vanadium oxide, ruthenium oxide, tungsten oxide, and manganese oxide. It is also possible to use a phthalocyanine-based compound such as phthalocyanine (abbreviation: H₂Pc) or copper phthalocyanine (abbreviation: CuPc), or the like.

In addition to the above materials, it is also possible to use an aromatic amine compound, which is a low molecular compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

It is also possible to use a high molecular compound (an oligomer, a dendrimer, a polymer, or the like) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: Poly-TPD). It is also possible to use a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

Alternatively, as the material having a high hole-injection property, a composite material containing a hole-transport material and an acceptor material (an electron-accepting material) can be used. In this case, the acceptor material extracts electrons from the hole-transport material, so that holes are generated in the hole-injection layer 111 and the holes are injected into the light-emitting layer 113 through the hole-transport layer 112. Note that the hole-injection layer 111 may be formed as a single layer made of a composite material containing a hole-transport material and an acceptor material (an electron-accepting material), or may be formed by stacking a layer containing a hole-transport material and a layer containing an acceptor material (an electron-accepting material).

As the hole-transport material, a substance having a hole mobility of greater than or equal to $1\times10^{-6}$ cm²/Vs is preferable. Note that other substances can also be used as long as they have a property of transporting more holes than electrons.

As the hole-transport material, a material having a high hole-transport property, such as a π-electron rich heteroaromatic compound, is preferable. As a second organic compound used for the composition for a light-emitting device of one embodiment of the present invention, a material such as a π-electron rich heteroaromatic compound is preferable among materials included in hole-transport materials. Examples of the π-electron rich heteroaromatic compound include an aromatic amine compound having an aromatic amine skeleton (having a triarylamine skeleton), a carbazole compound having a carbazole skeleton (not having a triarylamine skeleton), a thiophene compound (a compound having a thiophene skeleton), and a furan compound (a compound having a furan skeleton).

Examples of the aromatic amine compound include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Examples of the aromatic amine compound having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-[4-(9-phenyl-9H-carbazol-3-yl)phenyl]-bis(9,9-dimethyl-9H-fluoren-2-yl)amine (abbreviation: PCBFF), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N-[4-(9-phenyl-9H-carbazol-3-yl)phenyl]-9,9-dimethyl-N-[4-(1-naphthyl)phenyl]-9H-fluoren-2-amine (abbreviation: PCBNBF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Examples of the carbazole compound (not having a triarylamine skeleton) include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis (3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). Other examples include 3,3'-bis(9-phenyl-9H-carbazole) (abbreviation: PCCP), 9-(1,1'-biphenyl-3-yl)-9'-(1,1'-biphenyl-4-yl)-9H, 9'H-3,3'-bicarbazole (abbreviation: mBPCCBP), and 9-(2-naphthyl)-9'-phenyl-9H,9'H-3,3'-bicarbazole (abbreviation: βNCCP), which are bicarbazole derivatives (e.g., a 3,3'-bicarbazole derivative).

Examples of the thiophene compound (the compound having a thiophene skeleton) include 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Examples of the furan compound (the compound having a furan skeleton) include 4,4',4"-(benzene-1,3,5-triyl)tri (dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

In addition, a high molecular compound such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used as the hole-transport material.

Note that the hole-transport material is not limited to the above, and one of or a combination of various known materials may be used as the hole-transport material.

As the acceptor material used for the hole-injection layer 111, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. It is also possible to use any of the above-described organic acceptors.

Note that the hole-injection layer 111 can be formed by any of various known deposition methods, and can be formed by a vacuum evaporation method, for example.

<Hole-Transport Layer>

The hole-transport layer 112 is a layer transporting holes, which are injected from the first electrode 101 by the hole-injection layer 111, to the light-emitting layer 113. Note that the hole-transport layer 112 is a layer containing a hole-transport material. Thus, for the hole-transport layer 112, a hole-transport material that can be used for the hole-injection layer 111 can be used.

Note that in the light-emitting device of one embodiment of the present invention, the same organic compound as that for the hole-transport layer 112 is preferably used for the light-emitting layer 113. This is because the use of the same organic compound for the hole-transport layer 112 and the light-emitting layer 113 allows efficient hole transport from the hole-transport layer 112 to the light-emitting layer 113.

<Light-Emitting Layer>

The light-emitting layer 113 is a layer containing a light-emitting substance (an organic compound). There is no particular limitation on the light-emitting substance that can be used for the light-emitting layer 113, and it is possible to use a light-emitting substance that converts singlet excitation energy into light in the visible light range (e.g., a fluorescent substance) or a light-emitting substance that converts triplet excitation energy into light in the visible light range (e.g., a phosphorescent material or a TADF material). In addition, a substance that exhibits emission color of blue, purple, bluish purple, green, yellow green, yellow, orange, red, or the like can be appropriately used.

The light-emitting layer 113 includes a light-emitting substance (a guest material) and one or more kinds of organic compounds (e.g., a host material). Note that as the organic compound (e.g., the host material) used here, it is preferable to use a substance whose energy gap is larger than the energy gap of the light-emitting substance (the guest material). Examples of one or more kinds of organic compounds (e.g., the host material) include organic compounds such as a hole-transport material that can be used for the hole-transport layer 112 described above and an electron-transport material that can be used for the electron-transport layer 114 described later.

In the case where the light-emitting layer 113 is configured to contain a first organic compound, a second organic compound, and a light-emitting substance, it is possible to use a composition for a light-emitting device that is one embodiment of the present invention and is formed by mixing the first organic compound and the second organic compound. In such a structure, it is possible to use an electron-transport material as the first organic compound, a hole-transport material as the second organic compound, and a phosphorescent substance, a fluorescent substance, a TADF material, or the like as the light-emitting substance. Furthermore, in such a structure, a combination of the first organic compound and the second organic compound preferably forms an exciplex.

As another structure, the light-emitting layer 113 may have a structure including a plurality of light-emitting layers containing different light-emitting substances to exhibit different emission colors (e.g., white light emission obtained by a combination of complementary emission colors). Alternatively, a structure may be employed in which one light-emitting layer includes a plurality of different light-emitting substances.

Examples of the light-emitting substance that can be used in the light-emitting layer 113 are as follows.

First, an example of the light-emitting substance that converts singlet excitation energy into light is a substance exhibiting fluorescence (a fluorescent substance).

Examples of the fluorescent substance, which is a light-emitting substance that converts singlet excitation energy into light, include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl] pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine](abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra-tert-butylperylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

Note that the light-emitting substance that converts singlet excitation energy into light (the fluorescent substance), which can be used in the light-emitting layer 113, is not limited to the above-described fluorescent substance that exhibits an emission color (an emission peak) in the visible light range, and can also be a fluorescent substance that exhibits an emission color (an emission peak) in part of the near-infrared range (e.g., a material that emits red light and has a peak at greater than or equal to 800 nm and less than or equal to 950 nm).

Next, examples of the light-emitting substance that converts triplet excitation energy into light include a substance that exhibits phosphorescence (the phosphorescent substance) and a thermally activated delayed fluorescence (TADF) material that exhibits thermally activated delayed fluorescence.

First, examples of the phosphorescent substance, which is a light-emitting substance that converts triplet excitation energy into light, include an organometallic complex, a metal complex (a platinum complex), and a rare earth metal complex. These substances exhibit different emission colors (emission peaks), and thus are used through appropriate selection as needed. Note that among the phosphorescent substances, examples of materials that exhibit an emission color (an emission peak) in the visible light range are as follows.

The following substances are examples of a phosphorescent substance that exhibits blue or green and has an emission spectrum with a peak wavelength at greater than or equal to 450 nm and less than or equal to 570 nm (e.g., preferably greater than or equal to 450 nm and less than or equal to 495 nm for blue and greater than or equal to 495 nm and less than or equal to 570 nm for green).

The examples include organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

The following substances are examples of a phosphorescent substance that exhibits green, yellow green, or yellow and has an emission spectrum with a peak wavelength at greater than or equal to 495 nm and less than or equal to 590 nm. (For example, a peak wavelength from 495 nm to 570 nm is preferable for green, a peak wavelength from 530 nm to 570 nm is preferable for yellow green, and a peak wavelength from 570 nm to 590 nm is preferable for yellow.)

The examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$ (acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$ (acac)]) and (acetylacetonato)bis(5-isopropyl-3-methyl-2-phenylpyrazinato)iridium(III) (abbreviation: [Ir(mppr-iPr)$_2$ (acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III)

acetylacetonate (abbreviation: [Ir(pq)₂(acac)]), bis[2-(2-pyridinyl-κN)phenyl-κC][2-(4-phenyl-2-pyridinyl-κN)phenyl-κC]iridium(III) (abbreviation: [Ir(ppy)₂(4dppy)]), bis[2-(2-pyridinyl-κN)phenyl-κC][2-(4-methyl-5-phenyl-2-pyridinyl-κN)phenyl-κC], and [2-(4-methyl-5-phenyl-2-pyridinyl-κN)phenyl-κC]bis[2-(2-pyridinyl-κN)phenyl-κC] iridium (abbreviation: [Ir(ppy)₂(mdppy)]); organometallic complexes such as bis(2,4-diphenyl-1,3-oxazolato-N,C²') iridium(III) acetylacetonate (abbreviation: [Ir(dpo)₂(acac)]), bis{2-[4'-(perfluorophenyl)phenyl]pyridinato-N, C²'}iridium(III) acetylacetonate (abbreviation: [Ir(p-PF-ph)₂(acac)]), and bis(2-phenylbenzothiazolato-N,C²')iridium(III) acetylacetonate (abbreviation: [Ir(bt)₂(acac)]); and rare earth metal complexes such as tris(acetylacetonato)(monophenanthroline)terbium(III) (abbreviation: [Tb(acac)₃(Phen)]).

The following substances are examples of a phosphorescent substance that exhibits yellow, orange, or red and has an emission spectrum with a peak wavelength at greater than or equal to 570 nm and less than or equal to 750 nm. (For example, a peak wavelength from 570 nm to 590 nm is preferable for yellow, a peak wavelength from 590 nm to 620 nm is preferable for orange, and a peak wavelength from 600 nm to 750 nm is preferable for red.)

The examples include organometallic complexes having a pyrimidine skeleton, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), and (dipivaloylmethanato)bis[4,6-di(naphthalen-1-yl)pyrimidinato]iridium(III) (abbreviation: [Ir(d1npm)₂(dpm)]); organometallic complexes having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: [Ir(dmdppr-P)₂(dibm)]), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-κ²O,O')iridium(III) (abbreviation: [Ir(dmdppr-dmCP)₂(dpm)]), bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-κ²O,O')iridium(III) (abbreviation: [Ir(dmdppr-m5CP)₂(dpm)]), (acetylacetonato)bis[2-methyl-3-phenylquinoxalinato-N,C²']iridium(III) (abbreviation: [Ir(mpq)₂(acac)]), (acetylacetonato)bis(2,3-diphenylquinoxalinato-N,C²')iridium(III) (abbreviation: [Ir(dpq)₂(acac)]), and (acetylacetonato)bis[2,3-bis(4-fluorophenyl)quinoxalinato]iridium(III) (abbreviation: [Ir(Fdpq)₂(acac)]); organometallic complexes having a pyridine skeleton, such as tris(1-phenylisoquinolinato-N,C²')iridium(III) (abbreviation: [Ir(piq)₃]), bis(1-phenylisoquinolinato-N,C²')iridium(III) acetylacetonate (abbreviation: [Ir(piq)₂(acac)]), and bis[4,6-dimethyl-2-(2-quinolinyl-κN)phenyl-κC](2,4-pentanedionato-κ²O,O')iridium(III) (abbreviation: [Ir(dmpqn)₂(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)₃(Phen)]) and tris[1-(2-thenoyl)-3,3,3-trifluoroacetonato](monophenanthroline)europium(III) (abbreviation: [Eu(TTA)₃(Phen)]).

Note that the material that can be used in the light-emitting layer 113 is not limited to the above-described phosphorescent substance that exhibits an emission color (an emission peak) in the visible light range, and can also be a phosphorescent substance that exhibits an emission color (an emission peak) in part of the near-infrared range (e.g., a material that emits red light and has a peak at greater than or equal to 800 nm and less than or equal to 950 nm), for example, a phthalocyanine compound (central metal: aluminum, zinc, or the like), a naphthalocyanine compound, a dithiolene compound (central metal: nickel), a quinone-based compound, a diimonium-based compound, or an azo-based compound.

The following materials can be used as the TADF material, which is a light-emitting substance that converts triplet excitation energy into light. Note that the TADF material is a material that enables upconversion of a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $1 \times 10^{-6}$ seconds or longer, preferably $1 \times 10^{-3}$ seconds or longer.

Specific examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF₂(Proto IX)), a mesoporphyrin-tin fluoride complex (abbreviation: SnF₂(Meso IX)), a hematoporphyrin-tin fluoride complex (abbreviation: SnF₂(Hemato IX)), a coproporphyrin tetramethyl ester-tin fluoride complex (abbreviation: SnF₂(Copro III-4Me)), an octaethylporphyrin-tin fluoride complex (abbreviation: SnF₂(OEP)), an etioporphyrin-tin fluoride complex (abbreviation: SnF₂(Etio I)), and an octaethylporphyrin-platinum chloride complex (abbreviation: PtCl₂OEP).

It is also possible to use a heterocyclic compound having one or both of a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA).

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

In the case where the above-described light-emitting substance (the light-emitting substance that converts singlet excitation energy into light in the visible light region (e.g., the fluorescent substance) or the light-emitting substance that converts triplet excitation energy into light in the visible light region (e.g., the phosphorescent substance or the TADF material)) is used in the light-emitting layer 113, the following organic compounds (some of which overlap the above) are preferably used in terms of a preferred combination with the light-emitting substance (the organic compound).

First, in the case where the fluorescent substance is used as the light-emitting substance, an organic compound like a condensed polycyclic aromatic compound such as an anthracene derivative, a tetracene derivative, a phenanthrene derivative, a pyrene derivative, a chrysene derivative, or a dibenzo[g,p]chrysene derivative is preferably used in combination.

Specific examples include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N,N,N',N',N'',N''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}-anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the phosphorescent substance is used as the light-emitting substance, it is preferably combined with an organic compound having triplet excitation energy (energy difference between a ground state and a triplet excited state) higher than the triplet excitation energy of the light-emitting substance. Other than such an organic compound, the above-described organic compound having a high hole-transport property (the second organic compound) and an organic compound having a high electron-transport property (the first organic compound) may be used in combination.

Other than such organic compounds, a plurality of organic compounds that can form an exciplex (e.g., the first organic compound and the second organic compound, a first host material and a second host material, or a host material and an assist material) may be used. When a plurality of organic compounds are used to form an exciplex, a combination of a compound that easily accepts holes (a hole-transport material) and a compound that easily accepts electrons (an electron-transport material) is preferable, in which case an exciplex can be efficiently formed. When the phosphorescent substance and the exciplex are included in the light-emitting layer, the emission efficiency can be increased because ExTET (Exciplex-Triplet Energy Transfer), which is energy transfer from the exciplex to the light-emitting substance, can be efficiently performed. Note that the fluorescent substance and the exciplex may alternatively be included in the light-emitting layer.

Note that in the case where the phosphorescent substance (or sometimes the fluorescent substance as described above) is used as the light-emitting substance and a plurality of organic compounds (e.g., the first organic compound and the second organic compound, a first host material and a second host material, or a host material and an assist material) are used for the phosphorescent substance, the plurality of organic compounds may be mixed at a required weight ratio in advance and the mixture may be deposited by an evaporation method.

Figures 12A, 12B:
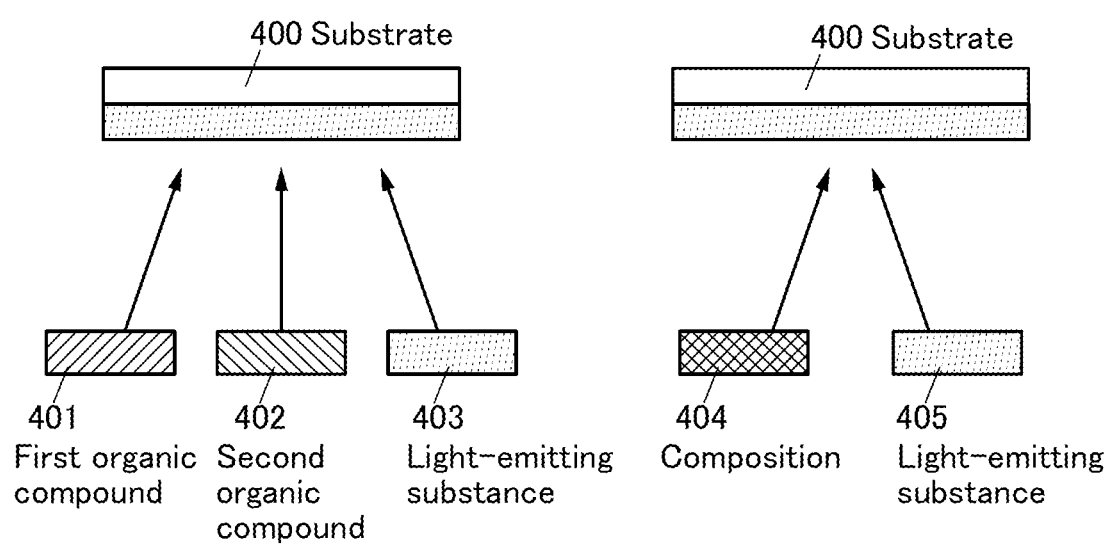
FIG. 12A and FIG. 12B are diagrams illustrating evaporation methods.

For example, in the case where three kinds of materials (the light-emitting substance, the first organic compound, and the second organic compound) are used to form the light-emitting layer 113, evaporation sources as many as the materials to be evaporated (three in this case) are used as illustrated in FIG. 12A, and a first organic compound 401, a second organic compound 402, and a light-emitting substance 403 are put in the respective evaporation sources and co-evaporated, whereby the light-emitting layer 113 that is a mixed film of the three kinds of evaporation materials is formed on the surface of a substrate 400. Meanwhile, in the case of using a composition made by mixing the first organic compound and the second organic compound among the three kinds of materials, two evaporation sources are used as illustrated in FIG. 12B even though three kinds of materials are used to form the light-emitting layer 113, and a composition 404 and a light-emitting substance 405 are put in the respective evaporation sources and co-evaporated, whereby the light-emitting layer 113 that is the same mixed film as the mixed film formed using three evaporation sources can be formed. Performing evaporation using a composition in this manner can reduce inconvenience such as increase in complexity of apparatus specifications and increase in labor for maintenance in the mass production line; thus, a light-emitting device with high productivity can be manufactured.

Any of the above materials may be used in combination with a low molecular material or a high molecular material. Specific examples of the high molecular material include poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)](abbreviation: PF-BPy). For the deposition, a known method (e.g., a vacuum evaporation method, a coating method, or a printing method) can be used as appropriate.

<Electron-Transport Layer>

The electron-transport layer 114 is a layer transporting electrons, which are injected from the second electrode 102 through the electron-injection layer 115 to be described later, to the light-emitting layer 113. Note that the electron-transport layer 114 is a layer containing an electron-transport material. As the electron-transport material used in the electron-transport layer 114, a substance having an electron mobility greater than or equal to $1 \times 10^{-6}$ cm$^2$/Vs is preferable. Note that any other substance can also be used as long as the substance transports more electrons than holes. The electron-transport layer 114 functions even with a single-layer structure, but can improve the device characteristics when having a stacked-layer structure of two or more layers as needed.

As an organic compound that can be used in the electron-transport layer 114, a material having a high electron-transport property, such as a π-electron deficient heteroaromatic compound, is preferable. As the first organic compound used for the composition for a light-emitting device of one embodiment of the present invention, a material such as a π-electron deficient heteroaromatic compound is preferable among materials included in electron-transport materials. Examples of the π-electron deficient heteroaromatic compound include a compound having a benzofurodiazine skeleton in which a benzene ring as an aromatic ring is fused to a furan ring of a furodiazine skeleton, a compound having a naphtofurodiazine skeleton in which a naphthyl ring as an aromatic ring is fused to a furan ring of a furodiazine skeleton, a compound having a phenanthrofurodiazine skeleton in which a phenanthro ring as an aromatic ring is fused to a furan ring of a furodiazine skeleton, a compound having a benzothienodiazine skeleton in which a benzene ring as an aromatic ring is fused to a thieno ring of a thienodiazine skeleton, a compound having a naphthothienodiazine skeleton in which a naphthyl ring as an aromatic ring is fused to a thieno ring of a thienodiazine skeleton, and a compound having a phenanthrothienodiazine skeleton in which a phenanthro ring as an aromatic ring is fused to a thieno ring of a thienodiazine skeleton. Other examples include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a nitrogen-containing heteroaromatic compound.

Examples of the electron-transport material include 9-[(3'-dibenzothiophen-4-yl)biphenyl-3-yl]naphtho[1',2':4,5]furo[2,3-b]pyrazine (abbreviation: 9mDBtBPNfpr), 9-(9'-phenyl-3,3'-bi-9H-carbazol-9-yl)naphtho[1',2':4,5]furo[2,3-b]pyrazine (abbreviation: 9PCCzNfpr), 9-[3-(9'-phenyl-3,3'-bi-9H-carbazol-9-yl)phenyl]naphtho[1',2':4,5]furo[2,3-b]pyrazine (abbreviation: 9mPCCzPNfpr), 9-[3-(9'-phenyl-2,3'-bi-9H-carbazol-9-yl)phenyl]naphtho[1',2':4,5]furo[2,3-b]pyrazine (abbreviation: 9mPCCzPNfpr-02), 10-[(3'-dibenzothiophen-4-yl)biphenyl-3-yl]naphtho[1',2':4,5]furo[2,3-b]pyrazine (abbreviation: 10mDBtBPNfpr), 10-(9'-phenyl-3,3'-bi-9H-carbazol-9-yl)naphtho[1',2':4,5]furo[2,3-b]pyrazine (abbreviation: 10PCCzNfpr), 12-[(3'-dibenzothiophen-4-yl)biphenyl-3-yl]phenanthro[9',10':4,5]furo[2,3-b]pyrazine (abbreviation: 12mDBtBPPNfpr), 9-[4-(9'-phenyl-3,3'-bi-9H-carbazol-9-yl)phenyl]naphtho[1',2':4,5]furo[2,3-b]pyrazine (abbreviation: 9pPCCzPNfpr), 9-[4-(9'-phenyl-2,3'-bi-9H-carbazol-9-yl)phenyl]naphtho[1',2':4,5]furo[2,3-b]pyrazine (abbreviation: 9pPCCzPNfpr-02), 9-[3'-(6-phenylbenzo[b]naphtho[1,2-d]furan-8-yl)biphenyl-3-yl]naphtho[1',2':4,5]furo[2,3-b]pyrazine (abbreviation: 9mBnfBPNfpr), 9-[3'-(6-phenyldibenzothiophen-4-yl)biphenyl-3-yl]naphtho[1',2':4,5]furo[2,3-b]pyrazine (abbreviation: 9mDBtBPNfpr-02), 9-{3-[6-(9,9-dimethylfluoren-2-yl)dibenzothiophen-4-yl]phenyl}naphtho[1',2':4,5]furo[2,3-b]pyrazine (abbreviation: 9mFDBtPNfpr), 11-(3-naphtho[1',2':4,5]furo[2,3-b]pyrazin-9-yl-phenyl)-12-phenylindolo[2,3-a]carbazole (abbreviation: 9mIcz(II)PNfpr), 3-naphtho[1',2':4,5]furo[2,3-b]pyrazin-9-yl-N,N-diphenylbenzenamine (abbreviation: 9mTPANfpr), 10-[4-(9'-phenyl-3,3'-bi-9H-carbazol-9-yl)phenyl]naphtho[1',2':4,5]furo[2,3-b]pyrazine (abbreviation: 10mPCCzPNfpr), 11-[(3'-(dibenzothiophen-4-yl)biphenyl-3-yl]phenanthro[9',10':4,5]furo[2,3-b]pyrazine (abbreviation: 11mDBtBPPNfpr), 10-[3-(9'-phenyl-3,3'-bi-9H-carbazol-9-yl)phenyl]naphtho[1',2':4,5]furo[2,3-b]pyrazine (abbreviation: 10pPCCzPNfpr), 9-[3-(7H-dibenzo[c,g]carbazol-7-yl)phenyl]naphtho[1',2':4,5]furo[2,3-b]pyrazine (abbreviation: 9mcgDBCzPNfpr), 9-{3'-[6-(biphenyl-3-yl)dibenzothiophen-4-yl]biphenyl-3-yl}naphtho[1',2':4,5]furo[2,3-b]pyrazine (abbreviation: 9mDBtBPNfpr-03), 9-{3'-[6-(biphenyl-4-yl)dibenzothiophen-4-yl]biphenyl-3-yl}naphtho[1',2':4,5]furo[2,3-b]pyrazine (abbreviation: 9mDBtBPNfpr-04), and 11-[3'-(6-phenyldibenzothiophen-4-yl)biphenyl-3-yl]phenanthro[9',10':4,5]furo[2,3-b]pyrazine (abbreviation: 11mDBtBPPNfpr-02).

It is also possible to use 4-[3-(dibenzothiophen-4-yl)phenyl]-8-(naphthalen-2-yl)-[1]benzofuro[3,2-d]pyrimidine (abbreviation: 8βN-4mDBtPBfpm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 4,8-bis[3-(dibenzothiophen-4-yl)phenyl]-[1]benzofuro[3,2-d]pyrimidine (abbreviation: 4,8mDBtP2Bfpm), 8-[(2,2'-binaphthalen)-6-yl]-4-[3-(dibenzothiophen-4-yl)phenyl-[1]benzofuro[3,2-d]pyrimidine (abbreviation: 8(pN2)-4mDBtPBfpm), 3,8-bis[3-(dibenzothiophen-4-yl)phenyl]benzofuro[2,3-b]pyrazine (abbreviation: 3,8mDBtP2Bfpr), 8-[3'-(dibenzothiophen-4-yl)(1,1'-biphenyl-3-yl)]naphtho[1',2':4,5]furo[3,2-d]pyrimidine (abbreviation: 8mDBtBPNfpm), or the like.

It is also possible to use, for example, a metal complex having a quinoline skeleton or a benzoquinoline skeleton, such as tris(8-quinolinolato)aluminum(III) (abbreviation: Alq$_3$), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq), or a metal complex having an oxazole skeleton or a thiazole skeleton, such as bis[2-(2-benzoxazolyl)phenolato]zinc(II) (abbreviation: ZnPBO), bis[2-(2-benzothiazolyl)phenolato]zinc(II) (abbreviation: ZnBTZ), and bis[2-(2-hydroxyphenyl)benzothiazolato]zinc(II) (abbreviation: Zn(BTZ)$_2$).

It is also possible to use an oxadiazole derivative such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), and 9-[4-(5-phenyl-1,3,4-oxadiazol-2-yl)phenyl]-9H-carbazole (abbreviation: CO 11); a triazole derivative such as 3-(4-biphenylyl)-4-phenyl-5-(4-tert-butylphenyl)-1,2,4-triazole (abbreviation: TAZ) and 3-(4-tert-butylphenyl)-4-(4-ethylphenyl)-5-(4-biphenylyl)-1,2,4-triazole (abbreviation: p-EtTAZ); an imidazole derivative (including a benzimidazole derivative) such as 2,2',2''-(1,3,5-benzenetriyl)tris(1-phenyl-1H-benzimidazole) (abbreviation: TPBI) and 2-[3-(dibenzothiophen-4-yl)phenyl]-1-phenyl-1H-benzimidazole (abbreviation: mDBTBIm-II); an oxazole derivative such as 4,4'-bis(5-methylbenzoxazol-2-yl)stilbene (abbreviation: BzOs); a phenanthroline derivative such as bathophenanthroline (abbreviation: Bphen), bathocuproine (abbreviation: BCP), and 2,9-bis(naphthalen-2-yl)-4,7-diphenyl-1,10-phenanthroline (abbreviation: NBphen); a quinoxaline derivative or a dibenzoquinoxaline derivative such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II); a pyridine derivative such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); a pyrimidine derivative such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); or a triazine derivative such as 2-{4-[3-(N-phenyl-9H-carbazol-3-yl)-9H-carbazol-9-yl]phenyl}-4,6-diphenyl-1,3,5-triazine (abbreviation: PCCzPTzn), mPCCzPTzn-02, 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), and 2-{3-[3-(dibenzothiophen-4-yl)phenyl]phenyl}-4,6-diphenyl-1,3,5-triazine (abbreviation: mDBtBPTzn).

It is also possible to use a high molecular compound such as PPy, PF-Py, and PF-BPy.

<Electron-Injection Layer>

The electron-injection layer 115 is a layer for increasing the efficiency of electron injection from the cathode 102 and is preferably formed using a material whose LUMO level value has a small difference (0.5 eV or less) from the work function value of the material of the cathode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate. A rare earth metal compound like erbium fluoride (ErF$_3$) can also be used.

<Charge-Generation Layer>

In the light-emitting device of FIG. 1B, the charge-generation layer 104 has a function of injecting electrons into the EL layer 103a and injecting holes into the EL layer 103b when voltage is applied between the first electrode (anode) 101 and the second electrode (cathode) 102. Note that the charge-generation layer 104 may have either a structure in which an electron acceptor (acceptor) is added to a hole-transport material or a structure in which an electron donor (donor) is added to an electron-transport material. Alternatively, both of these structures may be stacked. Note that forming the charge-generation layer 104 with the use of any of the above materials can inhibit the driving voltage to increase when the EL layers are stacked.

In the case where the charge-generation layer 104 has a structure in which an electron acceptor is added to a hole-transport material, any of the materials described in this embodiment can be used as the hole-transport material. Examples of the electron acceptor include 7,7,8,8-tetracyano-2,3,5,6-tetrafluoroquinodimethane (abbreviation: F$_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 104 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 1B illustrates the structure in which two EL layers 103 are stacked, a structure may be employed in which three or more EL layers are stacked with a charge-generation layer provided between different EL layers. The light-emitting layers 113 (113a and 113b) included in the EL layers (103, 103a, and 103b) each include an appropriate combination of a light-emitting substance and a plurality of substances, so that fluorescence or phosphorescence of a desired emission color can be obtained. In the case where a plurality of light-emitting layers 113 (113a and 113b) are provided, the light-emitting layers may have respective emission colors. In that case, light-emitting substances and other substances are different between the stacked light-emitting layers. For example, the light-emitting layer 113a can be blue and the light-emitting layer 113b can be red, green, or yellow; alternatively, the light-emitting layer 113a can be red and the light-emitting layer 113b can be blue, green, or yellow. Furthermore, in the case of employing a stacked-layer structure of three or more EL layers, the light-emitting layer (113a) of the first EL layer can be blue, the light-emitting layer (113b) of the second EL layer can be red, green, or yellow, and the light-emitting layer of the third EL layer can be blue. Alternatively, the light-emitting layer (113a) of the first EL layer can be red, the light-emitting layer (113b) of the second EL layer can be blue, green, or yellow, and the light-emitting layer of the third EL layer can be red. Note that another combination of emission colors can be employed as appropriate in consideration of luminance and characteristics of a plurality of emission colors.

<Substrate>

The light-emitting device described in this embodiment can be formed over a variety of substrates. Note that the type of the substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base material film.

Examples of the glass substrate include barium borosilicate glass, aluminoborosilicate glass, and soda lime glass. Examples of the flexible substrate, the laminate film, and the base material film include plastics typified by polyethylene terephthalate (PET), polyethylene naphthalate (PEN), and polyether sulfone (PES), a synthetic resin such as an acrylic resin, polypropylene, polyester, polyvinyl fluoride, polyvinyl chloride, polyamide, polyimide, an aramid resin, an epoxy resin, an inorganic vapor deposition film, and paper.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (111, 111a, and 111b), the hole-transport layers (112, 112a, and 112b), the light-emitting layers (113, 113a, and 113b), the electron-transport layers (114, 114a, and 114b), and the electron-injection layers (115, 115a, and 115b)) included in the EL layers and the charge-generation layer (104) of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, a micro-contact printing method, or a nanoimprinting method), or the like.

Note that materials for the functional layers (the hole-injection layers (111, 111a, and 111b), the hole-transport layers (112, 112a, and 112b), the light-emitting layers (113, 113a, and 113b), the electron-transport layers (114, 114a, and 114b), and the electron-injection layers (115, 115a, and 115b)) included in the EL layers (103, 103a, and 103b) and the charge-generation layer (104) of the light-emitting device described in this embodiment are not limited to the above materials, and other materials can also be used in combination as long as the functions of the layers are fulfilled. For example, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

The structure described in this embodiment can be used in an appropriate combination with any of the structures described in the other embodiments.

Embodiment 3

Figure 2A:
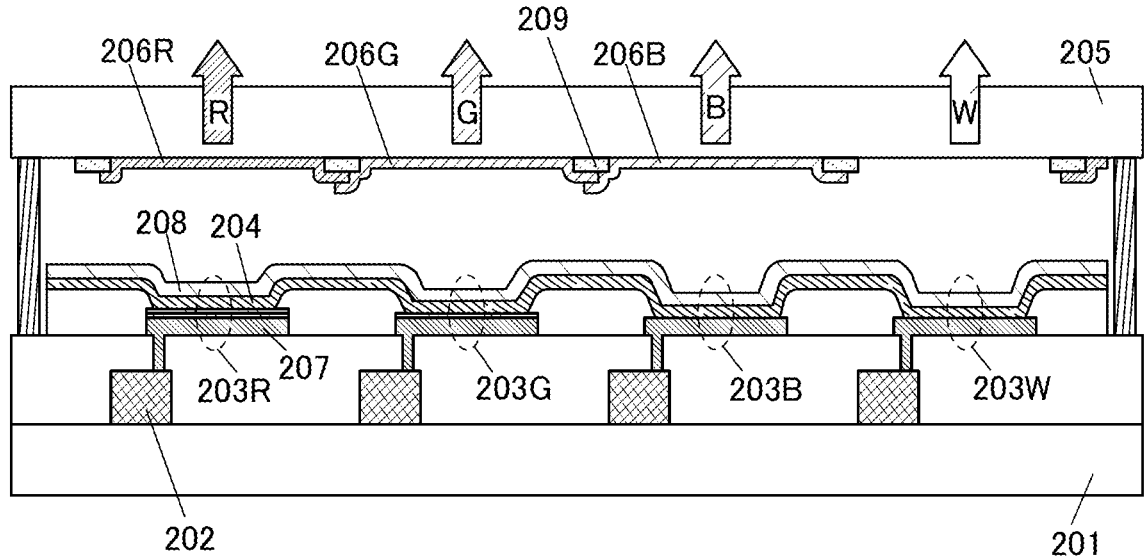
FIG. 2A, FIG. 2B, and FIG. 2C are diagrams illustrating light-emitting apparatuses.

In this embodiment, a light-emitting apparatus of one embodiment of the present invention will be described. A light-emitting apparatus illustrated in FIG. 2A is an active-matrix light-emitting apparatus in which transistors (FETs) 202 over a first substrate 201 are electrically connected to light-emitting devices (203R, 203G, 203B, and 203W); the light-emitting devices (203R, 203G, 203B, and 203W) include a common EL layer 204 and each have a microcavity structure where the optical path length between electrodes of each light-emitting device is adjusted according to the emission color of the light-emitting device. The light-emitting apparatus is a top-emission light-emitting apparatus in which light obtained from the EL layer 204 is emitted through color filters (206R, 206G, and 206B) formed on a second substrate 205.

In the light-emitting apparatus illustrated in FIG. 2A, a first electrode 207 is formed so as to function as a reflective electrode. A second electrode 208 is formed to function as a transflective electrode having both properties of transmitting and reflecting light (visible light or near-infrared light). Note that the description in the other embodiments can be referred to for electrode materials forming the first electrode 207 and the second electrode 208, and appropriate materials can be used.

Figure 2B:
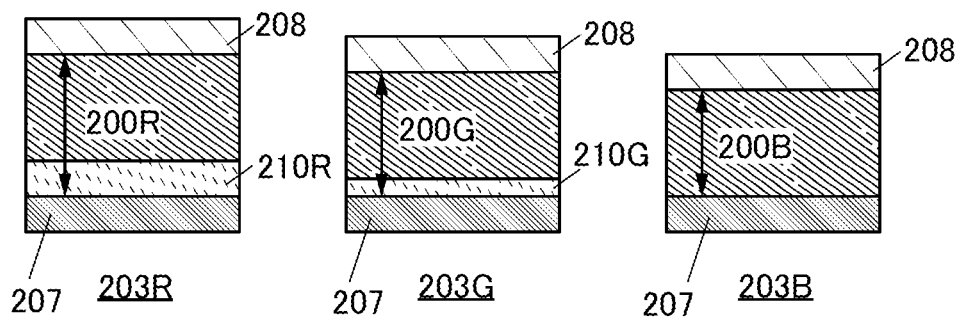

In the case where the light-emitting device 203R is a red-light-emitting device, the light-emitting device 203G is a green-light-emitting device, the light-emitting device 203B is a blue-light-emitting device, and the light-emitting device 203W is a white-light-emitting device in FIG. 2A, for example, the distance between the first electrode 207 and the second electrode 208 in the light-emitting device 203R is adjusted to have an optical path length 200R, the distance between the first electrode 207 and the second electrode 208 in the light-emitting device 203G is adjusted to have an optical path length 200G, and the distance between the first electrode 207 and the second electrode 208 in the light-emitting device 203B is adjusted to have an optical path length 200B, as illustrated in FIG. 2B. Note that optical adjustment can be performed in such a manner that a conductive layer 210R is stacked over the first electrode 207 in the light-emitting device 203R and a conductive layer 210G is stacked over the first electrode 207 in the light-emitting device 203G as illustrated in FIG. 2B.

The color filters (206R, 206G, and 206B) are formed on the second substrate 205. Note that the color filter transmits visible light in a specific wavelength range and blocks visible light in a specific wavelength range. Thus, as illustrated in FIG. 2A, the color filter 206R that transmits only light in the red wavelength range is provided in a position overlapping with the light-emitting device 203R, whereby red light emission can be obtained from the light-emitting device 203R. The color filter 206G that transmits only light in the green wavelength range is provided in a position overlapping with the light-emitting device 203G, whereby green light emission can be obtained from the light-emitting device 203G. The color filter 206B that transmits only light in the blue wavelength range is provided in a position overlapping with the light-emitting device 203B, whereby blue light emission can be obtained from the light-emitting device 203B. The light-emitting device 203W can emit white light without a color filter. Note that a black layer (black matrix) 209 may be provided at an end portion of one type of color filter. The color filters (206R, 206G, and 206B) and the black layer 209 may be covered with an overcoat layer using a transparent material.

Figure 2C:
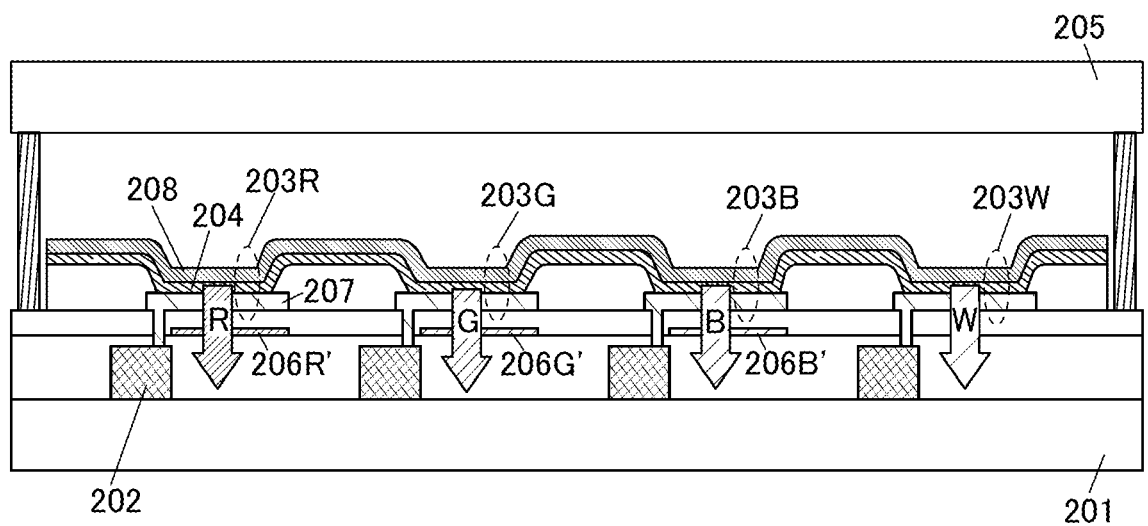

Although the light-emitting apparatus in FIG. 2A has a structure in which light is extracted from the second substrate 205 side (a top-emission structure), the light-emitting apparatus may have a structure in which light is extracted from the first substrate 201 side where the FETs 202 are formed (a bottom-emission structure) as illustrated in FIG. 2C. For a bottom-emission light-emitting apparatus, the first electrode 207 is formed so as to function as a transflective electrode and the second electrode 208 is formed so as to function as a reflective electrode. As the first substrate 201, a substrate having at least a light-transmitting property is used. Color filters (206R', 206G', and 206B') are provided closer to the first substrate 201 than the light-emitting devices (203R, 203G, and 203B) are, as illustrated in FIG. 2C.

FIG. 2A shows the case where the light-emitting devices are the red-light-emitting device, the green-light-emitting device, the blue-light-emitting device, and the white-light-emitting device; however, the light-emitting devices of embodiments of the present invention are not limited to the above structures, and a yellow-light-emitting device or an orange-light-emitting device may be included. Note that the description in the other embodiments can be referred to for materials that are used for the EL layers (a light-emitting layer, a hole-injection layer, a hole-transport layer, an electron-transport layer, an electron-injection layer, a charge-generation layer, and the like) to fabricate each of the light-emitting devices, and appropriate materials can be used. In that case, a color filter needs to be appropriately selected according to the emission color of the light-emitting device.

With the above structure, a light-emitting apparatus including light-emitting devices that exhibit a plurality of emission colors can be obtained.

Note that the structure described in this embodiment can be used in an appropriate combination with any of the structures described in the other embodiments.

Embodiment 4

In this embodiment, a light-emitting apparatus of one embodiment of the present invention will be described.

The use of the device structure of the light-emitting device of one embodiment of the present invention allows fabrication of an active-matrix light-emitting apparatus and a passive-matrix light-emitting apparatus. Note that an active-matrix light-emitting apparatus has a structure including a combination of a light-emitting device and a transistor (an FET). Thus, each of a passive-matrix light-emitting apparatus and an active-matrix light-emitting apparatus is included in one embodiment of the present invention. Note that any of the light-emitting devices described in the other embodiments can be used in the light-emitting apparatus described in this embodiment.

In this embodiment, an active-matrix light-emitting apparatus will be described with reference to FIG. 3.

Figure 3A:
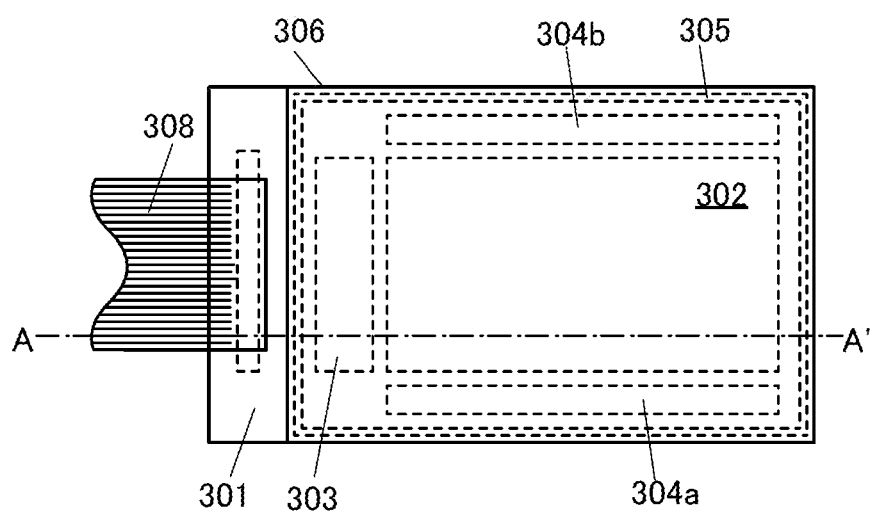
FIG. 3A and FIG. 3B are diagrams illustrating a light-emitting apparatus.
Figure 3B:
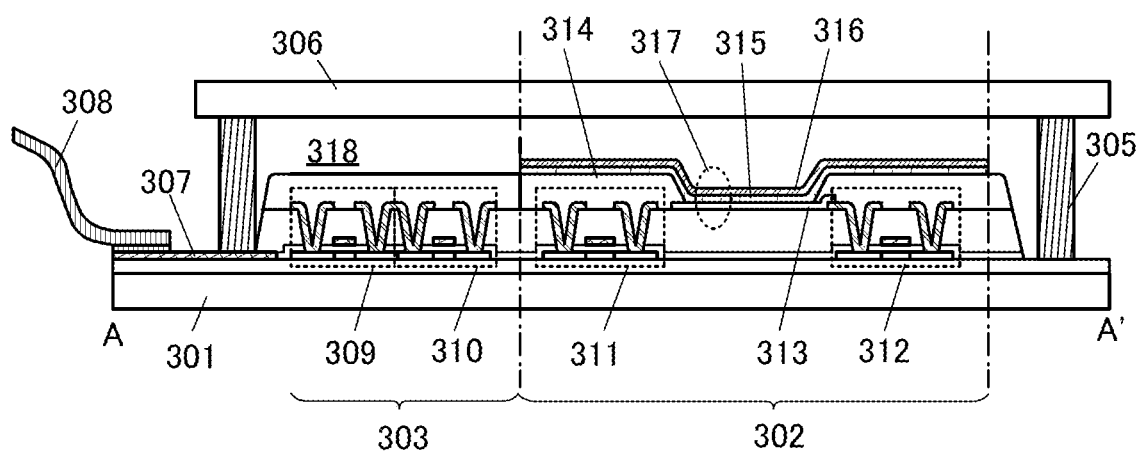

FIG. 3A is a top view showing a light-emitting apparatus, and FIG. 3B is a cross-sectional view taken along a chain line A-A' in FIG. 3A. The active-matrix light-emitting apparatus includes a pixel portion 302, a driver circuit portion (source line driver circuit) 303, and driver circuit portions (gate line driver circuits) (304a and 304b) that are provided over a first substrate 301. The pixel portion 302 and the driver circuit portions (303, 304a, and 304b) are sealed between the first substrate 301 and a second substrate 306 with a sealant 305.

A lead wiring 307 is provided over the first substrate 301. The lead wiring 307 is electrically connected to an FPC 308 that is an external input terminal. The FPC 308 transmits a signal (e.g., a video signal, a clock signal, a start signal, and a reset signal) and a potential from the outside to the driver circuit portions (303, 304a, and 304b). The FPC 308 may be provided with a printed wiring board (PWB). Note that the light-emitting apparatus provided with an FPC or a PWB is included in the category of a light-emitting apparatus.

Next, FIG. 3B illustrates a cross-sectional structure of the light-emitting apparatus.

The pixel portion 302 is made up of a plurality of pixels each including an FET (switching FET) 311, an FET (current control FET) 312, and a first electrode 313 electrically connected to the FET 312. Note that the number of FETs included in each pixel is not particularly limited and can be set appropriately as needed.

As FETs 309, 310, 311, and 312, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 309, 310, 311, and 312, and an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity is preferable, in which case deterioration of the transistor characteristics can be inhibited.

For the semiconductor, a Group 14 element, a compound semiconductor, an oxide semiconductor, an organic semiconductor, or the like can be used, for example. Typically, a semiconductor containing silicon, a semiconductor containing gallium arsenide, an oxide semiconductor containing indium, or the like can be used.

The driver circuit portion 303 includes the FET 309 and the FET 310. The FET 309 and the FET 310 may be formed with a circuit including transistors having the same conductivity type (either only n-channel transistors or only p-channel transistors) or a CMOS circuit including an n-channel transistor and a p-channel transistor. Furthermore, a driver circuit may be provided outside.

An end portion of the first electrode 313 is covered with an insulator 314. For the insulator 314, an organic compound such as a negative photosensitive resin or a positive photosensitive resin (an acrylic resin), or an inorganic compound such as silicon oxide, silicon oxynitride, or silicon nitride can be used. An upper end portion or a lower end portion of the insulator 314 preferably has a curved surface with curvature. In that case, favorable coverage with a film formed over the insulator 314 can be obtained.

An EL layer 315 and a second electrode 316 are stacked over the first electrode 313. The EL layer 315 includes a light-emitting layer, a hole-injection layer, a hole-transport layer, an electron-transport layer, an electron-injection layer, a charge-generation layer, and the like.

The structure and materials described in the other embodiments can be used for the structure of a light-emitting device 317 described in this embodiment. Although not shown here, the second electrode 316 is electrically connected to the FPC 308 that is an external input terminal.

Although the cross-sectional view in FIG. 3B shows only one light-emitting device 317, a plurality of light-emitting devices are arranged in a matrix in the pixel portion 302. Light-emitting devices from which light of three kinds of colors (R, G, and B) are obtained are selectively formed in the pixel portion 302, whereby a light-emitting apparatus capable of full-color display can be formed. In addition to the light-emitting devices from which light of three kinds of colors (R, G, and B) are obtained, for example, light-emitting devices from which light of white (W), yellow (Y), magenta (M), cyan (C), and the like are obtained may be formed. For example, when the light-emitting devices from which light of some of the above colors are obtained are added to the light-emitting devices from which light of three kinds of colors (R, G, and B) are obtained, effects such as an improvement in color purity and a reduction in power consumption can be obtained. Alternatively, a light-emitting apparatus that is capable of full-color display may be fabricated by a combination with color filters. As the kinds of color filters, red (R), green (G), blue (B), cyan (C), magenta (M), and yellow (Y) color filters and the like can be used.

When the second substrate 306 and the first substrate 301 are bonded to each other with the sealant 305, the FETs (309, 310, 311, and 312) and the light-emitting device 317 over the first substrate 301 are provided in a space 318 surrounded by the first substrate 301, the second substrate 306, and the sealant 305. Note that the space 318 may be filled with an inert gas (e.g., nitrogen or argon) or an organic substance (including the sealant 305).

An epoxy resin or glass frit can be used for the sealant 305. A material that transmits moisture and oxygen as little as possible is preferably used for the sealant 305. For the second substrate 306, a material that can be used for the first substrate 301 can be similarly used. Thus, any of the various substrates described in the other embodiments can be appropriately used. As the substrate, a glass substrate, a quartz substrate, or a plastic substrate made of FRP (Fiber-Reinforced Plastics), PVF (polyvinyl fluoride), polyester, an acrylic resin, or the like can be used. In the case where glass frit is used for the sealant, the first substrate 301 and the second substrate 306 are preferably glass substrates in terms of adhesion.

In the above manner, the active-matrix light-emitting apparatus can be obtained.

In the case where the active-matrix light-emitting apparatus is formed over a flexible substrate, the FETs and the light-emitting device may be directly formed over the flexible substrate; alternatively, the FETs and the light-emitting device may be formed over a substrate provided with a separation layer and then separated at the separation layer by application of heat, force, laser irradiation, or the like to be transferred to a flexible substrate. For the separation layer, a stack of inorganic films such as a tungsten film and a silicon oxide film, or an organic resin film of polyimide or the like can be used, for example. Examples of the flexible substrate include, in addition to a substrate where a transistor can be formed, a paper substrate, a cellophane substrate, an aramid film substrate, a polyimide film substrate, a cloth substrate (including a natural fiber (silk, cotton, and hemp), a synthetic fiber (nylon, polyurethane, and polyester), a regenerated fiber (acetate, cupro, rayon, and regenerated polyester), and the like), a leather substrate, and a rubber substrate. With the use of any of these substrates, high durability, high heat resistance, a reduction in weight, and a reduction in thickness can be achieved.

The light-emitting device included in the active-matrix light-emitting apparatus may be driven to emit light in a pulsed manner (using a frequency of kHz or MHz, for example) so that the light is used for display. The light-emitting device formed using any of the above organic compounds has excellent frequency characteristics; thus, the time for driving the light-emitting device can be shortened, and the power consumption can be reduced. Furthermore, a reduction in driving time leads to inhibition of heat generation, so that the degree of deterioration of the light-emitting device can be reduced.

Note that the structure described in this embodiment can be used in an appropriate combination with the structures described in the other embodiments.

Embodiment 5

In this embodiment, examples of a variety of electronic devices and an automobile completed using the light-emitting device of one embodiment of the present invention or a light-emitting apparatus including the light-emitting device of one embodiment of the present invention will be described. Note that the light-emitting apparatus can be used mainly in a display portion of the electronic device described in this embodiment.

Figure 4A:
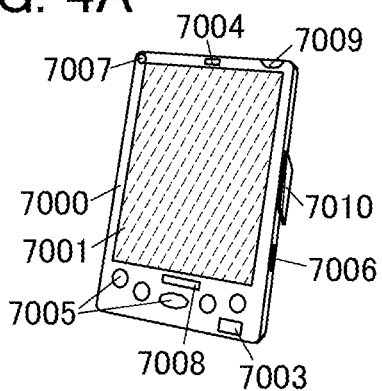
FIG. 4A, FIG. 4B, FIG. 4C, FIG. 4D, FIG. 4E, FIG. 4F, and FIG. 4G are diagrams illustrating electronic devices.
Figure 4B:
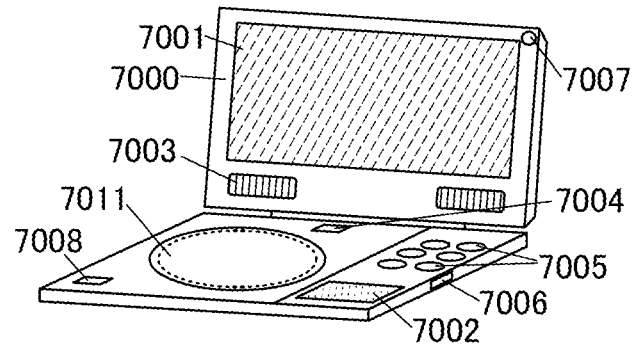
Figure 4C:
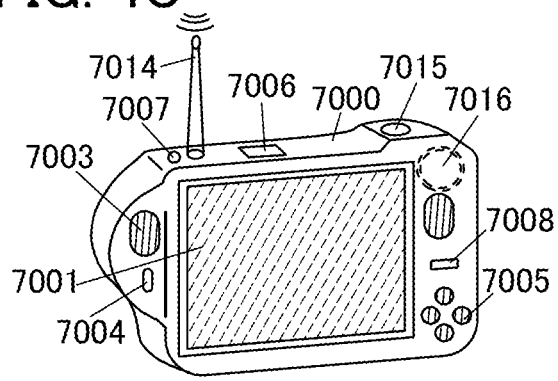

Electronic devices illustrated in FIG. 4A to FIG. 4C can include a housing 7000, a display portion 7001, a speaker 7003, an LED lamp 7004, operation keys 7005 (including a power switch or an operation switch), a connection terminal 7006, a sensor 7007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 7008, and the like.

FIG. 4A illustrates a mobile computer that can include a switch 7009, an infrared port 7010, and the like in addition to the above components.

FIG. 4B illustrates a portable image reproducing device (e.g., a DVD player) that is provided with a recording medium and can include a second display portion 7002, a recording medium reading portion 7011, and the like in addition to the above components.

FIG. 4C illustrates a digital camera that has a television reception function and can include an antenna 7014, a shutter button 7015, an image receiving portion 7016, and the like in addition to the above components.

Figure 4D:
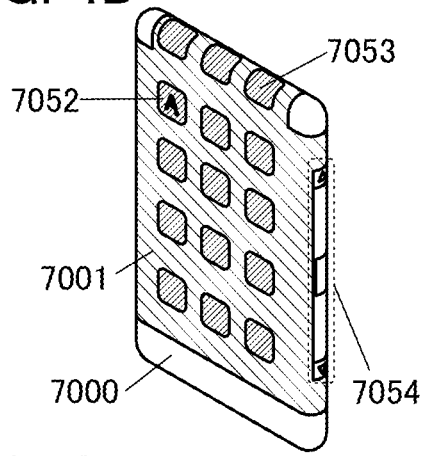

FIG. 4D illustrates a portable information terminal. The portable information terminal has a function of displaying information on three or more surfaces of the display portion 7001. Here, an example in which information 7052, information 7053, and information 7054 are displayed on different surfaces is shown. For example, the user can check the information 7053 displayed in a position that can be observed from above the portable information terminal, with the portable information terminal put in a breast pocket of his/her clothes. The user can see the display without taking out the portable information terminal from the pocket and decide whether to answer the call, for example.

Figure 4E:
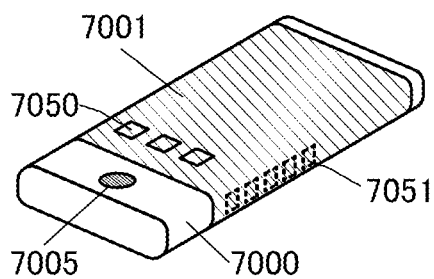

FIG. 4E illustrates a portable information terminal (e.g., a smartphone) and can include the display portion 7001, the operation key 7005, and the like in the housing 7000. Note that a speaker, a connection terminal, a sensor, or the like may be provided in the portable information terminal. The portable information terminal can display text and image information on its plurality of surfaces. Here, an example in which three icons 7050 are displayed is shown. Information 7051 indicated by dashed rectangles can be displayed on another surface of the display portion 7001. Examples of the information 7051 include notification of reception of an e-mail, SNS, or an incoming call, the title and sender of an e-mail, SNS, or the like, the date, the time, remaining battery, and the reception strength of an antenna. Alternatively, the icon 7050 or the like may be displayed in the position where the information 7051 is displayed.

Figure 4F:
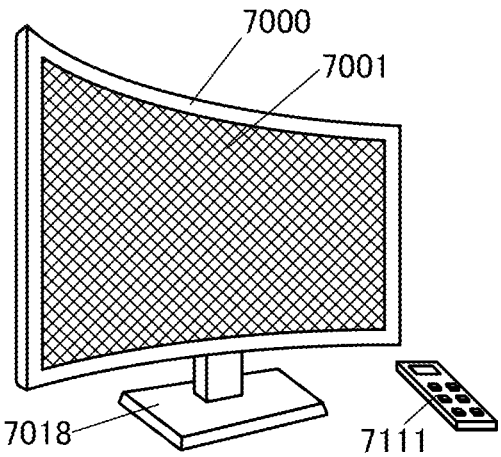

FIG. 4F illustrates a large-size television set (also referred to as a TV or a television receiver) that can include the housing 7000, the display portion 7001, and the like. Here, a structure in which the housing 7000 is supported by a stand 7018 is shown. The television set can be operated with a separate remote controller 7111 or the like. Note that the display portion 7001 may include a touch sensor, in which case the television set may be operated by touch on the display portion 7001 with a finger or the like. The remote controller 7111 may include a display portion for displaying information output from the remote controller 7111. With operation keys or a touch panel provided in the remote controller 7111, channels and volume can be controlled and images displayed on the display portion 7001 can be controlled.

The electronic devices shown in FIG. 4A to FIG. 4F can have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. The electronic device including an image receiving portion can have a function of taking a still image, a function of taking a moving image, a function of automatically or manually correcting a taken image, a function of storing a taken image in a recording medium (an external recording medium or a recording medium incorporated in the camera), a function of displaying a taken image on the display portion, and the like. Note that functions that the electronic devices shown in FIG. 4A to FIG. 4F can have are not limited to those, and the electronic devices can have a variety of functions.

Figure 4G:
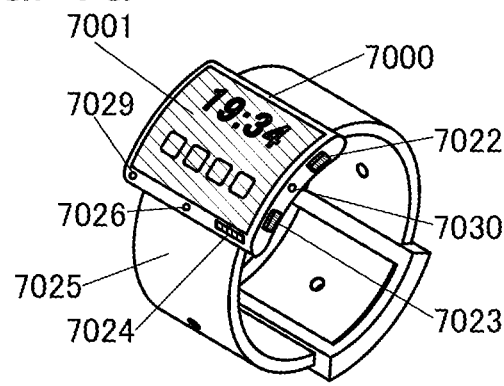

FIG. 4G illustrates a watch-type portable information terminal that can be used as a smart watch, for example. The watch-type portable information terminal includes the housing 7000, the display portion 7001, operation buttons 7022 and 7023, a connection terminal 7024, a band 7025, a microphone 7026, a sensor 7029, a speaker 7030, and the like. The display surface of the display portion 7001 is bent, and display can be performed along the bent display surface. Furthermore, the portable information terminal enables hands-free calling by mutually communicating with, for example, a headset capable of wireless communication. With the connection terminal 7024, the portable information terminal can perform mutual data transmission with another information terminal and be charged. Wireless power feeding can also be employed for the charging operation.

The display portion 7001 mounted in the housing 7000 also serving as a bezel includes a non-rectangular display region. The display portion 7001 can display an icon 7027 indicating time, another icon 7028, and the like. The display portion 7001 may be a touch panel (an input/output device) including a touch sensor (an input device).

Note that the smart watch shown in FIG. 4G can have a variety of functions. For example, it can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

Moreover, a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like can be included inside the housing 7000.

Note that the light-emitting apparatus of one embodiment of the present invention can be used in the display portions of the electronic devices described in this embodiment, enabling the electronic devices to have a long lifetime.

Figure 5A:
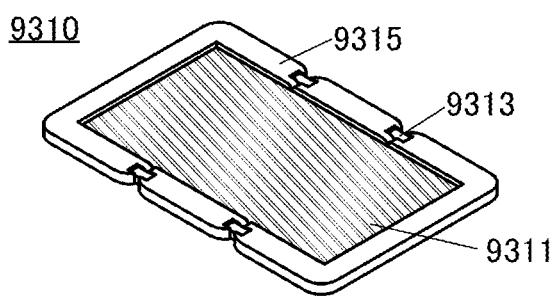
FIG. 5A, FIG. 5B, and FIG. 5C are diagrams illustrating an electronic device.
Figure 5B:
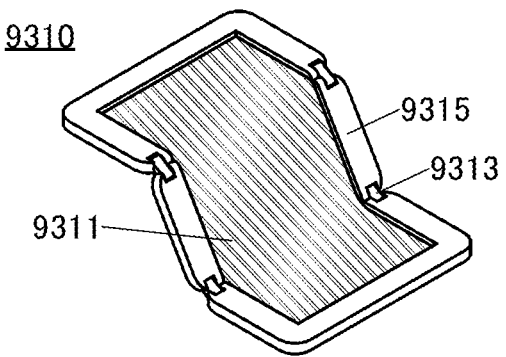
Figure 5C:
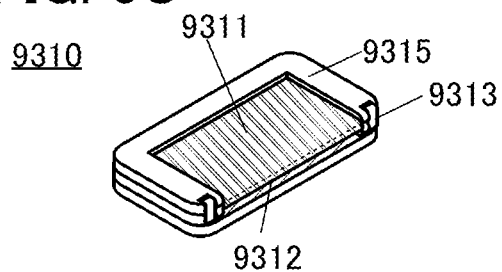

Another electronic device including the light-emitting apparatus is a foldable portable information terminal shown in FIG. 5A to FIG. 5C. FIG. 5A illustrates a portable information terminal 9310 that is opened. FIG. 5B illustrates the portable information terminal 9310 in a state in the middle of change from one of an opened state and a folded state to the other. FIG. 5C illustrates the portable information terminal 9310 that is folded. The portable information terminal 9310 is excellent in portability when folded, and is excellent in display browsability when opened because of a seamless large display region.

A display portion 9311 is supported by three housings 9315 joined together by hinges 9313. Note that the display portion 9311 may be a touch panel (an input/output device) including a touch sensor (an input device). By bending the display portion 9311 at a portion between two housings 9315 with the use of the hinges 9313, the portable information terminal 9310 can be reversibly changed in shape from an opened state to a folded state. The light-emitting apparatus of one embodiment of the present invention can be used for the display portion 9311. An electronic device having a long lifetime can be provided. A display region 9312 in the display portion 9311 is a display region that is positioned at a side surface of the portable information terminal 9310 that is folded. On the display region 9312, information icons, file shortcuts of frequently used applications or programs, and the like can be displayed, and confirmation of information and start of an application can be smoothly performed.

Figure 6A:
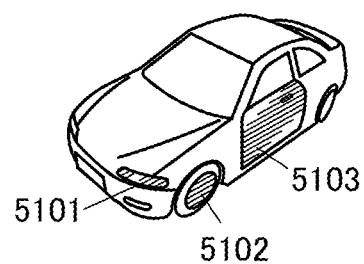
FIG. 6A and FIG. 6B are diagrams illustrating an automobile.
Figure 6B:
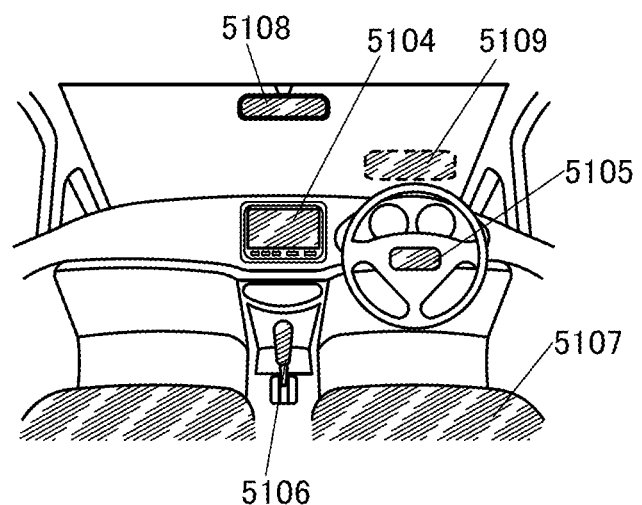

FIG. 6A and FIG. 6B show an automobile including the light-emitting apparatus. In other words, the light-emitting apparatus can be integrated into an automobile. Specifically, the light-emitting apparatus can be applied to lights 5101 (including lights of the rear part of the car), a wheel 5102, a part or the whole of a door 5103, or the like on the outer side of the automobile illustrated in FIG. 6A. The light-emitting apparatus can also be applied to a display portion 5104, a steering wheel 5105, a shifter 5106, a seat 5107, an inner rearview mirror 5108, a windshield 5109, or the like on the inner side of the automobile illustrated in FIG. 6B. The light-emitting apparatus may be used for part of any of the other glass windows.

In the above manner, the electronic devices and the automobile each including the light-emitting apparatus of one embodiment of the present invention can be obtained. In that case, a long-lifetime electronic device can be obtained. In addition, the light-emitting apparatus can be used for electronic devices and automobiles in a variety of fields without being limited to those described in this embodiment.

Note that the structure described in this embodiment can be used in an appropriate combination with any of the structures described in the other embodiments.

Embodiment 6

In this embodiment, a structure of a lighting device fabricated using the light-emitting apparatus of one embodiment of the present invention or the light-emitting device which is part of the light-emitting apparatus will be described with reference to FIG. 7.

Figure 7A:
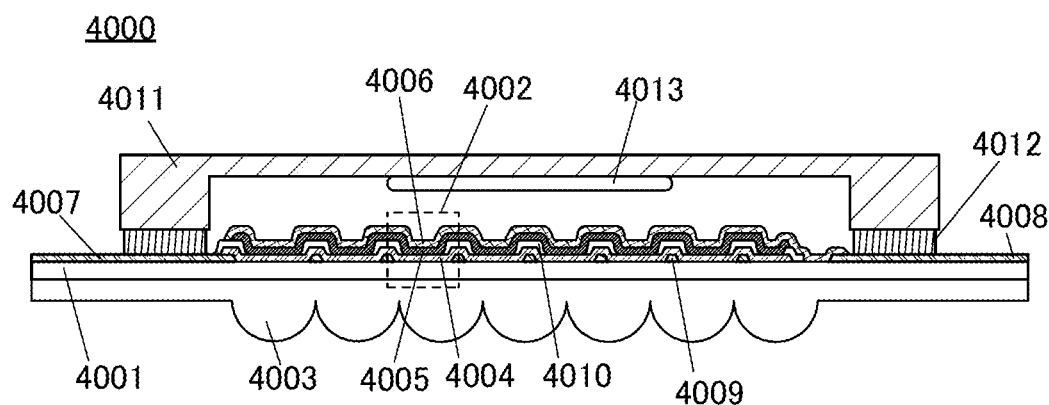
FIG. 7A and FIG. 7B are diagrams illustrating lighting devices.
Figure 7B:
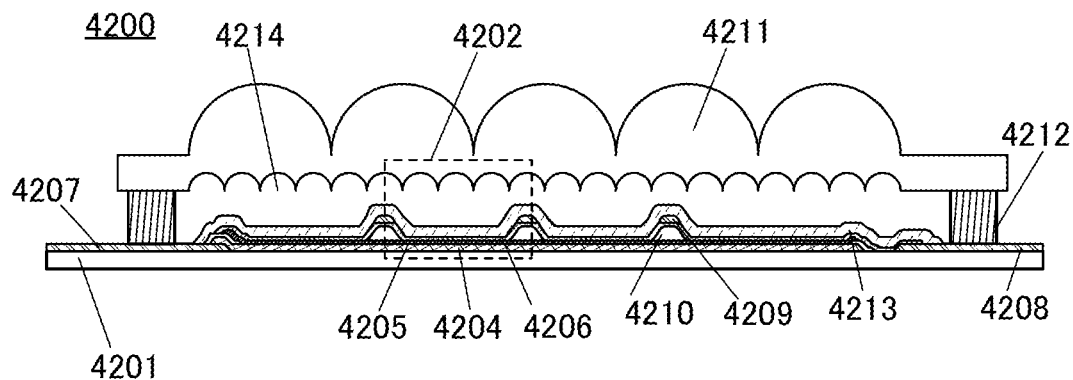

FIG. 7A and FIG. 7B show examples of cross-sectional views of lighting devices. FIG. 7A illustrates a bottom-emission lighting device in which light is extracted from the substrate side, and FIG. 7B illustrates a top-emission lighting device in which light is extracted from the sealing substrate side.

A lighting device 4000 shown in FIG. 7A includes a light-emitting device 4002 over a substrate 4001. In addition, the lighting device 4000 includes a substrate 4003 with unevenness on the outside of the substrate 4001. The light-emitting device 4002 includes a first electrode 4004, an EL layer 4005, and a second electrode 4006.

The first electrode 4004 is electrically connected to an electrode 4007, and the second electrode 4006 is electrically connected to an electrode 4008. In addition, an auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting device 4002. Since the substrate 4003 has the unevenness shown in FIG. 7A, the extraction efficiency of light generated in the light-emitting device 4002 can be increased.

A lighting device 4200 shown in FIG. 7B includes a light-emitting device 4202 over a substrate 4201. The light-emitting device 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. In addition, an insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting device 4202. Since the sealing substrate 4211 has the unevenness shown in FIG. 7B, the extraction efficiency of light generated in the light-emitting device 4202 can be increased.

Application examples of such lighting devices include a ceiling light for indoor lighting. Examples of the ceiling light include a ceiling direct mount light and a ceiling embedded light. Such a lighting device is fabricated using the light-emitting apparatus and a housing or a cover in combination.

As another example, such lighting devices can be used for a foot light that illuminates a floor so that safety on the floor can be improved. The foot light can be effectively used in a bedroom, on a staircase, or on a passage, for example. In such a case, the size and shape of the foot light can be changed depending on the area or structure of a room. The foot light can also be a stationary lighting device fabricated using the light-emitting apparatus and a support base in combination.

Such lighting devices can also be used for a sheet-like lighting device (sheet-like lighting). The sheet-like lighting, which is attached to a wall when used, is space-saving and thus can be used for a wide variety of uses. Furthermore, the area of the sheet-like lighting can be easily increased. The sheet-like lighting can also be used on a wall or a housing having a curved surface.

Besides the above examples, the light-emitting apparatus of one embodiment of the present invention or the light-emitting device which is a part of the light-emitting apparatus can be used as part of furniture in a room, whereby a lighting device that has a function of the furniture can be obtained.

As described above, a variety of lighting devices that include the light-emitting apparatus can be obtained. Note that these lighting devices are also embodiments of the present invention.

The structures described in this embodiment can be used in an appropriate combination with the structures described in the other embodiments.

EXAMPLE 1

Ynthesis Example 1

This example will describe a method for synthesizing bis(13,14-dicyanobenzo[a]naphtho[2,1-c]phenazine-10-yl-$\kappa C^{10}, \kappa N^{11}$)(2,2,6,6-tetramethyl-3,5-heptanedionato-$\kappa^2 O$, O')iridium(III) (abbreviation: [Ir(bnphz-dCN)$_2$(dpm)]) that is an organometallic complex of one embodiment of the present invention and is represented by Structural Formula (100) in Embodiment 1. The structure of [Ir(bnphz-dCN)$_2$(dpm)] is shown below.

[Chemical Formula 30]

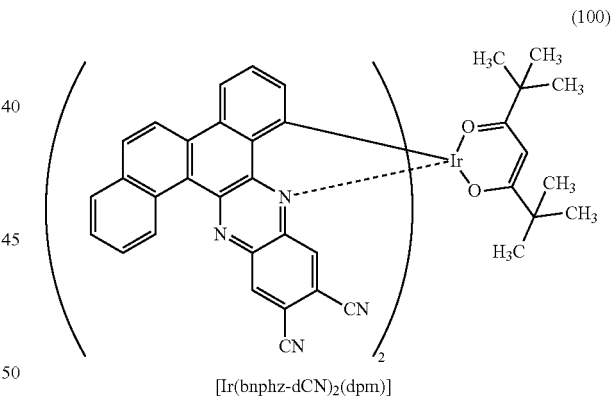

[Ir(bnphz-dCN)$_2$(dpm)]

Step 1: Synthesis of benzo[a]naphtho[2,1-c] phenazine-13,14-dicarbonitrile (abbreviation: Hdbnphz)

First, 1.0 g (4.0 mmol) of chrysene-5,6-dione, 0.69 g (4.4 mmol) of 4,5-diaminophthalonitrile, and 20 mL of ethanol were put into a reaction container, and heated and refluxed for 63 hours. After a predetermined time elapsed, the obtained mixture was subjected to suction filtration, and the solid was washed with ethanol. This solid was washed with heating toluene to give a target substance (1.1 g, yield: 70%). The synthesis scheme of Step 1 is shown in Formula (a-1) below.

[Chemical Formula 31]

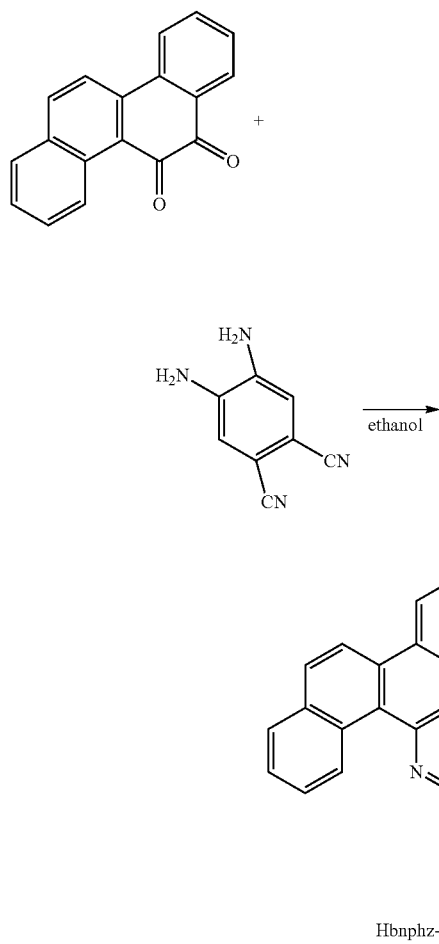

(a-1)

Step 2: Synthesis of [Ir(bnphz-dCN)₂(dpm)]

Next, 1.0 g (2.6 mmol) of Hbnphz-dCN, which is the ligand obtained in Step 2 above, 0.37 g (1.3 mmol) of iridium chloride hydrate, and 26 mL of dimethylformamide (DMF) were added to a reaction container, the air in the container was replaced with nitrogen, and the mixture was heated and stirred at 160° C. for 7 hours. After a predetermined time elapsed, 0.70 g (6.6 mmol) of sodium carbonate and 0.70 g (3.8 mmol) of dipivaloylmethane were added, and the mixture was heated and stirred at 140° C. for 8 hours. The obtained reaction mixture was subjected to suction filtration, followed by washing with water and ethanol. The obtained solid was washed with dichloromethane, and the resulting filtrate was concentrated to give a solid. This solid was purified by flash column chromatography. As the developing solvent, a mixed solvent of dichloromethane:toluene=3:7 was used, and the flash column chromatography was performed while the amount of dichloromethane was gradually increased to increase the polarity. A solid obtained by concentration of the obtained fraction was washed with hexane to give a target substance (5 mg of a black solid, yield: 0.4%).

The synthesis scheme of Step 2 is shown in Formula (a-2) below.

[Chemical Formula 32]

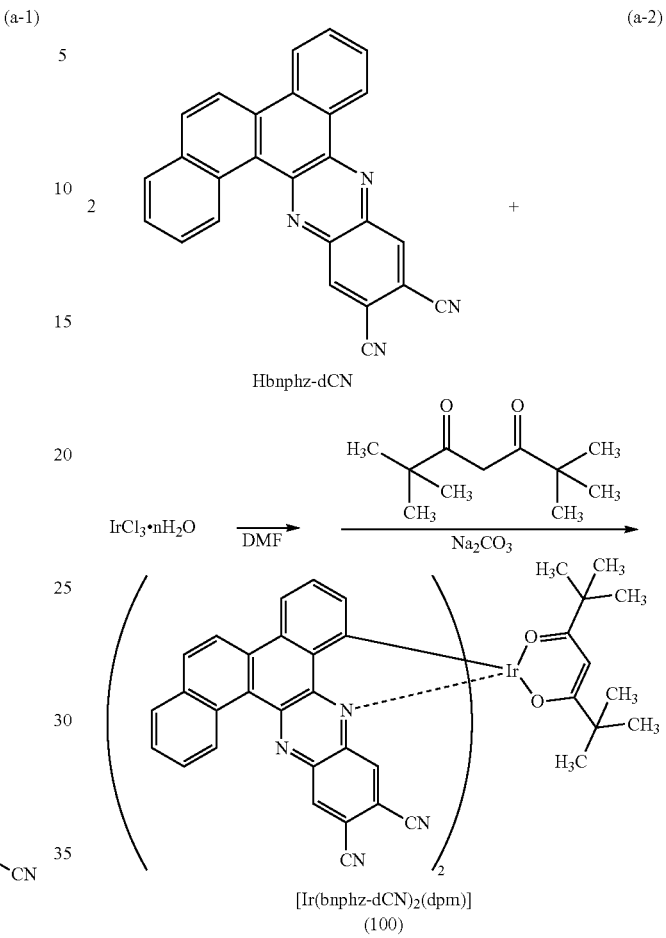

(a-2)

Figure 8:
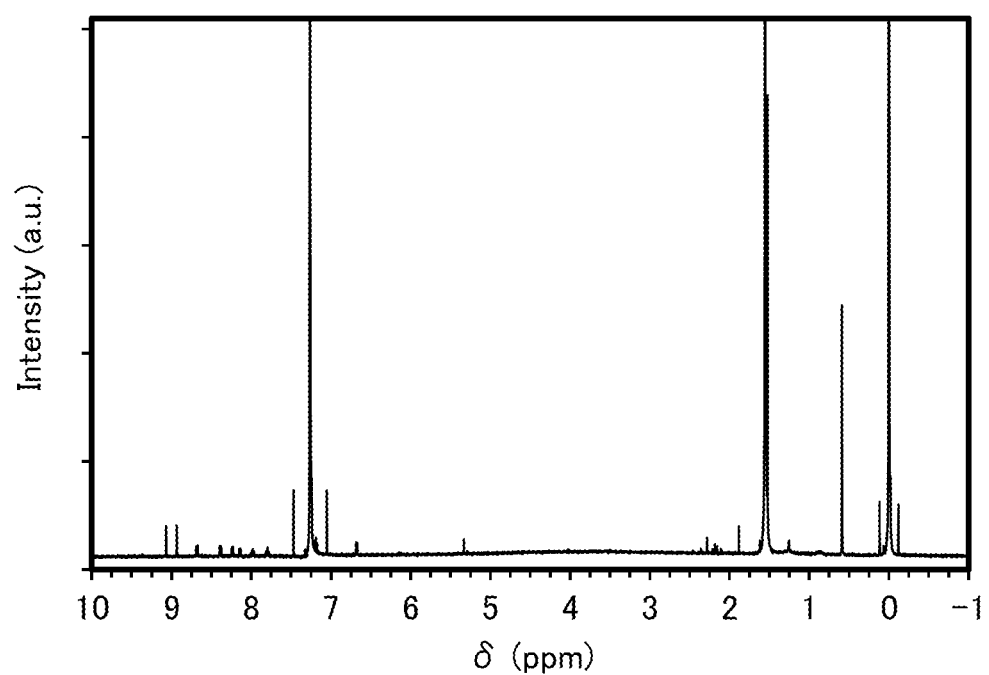
FIG. 8 is a $^1$H-NMR chart of an organometallic complex represented by Structural Formula (100).

Protons ($^1$H) of the black solid obtained in Step 2 above were measured by nuclear magnetic resonance spectroscopy (NMR). The obtained values are shown below. FIG. 8 shows a $^1$H-NMR chart. These reveal that the organometallic complex [Ir(bnphz-dCN)₂(dpm)], which is one embodiment of the present invention represented by Structural Formula (100) above, was obtained in this synthesis example.

$^1$H-NMR δ (CDCl₃): 0.56 (s, 18H), 5.33 (s, 1H), 6.68 (d, 2H), 7.19 (t, 2H), 7.78 (t, 2H), 7.97 (t, 2H), 8.13 (d, 2H), 8.23 (d, 2H), 8.38 (d, 2H), 8.67 (d, 2H), 8.93 (s, 2H), 9.06 (s, 2H), 10.87 (d, 2H).

Next, an ultraviolet-visible absorption spectrum (hereinafter, simply referred to as an "absorption spectrum") and an emission spectrum of a dichloromethane solution of [Ir(bnphz-dCN)₂(dpm)] were measured.

The measurement of the absorption spectrum was conducted at room temperature, for which an ultraviolet-visible spectrophotometer (V550 type, manufactured by JASCO Corporation) was used and the dichloromethane solution (0.010 mmol/L) was put into a quartz cell. The measurement of the emission spectrum was conducted at room temperature, for which an absolute PL quantum yield measurement system (C11347-01, manufactured by Hamamatsu Photonics K.K.) was used and the degassed dichloromethane solution (0.010 mmol/L) was put into a quartz cell.

Figure 9:
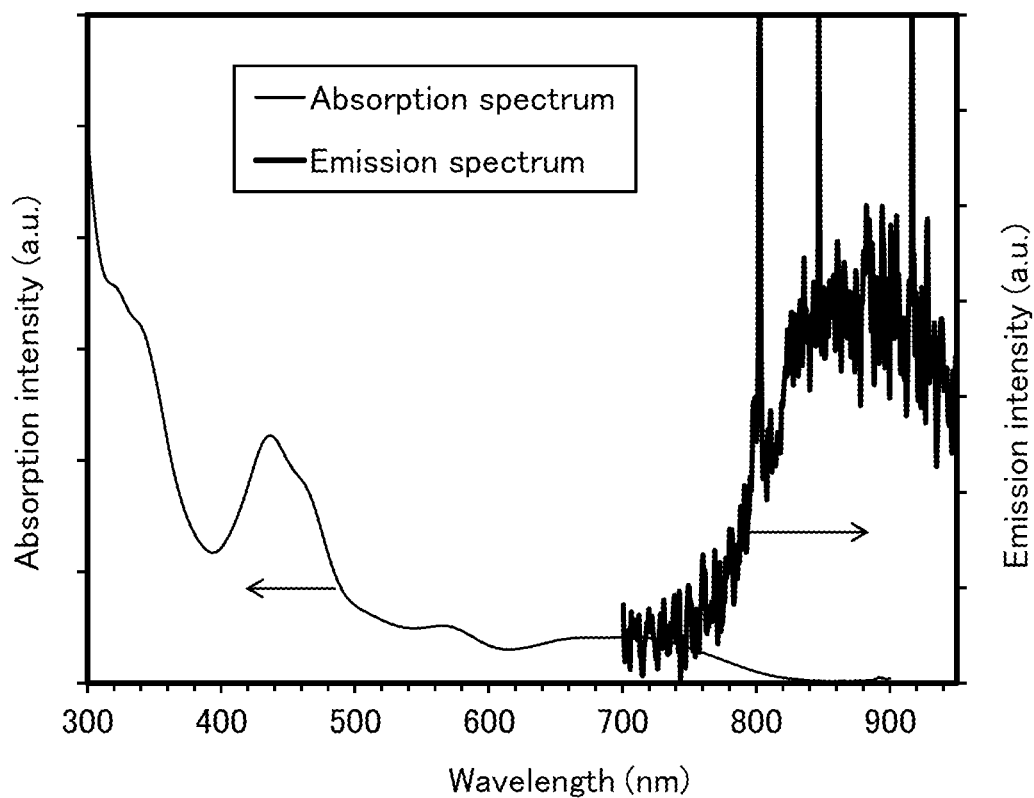
FIG. 9 shows an ultraviolet-visible absorption spectrum and an emission spectrum of the organometallic complex represented by Structural Formula (100) in solution.

FIG. 9 shows measurement results of the obtained absorption spectrum and emission spectrum. The horizontal axis represents wavelength, and the vertical axes represent absorption intensity and emission intensity. The absorption spectrum shown in FIG. 9 is a result obtained by subtraction of a measured absorption spectrum of only dichloromethane in a quartz cell from the measured absorption spectrum of the dichloromethane solution in a quartz cell.

As shown in FIG. 9, emission of near-infrared light having an emission peak at 882 nm was observed from the dichloromethane solution of [Ir(bnphz-dCN)$_2$(dpm)].

EXAMPLE 2

Synthesis Example 2

This example will describe a method for synthesizing bis{4,6-dimethyl-[5,7-bis(trifluoromethyl)-3-(3,5-dimethylphenyl)-2-quinoxalinyl-κN$^1$]phenyl-κC}(2,4-pentanedionato-κ$^2$O,O')iridium(III) (abbreviation: [Ir(dmdpq-dCF$_3$)$_2$(acac)]) that is an organometallic complex of one embodiment of the present invention and is represented by Structural Formula (101) in Embodiment 1. The structure of [Ir(dmdpq-dCF$_3$)$_2$(acac)] is shown below.

[Chemical Formula 33]

(101)

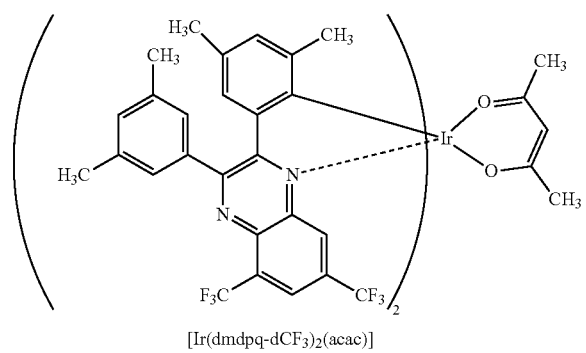

[Ir(dmdpq-dCF3)2(acac)]

Step 1: Synthesis of 5,7-bis(trifluoromethyl)-2,3-bis (3,5-dimethylphenyl)quinoxaline (Abbreviation: Hdmdpq-dCF$_3$)

First, 4.1 g (15 mmol) of 3,3',5,5'-tetramethylbenzyl, 4.1 g (17 mmol) of 3,5-bis(trifluoromethyl)-1,2-phenylenediamine, and 80 mL of ethanol were put into a reaction container, and heated and refluxed for 23 hours. Then, 0.098 g (1.6 mmol) of an acetic acid was added, and the mixture was heated and refluxed for 18 hours. After a predetermined time elapsed, the obtained mixture was subjected to suction filtration, and the solid was washed with ethanol to give a target substance (6.8 g of a pale yellow solid, yield: 93%). The synthesis scheme of Step 1 is shown in Formula (b-1) below.

[Chemical Formula 34]

(b-1)

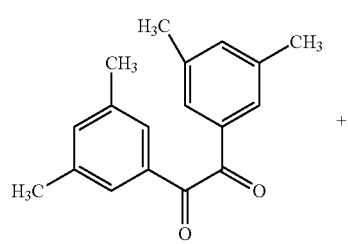

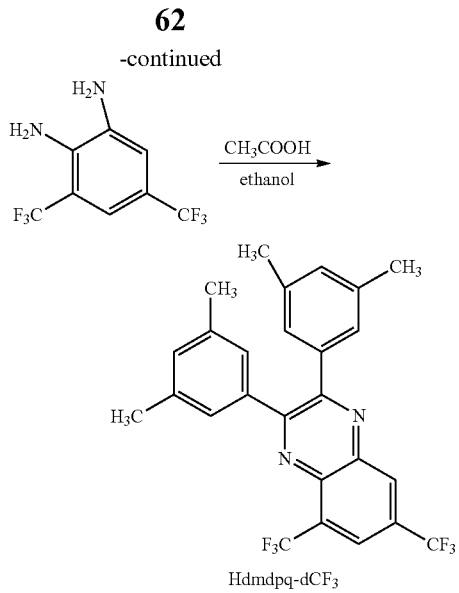

Hdmdpq-dCF$_3$

Step 2: Synthesis of [Ir(dmdpq-dCF$_3$)$_2$(acac)]

Next, 2.0 g (4.2 mmol) of the ligand Hdmdpq-dCF$_3$, which was obtained in Step 2 above, and 0.42 g (0.84 mmol) of tris(acetylacetonato)iridium(III) were put into a reaction container, the air in the container was replaced with argon, and then the mixture was heated and stirred at 250° C. for 44 hours. After a predetermined time elapsed, the reaction product was dissolved in dichloromethane and adsorbed on silica gel, followed by purification by silica gel column chromatography. A developing solvent of toluene:hexane=3:1 was used. The obtained fraction was concentrated to give a solid. This solid was purified by a mixed solvent of dichloromethane and methanol to give a target substance (174 mg of a black solid, yield: 17%). The synthesis scheme of Step 2 is shown in Formula (b-2) below.

[Chemical Formula 35]

(b-2)

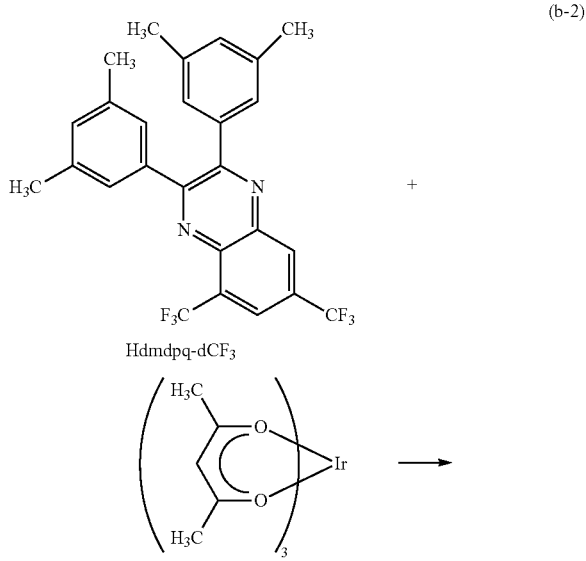

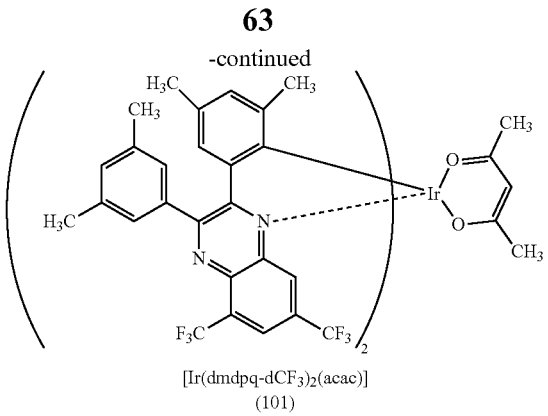

[Ir(dmdpq-dCF₃)₂(acac)]
(101)

Figure 10:
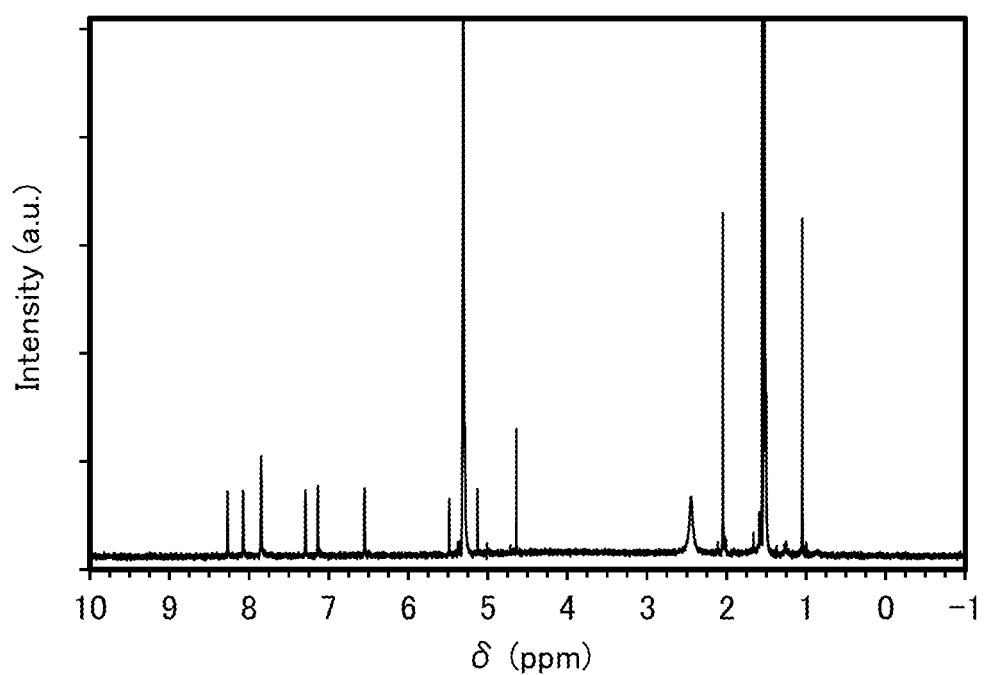
FIG. 10 is a $^1$H-NMR chart of an organometallic complex represented by Structural Formula (101).

Protons (¹H) of the black solid obtained in Step 2 above were measured by nuclear magnetic resonance spectroscopy (NMR). The obtained values are shown below. FIG. 10 shows a ¹H-NMR chart. These reveal that the organometallic complex [Ir(dmdpq-dCF₃)₂(acac)], which is one embodiment of the present invention represented by Structural Formula (101) above, was obtained in this synthesis example.

¹H-NMR δ (CD₂Cl₂): 1.05 (s, 6H), 1.56 (s, 6H), 2.05 (s, 6H), 2.45 (br, 12H), 4.64 (s, 1H), 6.55 (s, 2H), 7.13 (s, 2H), 7.29 (s, 2H), 7.85 (s, 4H), 8.07 (s, 2H), 8.27 (s, 2H).

Next, an ultraviolet-visible absorption spectrum (hereinafter simply referred to as an "absorption spectrum") and an emission spectrum of a dichloromethane solution of [Ir(dmdpq-dCF₃)₂(acac)] were measured.

The measurement of the absorption spectrum was conducted at room temperature, for which an ultraviolet-visible spectrophotometer (V550 type, manufactured by JASCO Corporation) was used and the dichloromethane solution (0.010 mmol/L) was put into a quartz cell. The measurement of the emission spectrum was conducted at room temperature, for which a fluorescence spectrophotometer (FS920, manufactured by Hamamatsu Photonics K.K.) was used and the degassed dichloromethane solution (0.010 mmol/L) was put into a quartz cell.

Figure 11:
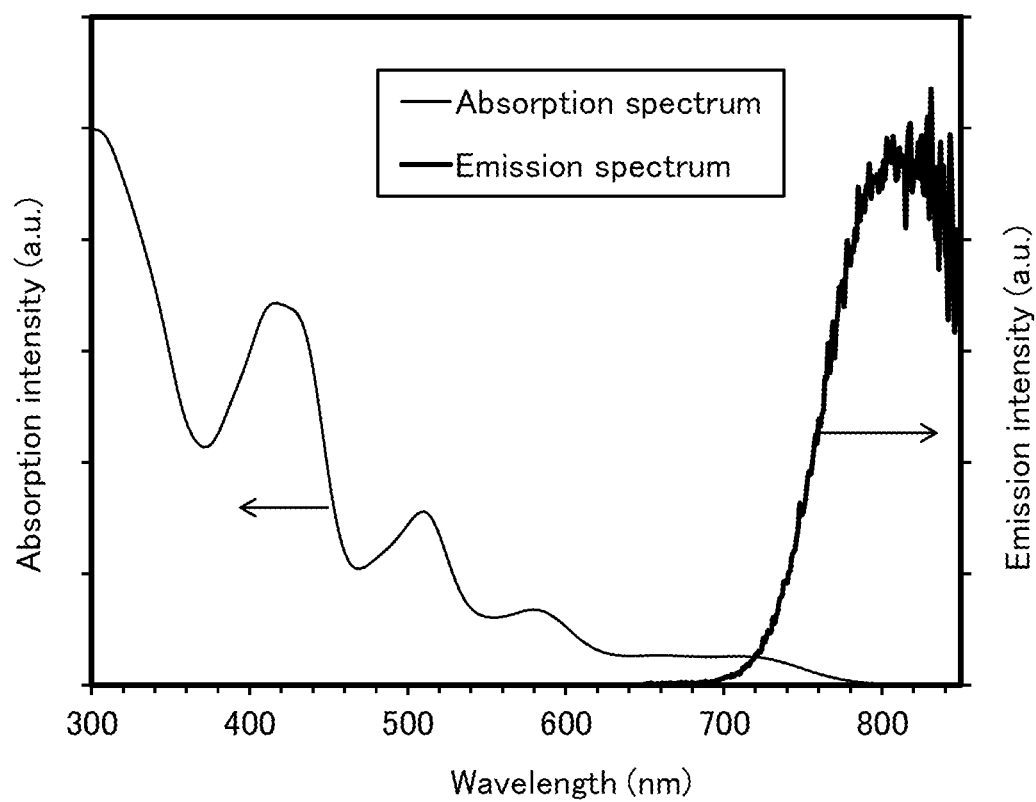
FIG. 11 shows an ultraviolet-visible absorption spectrum and an emission spectrum of the organometallic complex represented by Structural Formula (101) in solution.

FIG. 11 shows measurement results of the obtained absorption spectrum and emission spectrum. The horizontal axis represents wavelength, and the vertical axes represent absorption intensity and emission intensity. The absorption spectrum shown in FIG. 11 is a result obtained by subtraction of a measured absorption spectrum of only dichloromethane in a quartz cell from the measured absorption spectrum of the dichloromethane solution in a quartz cell.

As shown in FIG. 11, emission of near-infrared light having an emission peak at 807 nm was observed from the dichloromethane solution of [Ir(dmdpq-dCF₃)₂(acac)].

Next, [Ir(dmdpq-dCF₃)₂(acac)] was subjected to cyclic voltammetry (CV) measurement. For the CV measurement, an electrochemical analyzer (model number: ALS model 600A or 600C, manufactured by BAS Inc.) was used.

A solution used for the CV measurement was prepared in such a manner that dehydrated dimethylformamide (DMF) (produced by Sigma-Aldrich Inc., 99.8%, Catalog No. 227056-12) was used as a solvent; tetra-n-butylammonium perchlorate (electrochemical grade, Wako Pure Chemical Industries, Ltd., manufacturer's code: 043999, CAS. NO: 1923-70-2), which was a supporting electrolyte, was dissolved in the solvent so that the concentration thereof was 100 mmol/L; and then the measurement target was dissolved in the solution so that the concentration thereof was 2 mmol/L. Then, the solution was put into an electrochemical cell, electrodes were set, and after that, degasification by argon bubbling was performed for approximately 30 minutes. As for the electrodes used, a platinum electrode (PTE platinum electrode, manufactured by BAS Inc.) was used as a working electrode, another platinum electrode (Pt counter electrode, manufactured by BAS Inc.) was used as an auxiliary electrode, and a reference electrode for non-aqueous solvent (RE-7 non aqueous reference electrode (Ag/Ag+), manufactured by BAS Inc.) was used as a reference electrode. The measurement was performed at room temperature (20 to 25° C.), and the scan rate in the measurement was standardized at 0.1 V/sec. Note that the potential energy of the reference electrode with respect to the vacuum level was assumed to be −4.94 eV in this example.

The LUMO level (reduction potential) of [Ir(dmdpq-dCF₃)₂(acac)] was obtained from the CV measurement results. From an oxidation peak potential (from the reduction state to the neutral state) Epc [V] and a reduction peak potential (from the neutral state to the reduction state) Epa [V], a half wave potential (a potential intermediate between Epa and Epc) was calculated as (Epa+Epc)/2 [V] (=−1.17 eV). Then, this half wave potential (−1.17) was subtracted from the potential energy of the reference electrode with respect to the vacuum level (−4.94 eV), thereby obtaining a LUMO level (reduction potential) of [Ir(dmdpq-dCF₃)₂(acac)] of −3.77 eV. This value is considerably low because the LUMO levels of organometallic complexes that are general phosphorescent materials are approximately −3 eV to −2 eV.

Next, the LUMO level of bis{4,6-dimethyl-2-[4-(3,5-dimethylphenyl)-2-quinoxalinyl-κN]phenyl-κC}(2,2′,6,6′-tetramethyl-3,5-heptanedionato-κ2O,O′)iridium(III) (abbreviation: [Ir(dmdpq)₂(dpm)]) that is an organometallic complex represented by Structural Formula (200) below was measured in a similar manner.

[Chemical Formula 36]

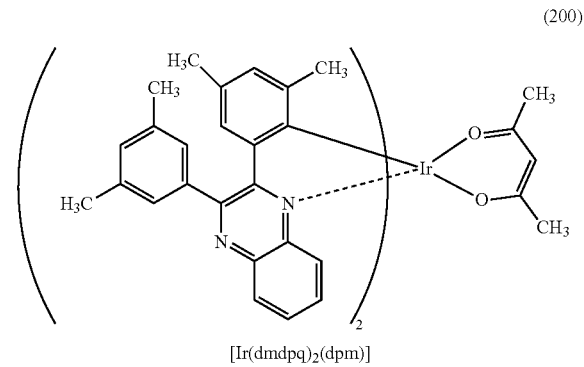

[Ir(dmdpq)₂(dpm)]
(200)

Note that the ligand of [Ir(dmdpq-dCF₃)₂(acac)] synthesized in this example has a structure in which the benzene ring of the quinoxaline skeleton is substituted with an electron-withdrawing group (specifically a trifluoromethyl group), whereas [Ir(dmdpq)₂(dpm)] has a structure without substitution of an electron-withdrawing group. The CV measurement was performed by the same method as the measurement of [Ir(dmdpq-dCF₃)₂(acac)].

As a result, the LUMO level of [Ir(dmdpq)₂(dpm)] was estimated to be −3.22 eV. Thus, the difference in LUMO level between [Ir(dmdpq)₂(dpm)] and [Ir(dmdpq-dCF₃)₂(acac)] is 0.55 eV. That is, it was found that including the electron-withdrawing group leads to a significantly low LUMO level.

EXAMPLE 3

Figure 13:
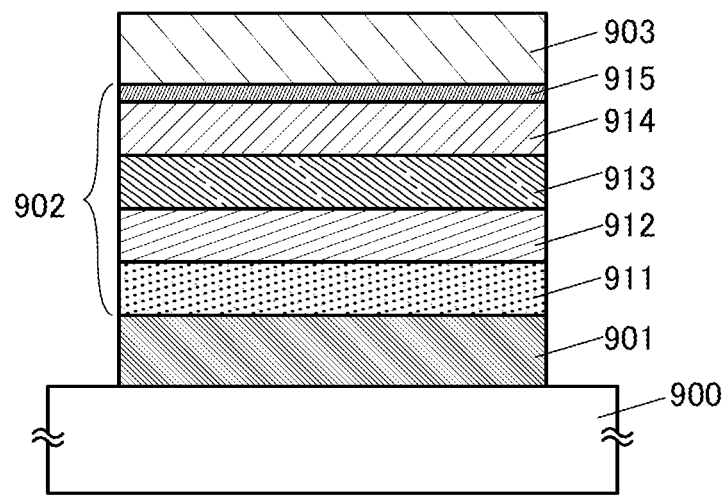
FIG. 13 is a diagram illustrating a light-emitting device.
Figure 14:
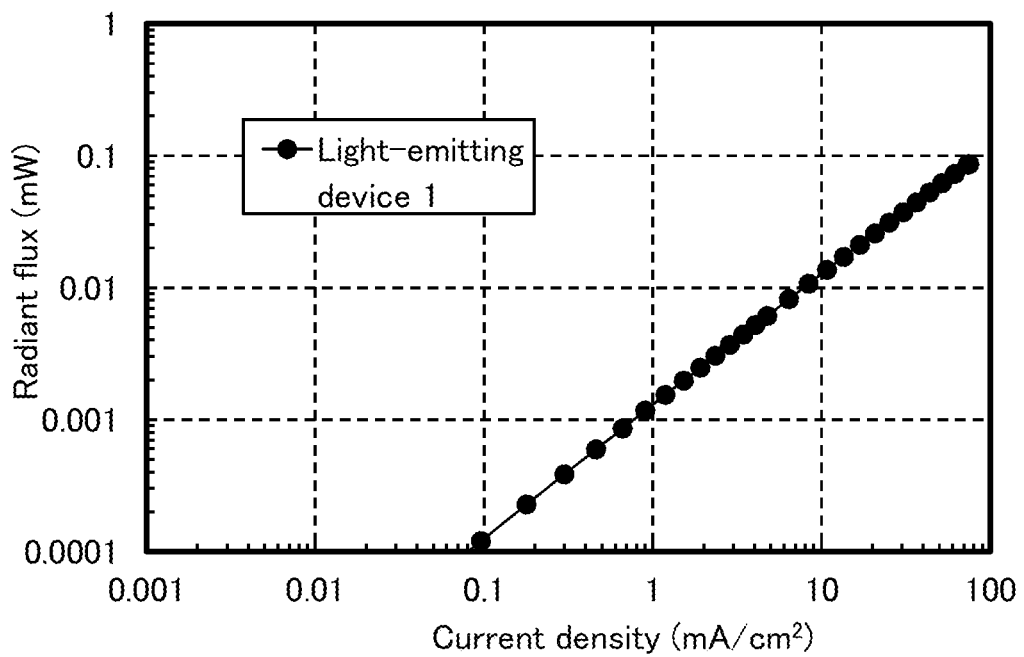
FIG. 14 is a diagram showing the current density-radiant flux characteristics of a light-emitting device 1.
Figure 15:
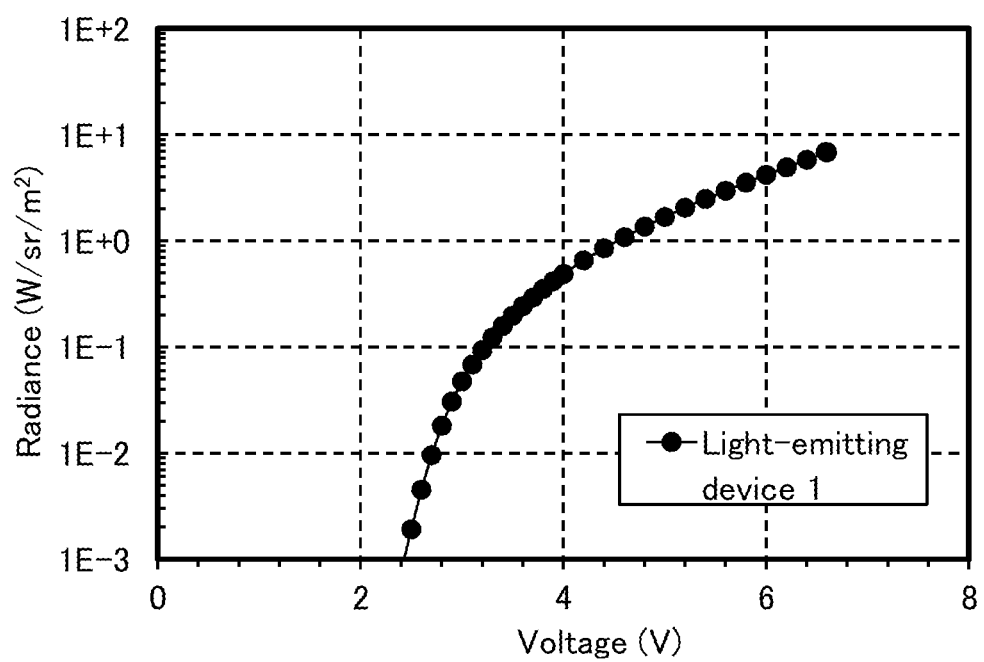
FIG. 15 is a diagram showing the voltage-radiance characteristics of the light-emitting device 1.
Figure 16:
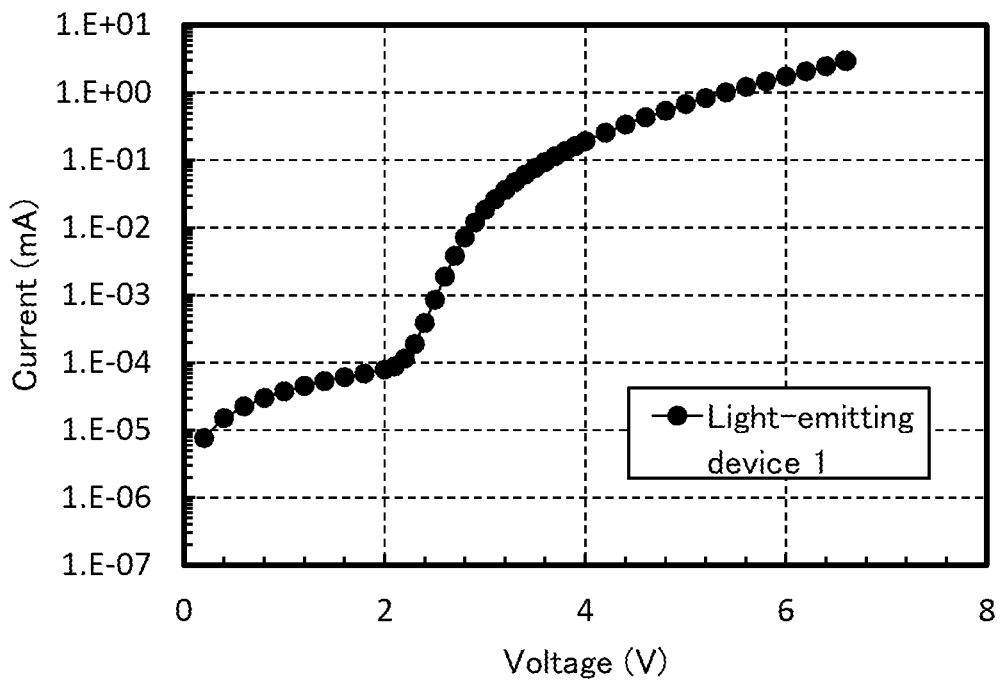
FIG. 16 is a diagram showing the voltage-current characteristics of the light-emitting device 1.
Figure 17:
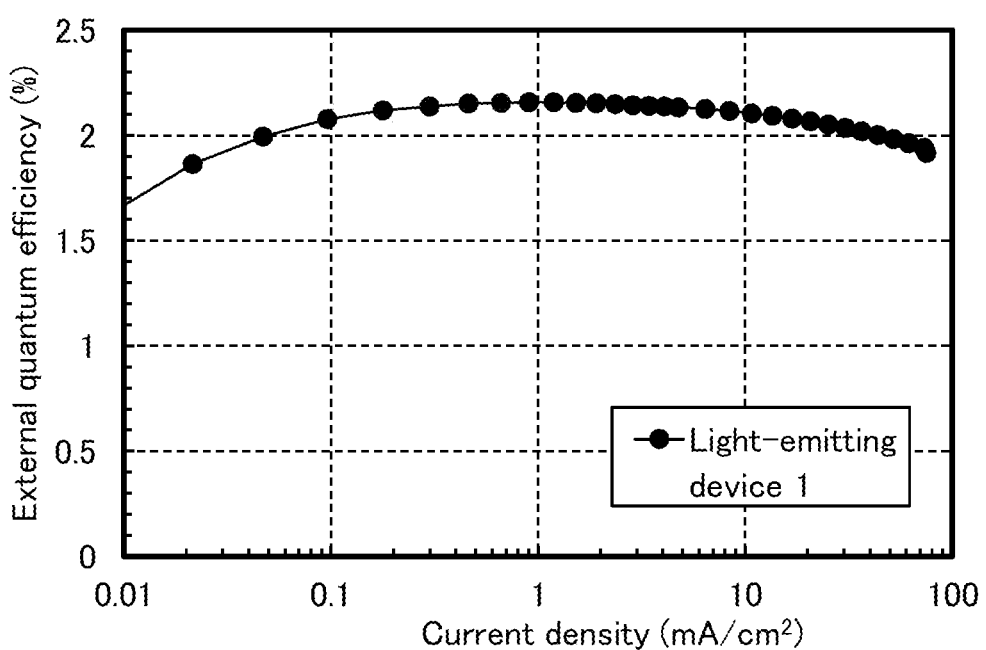
FIG. 17 is a diagram showing the current density-external quantum efficiency characteristics of the light-emitting device 1.
Figure 18:
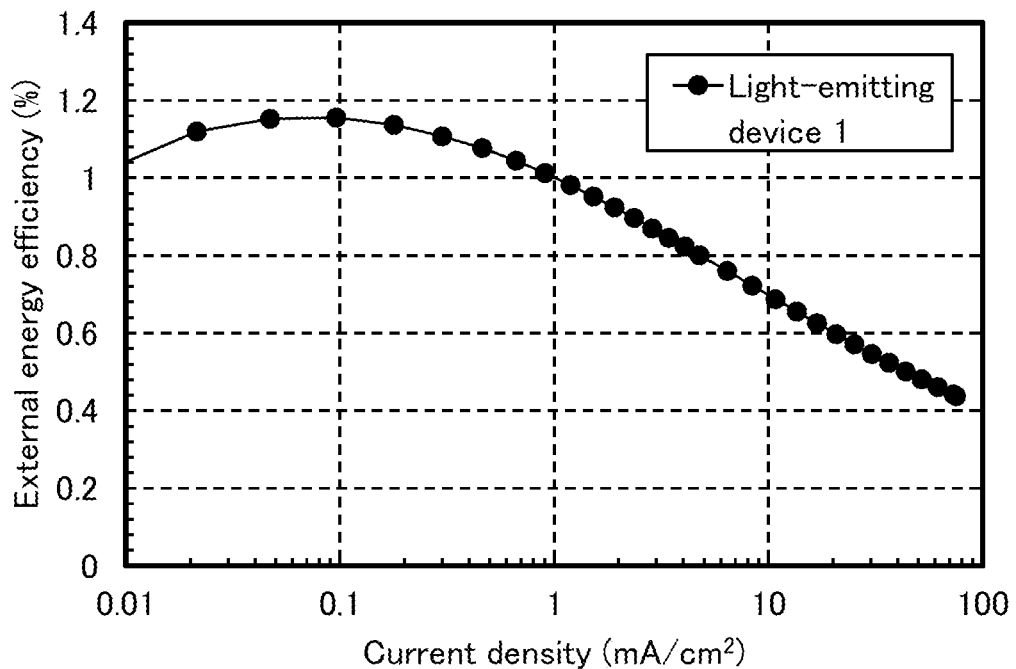
FIG. 18 is a diagram showing the voltage-external energy efficiency characteristics of the light-emitting device 1.

This example will describe a device structure, a fabrication method, and characteristics of a light-emitting device 1 using bis{4,6-dimethyl-2-[3-(3,5-dimethylphenyl)-5,7-bis(trifluoromethyl)quinoxaline-2-yl-κN]phenyl-κC}(2,4-pentanedionato-κ2O,0')iridium(III) (abbreviation: [Ir(dmdpq-dCF$_3$)$_2$(acac)]) (Structural Formula (101)), which is described in Example 1, in a light-emitting layer as the light-emitting device of one embodiment of the present invention. FIG. 13 shows the device structure of the light-emitting device used in this example, and Table 1 shows specific compositions. The chemical formulae of the materials used in this example are shown below.

TABLE 1

| | First electrode 901 | Hole-injection layer 911 | Hole-transport layer 912 | Light-emitting layer 913 | Electron-transport layer 914 | Electron-injection layer 915 | Second electrode 903 |
|---|---|---|---|---|---|---|---|
| Light-emitting device 1 | ITSO (70 nm) | DBT3P-II:MoOx (2:1 120 nm) | PCBBiF (20 nm) | * | 2mDBTBPDBq-II (20 nm) | NBphen (70 nm) | LiF (1 nm) | Al (200 nm) |

*2mDBTBPDBq-II:PCBBiF: [Ir(dmdpq-dCF$_3$)$_2$(acac)] (0.7:0.3:0.1 40 nm)

[Chemical Formula 37]

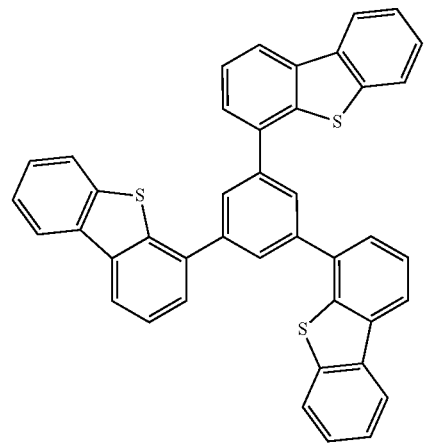

DBT3P-II

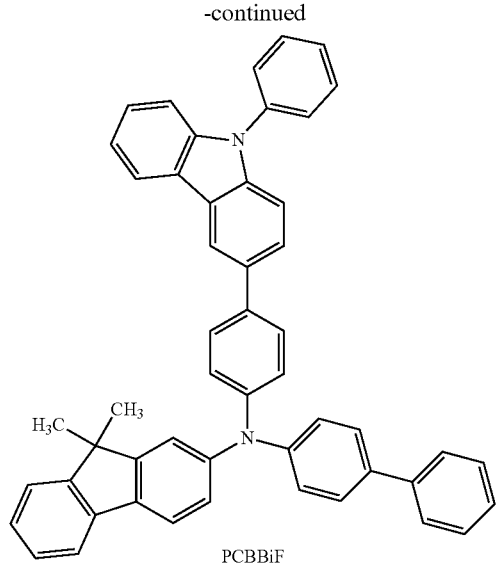

PCBBiF

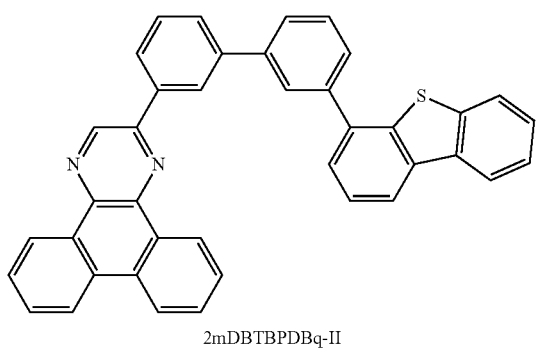

2mDBTBPDBq-II

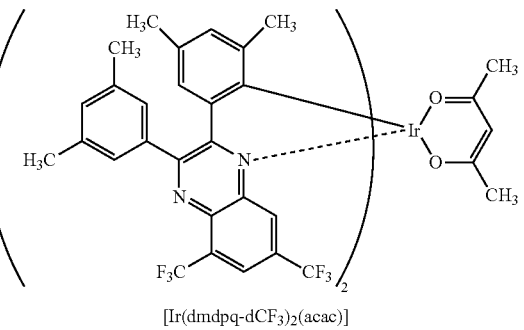

(101)

[Ir(dmdpq-dCF$_3$)$_2$(acac)]

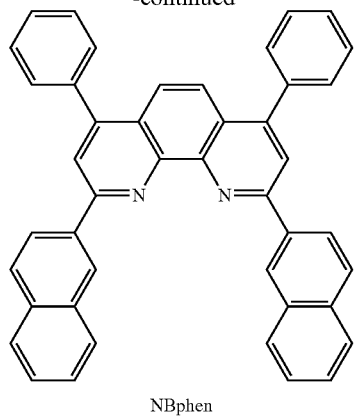

NBphen

<<Fabrication of light-emitting device>>

The light-emitting device described in this example has a structure in which a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915, as illustrated in FIG. 13.

First, the first electrode 901 was formed over the substrate 900. The electrode area was set to 4 mm$^2$ (2 mm×2 mm). A glass substrate was used as the substrate 900. The first electrode 901 was formed to a thickness of 70 nm using indium tin oxide containing silicon oxide (ITSO) by a sputtering method.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately 10$^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 911 was formed over the first electrode 901. For the formation of the hole-injection layer 911, the pressure in the vacuum evaporation apparatus was reduced to 10$^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (mass ratio) and the thickness was 120 nm.

Then, the hole-transport layer 912 was formed over the hole-injection layer 911. The hole-transport layer 912 was formed to a thickness of 20 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

Next, the light-emitting layer 913 was formed over the hole-transport layer 912.

The light-emitting layer 913 was formed by co-evaporation using 2mDBTBPDBq-II as a host material, PCBBiF as an assist material, and [Ir(dmdpq-dCF$_3$)$_2$(acac)], which is the organometallic complex of one embodiment of the present invention, as a guest material (a phosphorescent material) such that the weight ratio was 2mDBTBPDBq-II:PCBBiF:[Ir(dmdpq-dCF$_3$)$_2$(acac)]=0.7:0.3:0.1. Note that the thickness was set to 40 nm.

Next, the electron-transport layer 914 was formed over the light-emitting layer 913. The electron-transport layer 914 was formed by sequential evaporation such that the thickness of 2mDBTBPDBq-II was 20 nm and the thickness of 2,9-bis(naphthalen-2-yl)-4,7-diphenyl-1,10-phenanthroline (abbreviation: NBphen) was 70 nm.

Then, the electron-injection layer 915 was formed over the electron-transport layer 914. The electron-injection layer 915 was formed to a thickness of 1 nm by evaporation using lithium fluoride (LiF).

Next, the second electrode 903 was formed over the electron-injection layer 915. The second electrode 903 was formed to a thickness of 200 nm by an evaporation method using aluminum. In this example, the second electrode 903 functions as a cathode.

Through the above steps, the light-emitting device in which an EL layer was provided between the pair of electrodes was formed over the substrate 900. The hole-injection layer 911, the hole-transport layer 912, the light-emitting layer 913, the electron-transport layer 914, and the electron-injection layer 915 described in the above steps are functional layers forming the EL layer in one embodiment of the present invention. Furthermore, in all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) coated with a sealant that solidifies by ultraviolet light was fixed onto the substrate 900 in a glove box containing a nitrogen atmosphere, and the substrates were bonded to each other such that the sealant would be attached to the periphery of the light-emitting device formed over the substrate 900. At the time of the sealing, the sealant was irradiated with 365-nm ultraviolet light at 6 J/cm$^2$ to be solidified, and heat treatment was performed at 80° C. for one hour to stabilize the sealant.

<<Operating Characteristics of Light-Emitting Device 1>>

Operating characteristics of the fabricated light-emitting device 1 were measured. Note that the measurement was carried out at room temperature (an atmosphere maintained at 25° C.). FIG. 14, FIG. 15, FIG. 16, FIG. 17, and FIG. 18 respectively show the current density-radiant flux characteristics, voltage-radiance characteristics, voltage-current characteristics, current density-external quantum efficiency characteristics, and current density-external energy efficiency characteristics of the light-emitting device 1. Note that radiant flux and external quantum efficiency were calculated using radiance, assuming that the device had Lambertian light-distribution characteristics.

Next, Table 2 below shows the initial values of main characteristics of the light-emitting device 1 at a radiance of around 1.1 W/sr/m$^2$.

TABLE 2

| | Voltage (V) | Current (mA) | Current density (mA/cm$^2$) | Radiance (W/sr/m$^2$) | Radiant flux (mW) | External quantum efficiency (%) | External energy efficiency (%) |
|---|---|---|---|---|---|---|---|
| Light-emitting device 1 | 4.6 | 0.43 | 11 | 1.1 | 0.014 | 2.1 | 0.69 |

The results of the operating characteristics demonstrate that the light-emitting device 1 has high reliability for a light-emitting device that emits near-infrared light. It can be said that this is partly because [Ir(dmdpq-dCF$_3$)$_2$(acac)], the organometallic complex of one embodiment of the present invention, was used in the light-emitting layer of the light-emitting device 1. [Ir(dmdpq-dCF$_3$)$_2$(acac)] has a structure where the benzene ring of the quinoxaline skeleton of the ligand is substituted with a trifluoromethyl group, which is an electron-withdrawing group. Since this structure can lower the LUMO level (to −3.5 eV or lower), the behavior of electrons in the light-emitting layer is controlled, and the light-emitting region is narrowed; thus, the efficiency of the light-emitting device 1 can be increased.

Figure 19:
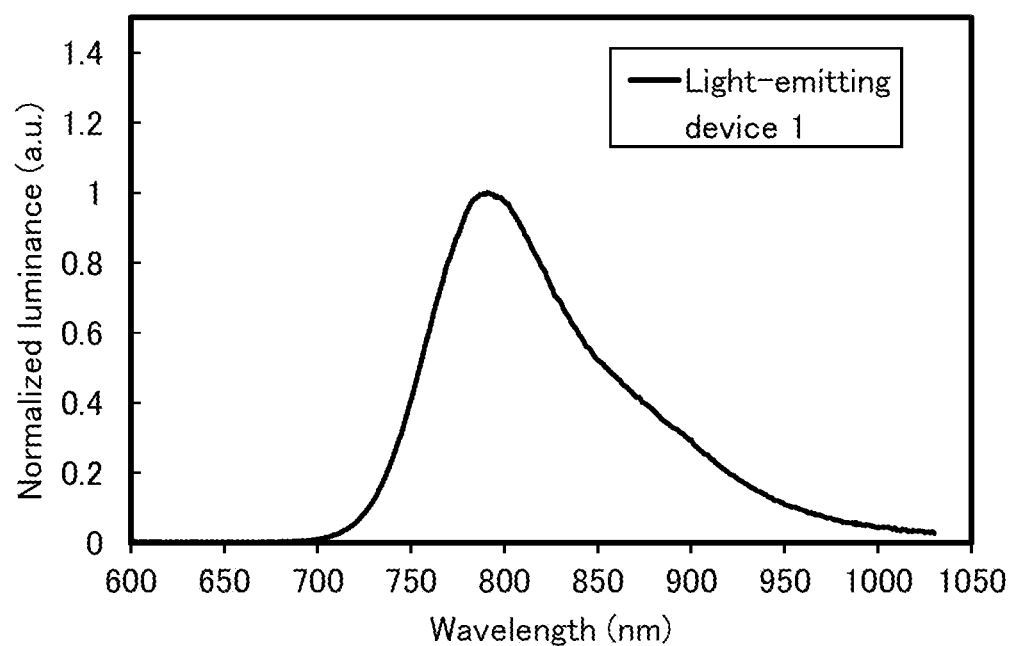
FIG. 19 is a diagram showing the emission spectrum of the light-emitting device 1.

FIG. 19 shows an EL emission spectrum when current at a current density of 0.9 mA/cm$^2$ was supplied to the light-emitting device 1. The EL emission spectrum was measured with a near-infrared spectroradiometer (SR-NIR, manufactured by TOPCON TECHNOHOUSE CORPORATION). In FIG. 19, the light-emitting device 1 exhibits an emission spectrum having a peak at around 791 nm, which is derived from light emission of [Ir(dmdpq-dCF$_3$)$_2$(acac)], the organometallic complex included in the light-emitting layer 913. The half width of the spectrum is 100 nm. Energy obtained by conversion of the half width is approximately 0.19 eV, which is considerably narrow for light derived from an organometallic complex.

Figure 20:
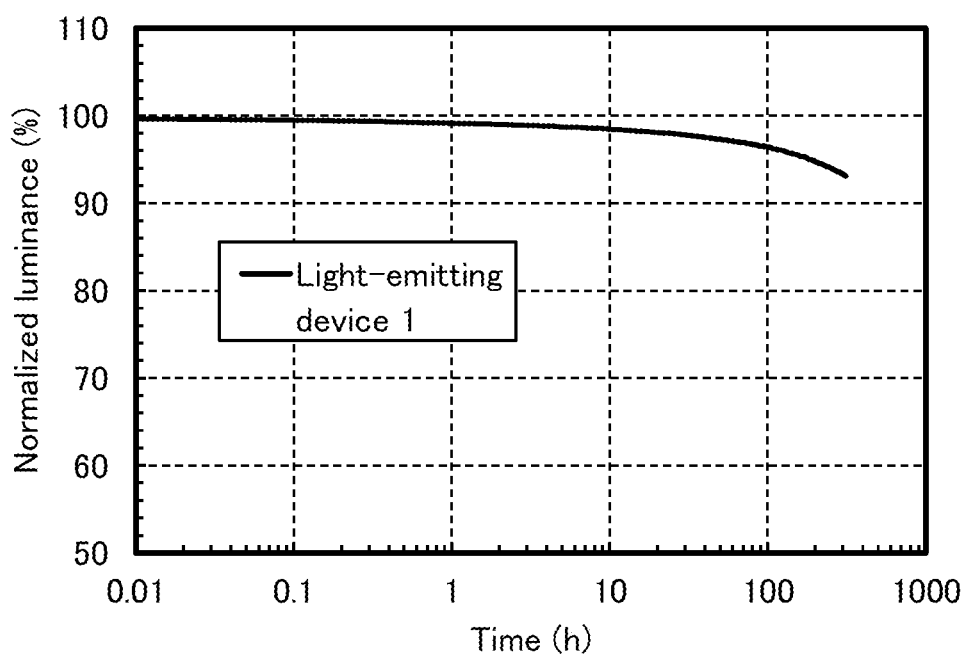
FIG. 20 is a diagram showing the reliability of the light-emitting device 1.

Next, a reliability test was performed on the light-emitting device 1. FIG. 20 shows the results of the reliability test. In FIG. 20, the vertical axis represents normalized luminance (%) with an initial luminance of 100%, and the horizontal axis represents driving time (h) of the light-emitting device 1. In the reliability test, the light-emitting device was driven at a current density of 75 mA/cm$^2$.

The results of the reliability test showed that the light-emitting device 1 has high reliability. This can be regarded as the effect of using [Ir(dmdpq-dCF$_3$)$_2$(acac)] (Structural Formula (101)), which is the organometallic complex of one embodiment of the present invention, in the light-emitting layer of the light-emitting device 1. [Ir(dmdpq-dCF$_3$)$_2$(acac)] has a structure where the benzene ring of the quinoxaline skeleton of the ligand is substituted with a trifluoromethyl group, which is an electron-withdrawing group. With this structure, [Ir(dmdpq-dCF$_3$)$_2$(acac)] has not only an emission peak in a long wavelength region (a visible region of 700 nm or greater or a near–infrared region) but also a low LUMO level (−3.5 eV or lower). It can be said that the behavior of electrons in the light-emitting layer is controlled with a lower LUMO level, leading to high reliability of the light-emitting device 1.

EXAMPLE 4

Synthesis Example 3

This example will describe a method for synthesizing bis{3-[5,7-bis(trifluoromethyl)-3-(2-naphthyl)-2-quinoxalinyl-κN$^1$)-2-naphthyl-κC}(2,4-pentanedionato-κ$^2$O,O′) iridium(III) ((abbreviation: [Ir(d2nq-dCF$_3$)$_2$(acac)]) that is an organometallic complex of one embodiment of the present invention and is represented by Structural Formula (116) in Embodiment 1. The structure of [Ir(d2nq-dCF$_3$)$_2$(acac)] is shown below.

[Chemical Formula 38]

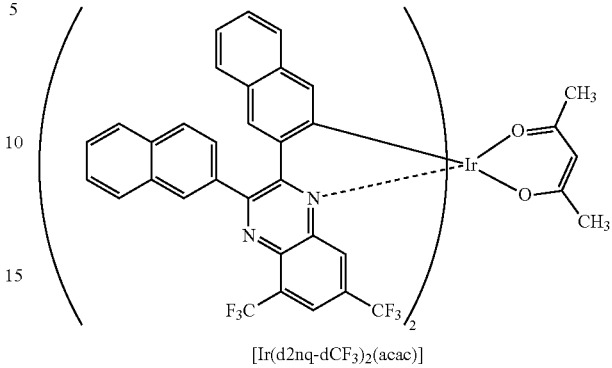

[Ir(d2nq-dCF$_3$)$_2$(acac)]

Step 1: Synthesis of 1,2-di-2-naphthyl-1,2-ethanedione

First, 25 g (122 mmol) of 2-bromonaphthalene, 3.6 g (40 mmol) of vinylene carbonate, 2.1 g (8 mmol) of triphenylphosphine, 28 g (88 mmol) of cesium carbonate, and 180 mL of dimethylformamide were put into a three-neck flask, the flask was degassed, and the air in the flask was replaced with nitrogen. Then, 0.90 g (4.0 mmol) of palladium(II) acetate was added to the mixture, and the mixture was heated and stirred at 120° C. for 4.5 hours. Water was added to the obtained reaction mixture, and an aqueous layer was subjected to extraction with toluene. The extracted solution was washed with water and saturated saline, and anhydrous magnesium sulfate was added for drying. The obtained mixture was gravity-filtered, and the filtrate was concentrated to give a solid. This solid was purified by silica gel column chromatography. As the developing solvent, a mixed solvent of toluene:hexane=4:1 was used. The obtained fraction was concentrated, so that 3.2 g of a target white solid was obtained in a yield of 26%. The synthesis scheme of Step 1 is shown in Formula (c-1) below.

[Chemical Formula 39]

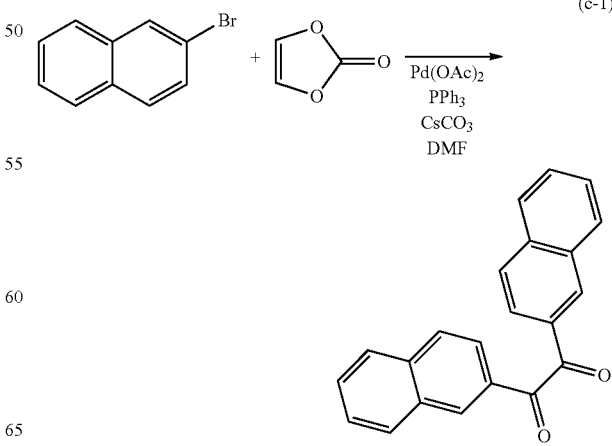

Step 2: Synthesis of 5,7-bis(trifluoromethyl)-2,3-di-(2-naphthyl)quinoxaline (abbreviation: Hd2nq-dCF$_3$)

Next, 1.6 g (4.8 mmol) of 1,2-di-2-naphthyl-1,2-ethanedione obtained in Step 2 above, 1.3 g (5.3 mmol) of 3,5-bis(trifluoromethyl)-1,2-phenylenediamine, 25 mL of ethanol, and 30 mg (0.48 mmol) of an acetic acid were put into a reaction container, and heated and refluxed for 22 hours. Then, two drops of an acetic acid was added by a Pasteur pipette, and the mixture was further heated and refluxed for 41 hours. After a predetermined time elapsed, the obtained mixture was subjected to suction filtration, and the solid was washed with water and ethanol to give a target substance (2.4 g of a pale yellow solid, yield: 96%). The synthesis scheme of Step 2 is shown in Formula (c-2) below.

[Chemical Formula 40]

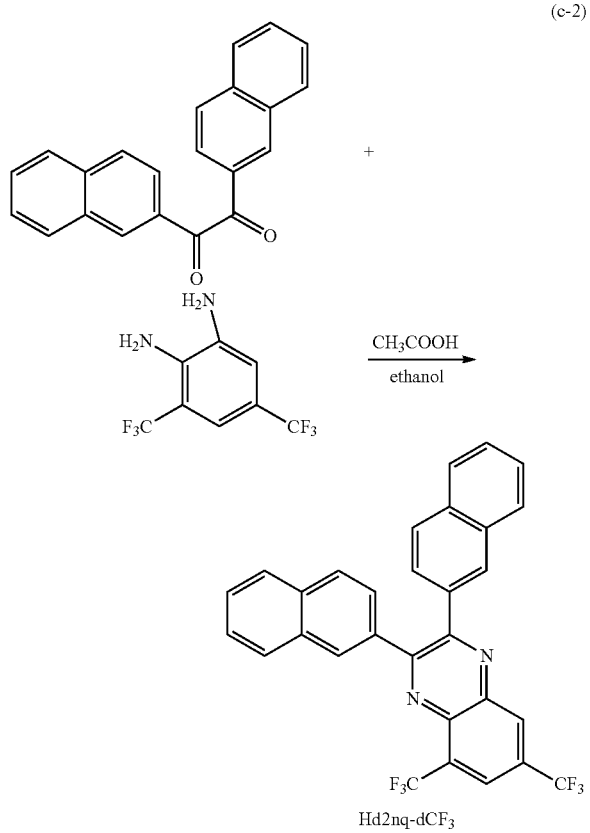

(c-2)

Step 3; Synthesis of bis{3-[5,7-bis(trifluoromethyl)-3-(2-naphthyl)-2-quinoxalinyl-κN$^1$)-2-naphthyl-κC}(2,4-pentanedionato-κ$^2$O,O')iridium(III) (abbreviation: [Ir(d2nq-dCF$_3$)$_2$(acac)])

Next, 2.0 g (3.8 mmol) of Hd2nq-dCF$_3$, which is the ligand obtained in Step 2 above, and 0.38 g (0.77 mmol) of tris(acetylacetonato)iridium(III) were put into a reaction container, the air in the container was replaced with argon, and then the mixture was heated and stirred at 250° C. for 48 hours. After a predetermined time elapsed, the reaction product was dissolved in toluene, followed by purification by silica gel column chromatography. Toluene was used as the developing solvent. The obtained fraction was concentrated to give a solid. This solid was purified by a mixed solvent of dichloromethane and methanol to give a target substance (76 mg of a black solid, yield: 7.5%). The synthesis scheme of Step 3 is shown in Formula (c-3) below.

[Chemical Formula 41]

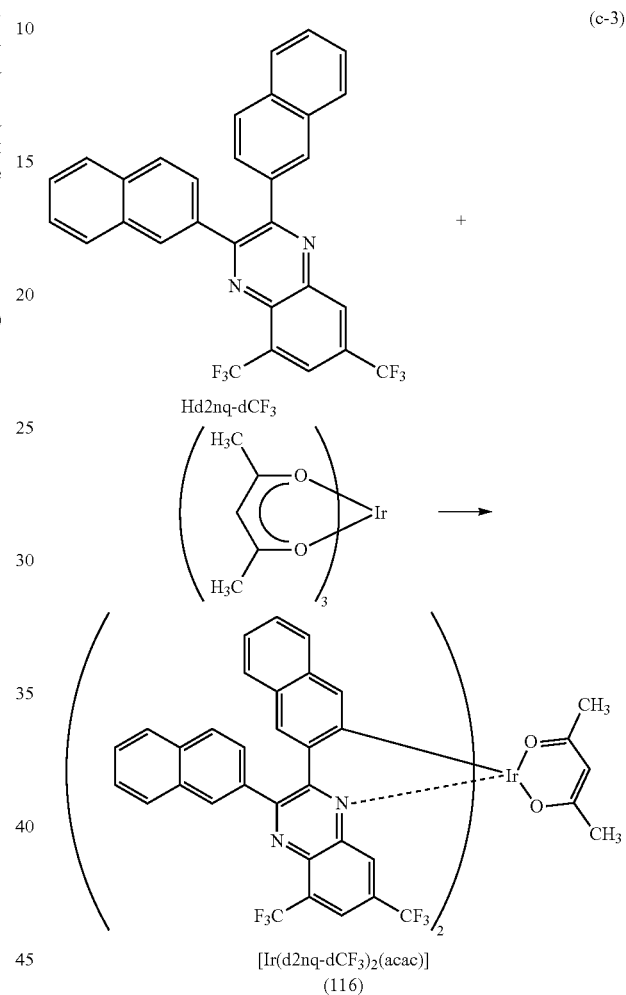

(c-3)

[Ir(d2nq-dCF$_3$)$_2$(acac)] obtained in Example 3 was analyzed by liquid chromatography mass spectrometry (abbreviation: LC/MS analysis).

In the LC/MS analysis, LC (liquid chromatography) separation was carried out with Acquity UPLC manufactured by Waters Corporation, and MS analysis (mass spectrometry) was carried out with Xevo G2 Tof MS manufactured by Waters Corporation. Acquity UPLC BEH C8 (2.1×100 mm, 1.7 μm) was used as a column for the LC separation, and the column temperature was set to 40° C. As for mobile phases, a 0.1% aqueous solution of formic acid was used for the mobile phase A and acetonitrile was used for the mobile phase B. A sample was prepared by dissolving [Ir(d2nq-dCF$_3$)$_2$(acac)] in chloroform at a given concentration, and the injection amount was 5.0 μL.

In the LC separation, a gradient method in which the composition of mobile phases is changed was employed; the mobile phase A:the mobile phase B=10:90 from 0 minutes to 1 minute after the start of the measurement, and then the composition was changed from 1 minute to 5 minutes such that the ratio of the mobile phase A to the mobile phase B at the 5 minutes was the mobile phase A:the mobile phase B=5:95. After that, from 5 minutes to 10 minutes from the start of the measurement, the measurement was performed with the mobile phase A:the mobile phase B=5:95. The composition was changed linearly.

In the MS analysis, ionization was carried out by an electrospray ionization method (abbreviation: ESI); the capillary voltage was 3.0 kV, the sample cone voltage was 30 V, and detection was performed in a positive mode.

A component with m/z=1327.2 that is an ion derived from [Ir(d2nq-dCF$_3$)$_2$(acac)] was detected by the separation and ionization in the above conditions; hence, it was demonstrated that [Ir(d2nq-dCF$_3$)$_2$(acac)], which is the organometallic complex of one embodiment of the present invention represented by Structural Formula (116) above, was obtained in this synthesis example.

Next, an ultraviolet-visible absorption spectrum (hereinafter, simply referred to as an "absorption spectrum") and an emission spectrum of a dichloromethane solution of [Ir(d2nq-dCF$_3$)$_2$(acac)] were measured.

The measurement of the absorption spectrum was conducted at room temperature, for which an ultraviolet-visible spectrophotometer (V550 type, manufactured by JASCO Corporation) was used and the dichloromethane solution (0.010 mmol/L) was put into a quartz cell. The measurement of the emission spectrum was conducted at room temperature, for which a fluorescence spectrophotometer (FS920, manufactured by Hamamatsu Photonics K.K.) was used and the degassed dichloromethane solution (0.010 mmol/L) was put into a quartz cell.

Figure 21:
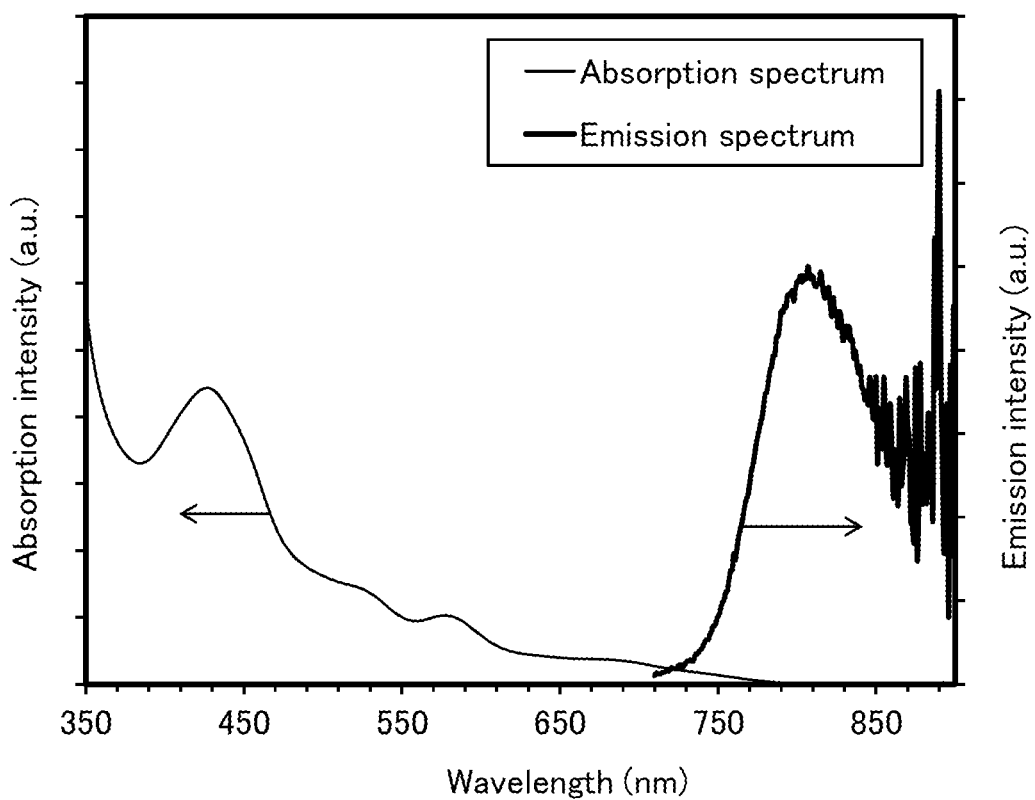
FIG. 21 shows an ultraviolet-visible absorption spectrum and an emission spectrum of an organometallic complex represented by Structural Formula (116) in solution.

FIG. 21 shows measurement results of the obtained absorption spectrum and emission spectrum. The horizontal axis represents wavelength, and the vertical axes represent absorption intensity and emission intensity. The absorption spectrum shown in FIG. 21 is a result obtained by subtraction of a measured absorption spectrum of only dichloromethane in a quartz cell from the measured absorption spectrum of the dichloromethane solution in a quartz cell.

As shown in FIG. 21, emission of near-infrared light having an emission peak at 797 nm was observed from the dichloromethane solution of [Ir(d2nq-dCF$_3$)$_2$(acac)].

REFERENCE NUMERALS

101: first electrode, 102: second electrode, 103: EL layer, 103a, 103b: EL layer, 104: charge-generation layer, 111, 111a, 111b: hole-injection layer, 112, 112a, 112b: hole-transport layer, 113, 113a, 113b: light-emitting layer, 114, 114a, 114b: electron-transport layer, 115, 115a, 115b: electron-injection layer, 200R, 200G, 200B: optical path length, 201: first substrate, 202: transistor (FET), 203R, 203G, 203B, 203W: light-emitting device, 204: EL layer, 205: second substrate, 206R, 206G, 206B: color filter, 206R', 206G', 206B': color filter, 207: first electrode, 208: second electrode, 209: black layer (black matrix), 210R, 210G: conductive layer, 301: first substrate, 302: pixel portion, 303: driver circuit portion (source line driver circuit), 304a, 304b: driver circuit portion (gate line driver circuit), 305: sealant, 306: second substrate, 307: lead wiring, 308: FPC, 309: FET, 310: FET, 311: FET, 312: FET, 313: first electrode, 314: insulator, 315: EL layer, 316: second electrode, 317: light-emitting device, 318: space, 400: substrate, 401: first organic compound, 402: second organic compound, 403: light-emitting substance, 404: composition, 405: light-emitting substance, 900: substrate, 901: first electrode, 902: EL layer, 903: second electrode, 911: hole-injection layer, 912: hole-transport layer, 913: light-emitting layer, 914: electron-transport layer, 915: electron-injection layer, 4000: lighting device, 4001: substrate, 4002: light-emitting device, 4003: substrate, 4004: first electrode, 4005: EL layer, 4006: second electrode, 4007: electrode, 4008: electrode, 4009: auxiliary wiring, 4010: insulating layer, 4011: sealing substrate, 4012: sealant, 4013: desiccant, 4015: diffusing plate, 4200: lighting device, 4201: substrate, 4202: light-emitting device, 4204: first electrode, 4205: EL layer, 4206: second electrode, 4207: electrode, 4208: electrode, 4209: auxiliary wiring, 4210: insulating layer, 4211: sealing substrate, 4212: sealant, 4213: barrier film, 4214: planarization film, 4215: diffusing plate, 5101: light, 5102: wheel, 5103: door, 5104: display portion, 5105: steering wheel, 5106: shifter, 5107: seat, 5108: inner rearview mirror, 5109: windshield, 7000: housing, 7001: display portion, 7002: second display portion, 7003: speaker, 7004: LED lamp, 7005: operation key, 7006: connection terminal, 7007: sensor, 7008: microphone, 7009: switch, 7010: infrared port, 7011: recording medium reading portion, 7012: support portion, 7013: earphone, 7014: antenna, 7015: shutter button, 7016: image receiving portion, 7018: stand, 7020: camera, 7021: external connection portion, 7022, 7023: operation button, 7024: connection terminal, 7025: band, 7026: microphone, 7027: icon indicating time, 7028: another icon, 7029: sensor, 7030: speaker, 7052, 7053, 7054: information, 9310: portable information terminal, 9311: display portion, 9312: display region, 9313: hinge, 9315: housing This application is based on Japanese Patent Application Serial No. 2018-248104 filed on Dec. 28, 2018, the entire contents of which are hereby incorporated herein by reference.

The invention claimed is:
1. An organometallic complex represented by Formula (G1),

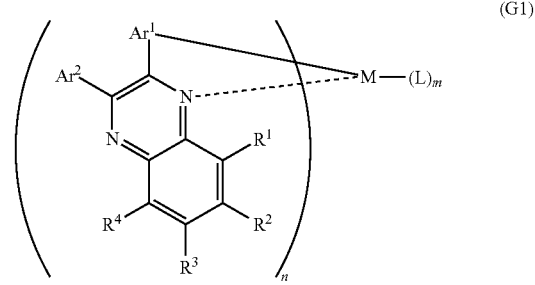

wherein:
M represents a Group 9 element or a Group 10 element;
each of $Ar^1$ and $Ar^2$ independently represents any one of a substituted or unsubstituted phenyl group, a substituted or unsubstituted naphthyl group, a substituted or unsubstituted phenanthryl group, and a substituted or unsubstituted fluorenyl group;
each of $R^1$ to $R^4$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms, a cyano group, a trifluoromethylsulfonyl group, and a pentafluorosulfanyl group;

at least one of $R^1$ to $R^4$ represents any of a cyano group, a trifluoromethylsulfonyl group, and a pentafluorosulfanyl group;

L represents a monoanionic ligand; and m+n=3 when M is a Group 9 element and m+n=2 when M is a Group 10 element, and wherein an emission peak of the organometallic complex is longer than or equal to 700 nm.

2. The organometallic complex according to claim 1, wherein the organometallic complex is represented by Formula (G2), and

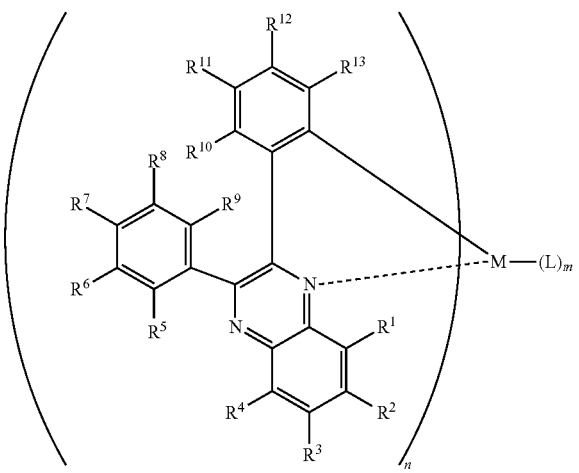

(G2)

wherein each of $R^5$ to $R^{13}$ is independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms.

3. The organometallic complex according to claim 1, wherein the organometallic complex is represented by Formula (G3),

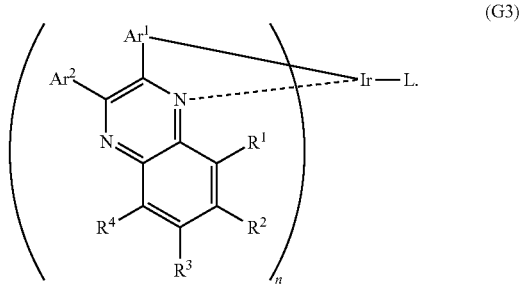

(G3)

4. The organometallic complex according to claim 2, wherein the organometallic complex is represented by Formula (G4),

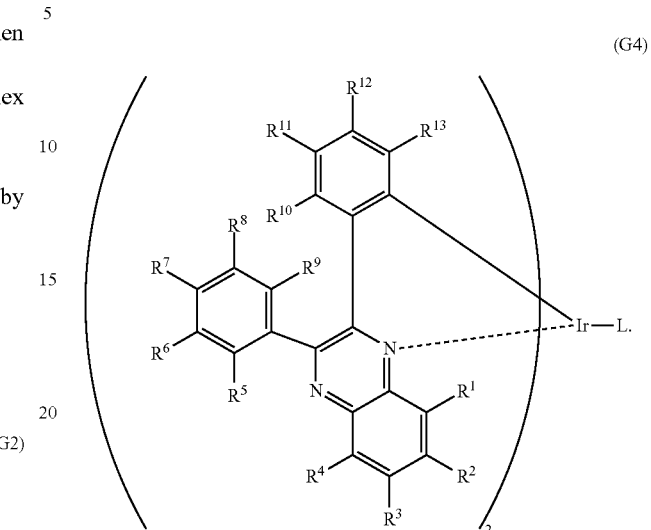

(G4)

5. The organometallic complex represented by Formula (G5),

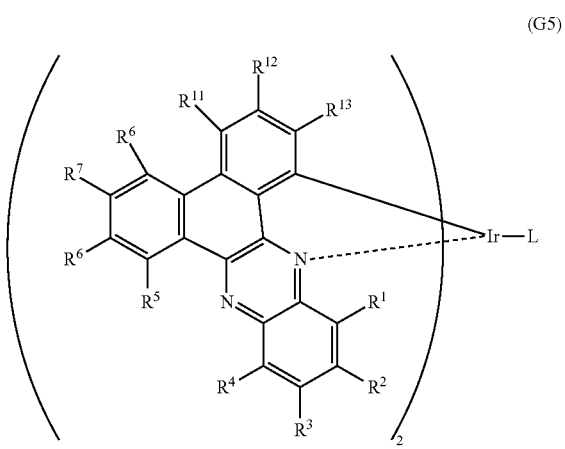

(G5)

wherein each of $R^1$ to $R^4$ independently represents any of hydrogen, an alkyl group having 1 to 6 carbon atoms, a substituted or unsubstituted aryl group having 6 to 12 carbon atoms, a substituted or unsubstituted heteroaryl group having 3 to 12 carbon atoms, a cyano group, a trifluoromethylsulfonyl group, and a pentafluorosulfanyl group;

at least one of $R^1$ to $R^4$ represents any of a cyano group, a trifluoromethylsulfonyl group, and a pentafluorosulfanyl group;

$R^5$ represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms;

$R^6$ represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms;

each of $R^7$, $R^8$ and $R^{11}$ to $R^{13}$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms; and L represents a monoanionic ligand, and wherein an emission peak of the organometallic complex is longer than or equal to 700 nm.

6. The organometallic complex according to claim 1, wherein the monoanionic ligand is a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or a bidentate ligand forming a metal-carbon bond with iridium by cyclometalation.

7. The organometallic complex according to claim 1, wherein the monoanionic ligand is any one of Formulae (L1) to (L7),

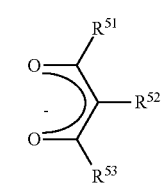
(L1)

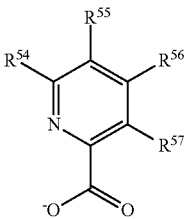
(L2)

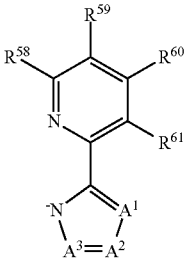
(L3)

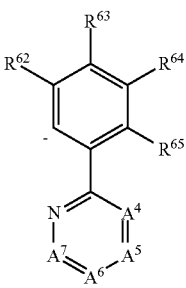
(L4)

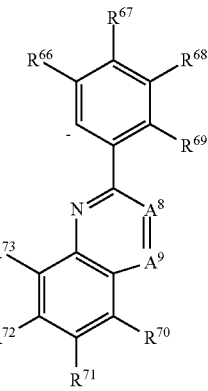
(L5)

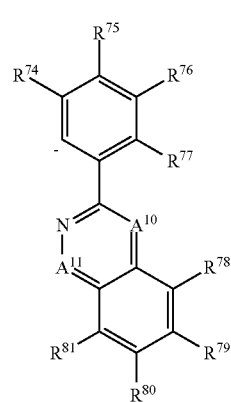
(L6)

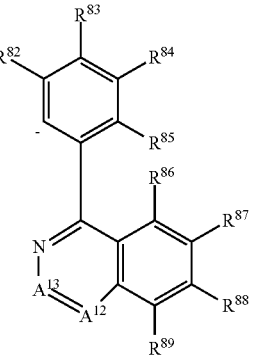
(L7)

wherein each of $R^{51}$ to $R^{89}$ independently represents any of hydrogen, a substituted or unsubstituted alkyl group having 1 to 6 carbon atoms, a halogeno group, a vinyl group, a substituted or unsubstituted haloalkyl group having 1 to 6 carbon atoms, a substituted or unsubstituted alkoxy group having 1 to 6 carbon atoms, a substituted or unsubstituted alkylsulfanyl group having 1 to 6 carbon atoms, and a substituted or unsubstituted aryl group having 6 to 13 carbon atoms.

8. The organometallic complex according to claim 4, wherein the organometallic complex is represented by Formula (G6), and (G6)

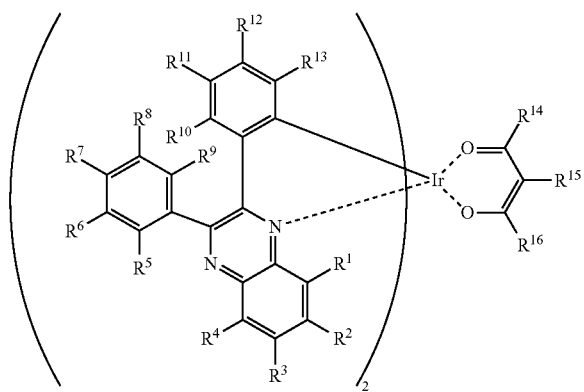

wherein each of $R^{14}$ to $R^{16}$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms.

9. The organometallic complex according to claim 5, wherein the organometallic complex is represented by Formula (G7), and (G7)

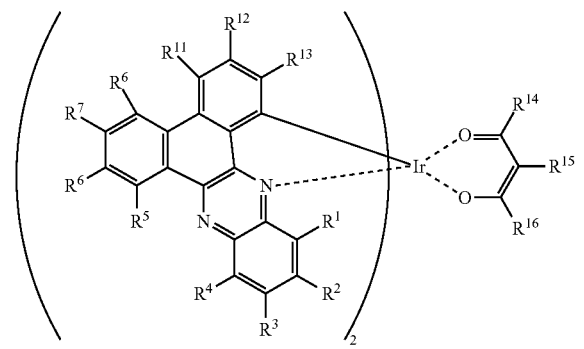

wherein each of $R^{14}$ to $R^{16}$ independently represents any of hydrogen, an alkyl group having 1 to 6 carbon atoms, a substituted or unsubstituted aryl group having 6 to 12 carbon atoms, and a substituted or unsubstituted heteroaryl group having 3 to 12 carbon atoms.

10. A light-emitting device comprising the organometallic complex according to claim 1.

11. A light-emitting apparatus comprising:
the light-emitting device according to claim 10; and
one of a transistor and a substrate.

12. An electronic device comprising;
the light-emitting apparatus according to claim 11; and
any one of a microphone, a camera, an operation button, an external connection portion, and a speaker.

13. A lighting device comprising;
the light-emitting apparatus according to claim 11; and
any one of a housing, a cover, and a support.

14. The organometallic complex according to claim 5, wherein the monoanionic ligand is a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or a bidentate ligand forming a metal-carbon bond with iridium by cyclometalation.

15. An organometallic complex represented by Formula (100):

(100)

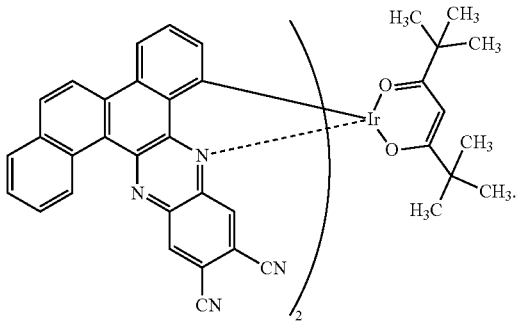

16. A light-emitting device comprising the organometallic complex according to claim 5.

17. A light-emitting apparatus comprising:
the light-emitting device according to claim 16; and
one of a transistor and a substrate.

18. An electronic device comprising;
the light-emitting apparatus according to claim 17; and
any one of a microphone, a camera, an operation button, an external connection portion, and a speaker.

19. A lighting device comprising;
the light-emitting apparatus according to claim 17; and
any one of a housing, a cover, and a support.

20. A light-emitting device comprising the organometallic complex according to claim 15.

21. A light-emitting apparatus comprising:
the light-emitting device according to claim 20; and
one of a transistor and a substrate.

22. An electronic device comprising;
the light-emitting apparatus according to claim 21; and
any one of a microphone, a camera, an operation button, an external connection portion, and a speaker.

23. A lighting device comprising;
the light-emitting apparatus according to claim 21; and
any one of a housing, a cover, and a support.

\* \* \* \* \*